United States Patent
Kim et al.

(10) Patent No.: US 12,490,648 B2
(45) Date of Patent: Dec. 2, 2025

(54) HETEROCYCLIC COMPOUND, LIGHT-EMITTING DEVICE INCLUDING THE SAME, AND ELECTRONIC APPARATUS INCLUDING THE LIGHT-EMITTING DEVICE

(71) Applicant: Samsung Display Co., Ltd., Yongin-si (KR)

(72) Inventors: Seulong Kim, Yongin-si (KR); Pilgu Kang, Yongin-si (KR); Hajin Song, Yongin-si (KR); Jihwan Yoon, Yongin-si (KR); Yangjin Cho, Yongin-si (KR); Jungho Choi, Yongin-si (KR); Jaehoon Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 917 days.

(21) Appl. No.: 17/709,742

(22) Filed: Mar. 31, 2022

(65) Prior Publication Data

US 2022/0328768 A1  Oct. 13, 2022

(30) Foreign Application Priority Data

Apr. 2, 2021 (KR) .................. 10-2021-0043497

(51) Int. Cl.
| | |
|---|---|
| H10K 85/60 | (2023.01) |
| H10K 50/11 | (2023.01) |
| H10K 59/12 | (2023.01) |
| H10K 101/10 | (2023.01) |
| H10K 101/30 | (2023.01) |
| H10K 101/40 | (2023.01) |

(52) U.S. Cl.
CPC ....... *H10K 85/615* (2023.02); *H10K 85/6572* (2023.02); *H10K 85/6574* (2023.02); *H10K 85/6576* (2023.02); *H10K 50/11* (2023.02); *H10K 59/12* (2023.02); *H10K 2101/10* (2023.02); *H10K 2101/30* (2023.02); *H10K 2101/40* (2023.02)

(58) Field of Classification Search
None
See application file for complete search history.

(56) References Cited

U.S. PATENT DOCUMENTS

| | | | |
|---|---|---|---|
| 10,155,724 B2 | 12/2018 | Jung et al. | |
| 10,995,265 B2 | 5/2021 | Ihn et al. | |
| 2008/0191611 A1 | 8/2008 | Iwaki et al. | |
| 2012/0098413 A1 | 4/2012 | Lin et al. | |
| 2016/0372685 A1 | 12/2016 | Lin et al. | |
| 2017/0194570 A1* | 7/2017 | Kang | C09K 11/025 |
| 2018/0026202 A1* | 1/2018 | Danz | C07D 417/14 |
| | | | 257/40 |
| 2018/0212157 A1 | 7/2018 | Oshiyama et al. | |
| 2018/0269419 A1* | 9/2018 | Tu | H10K 50/15 |
| 2019/0296247 A1 | 9/2019 | Sakamoto | |

FOREIGN PATENT DOCUMENTS

| | | | |
|---|---|---|---|
| CN | 109608453 | 4/2019 | |
| CN | 110272410 | 9/2019 | |
| EP | 3 459 943 | 3/2019 | |
| KR | 10-2010-0118700 | 11/2010 | |
| KR | 10-2017-0026075 | 3/2017 | |
| KR | 10-2018-0001290 | 1/2018 | |
| KR | 20190064202 A * | 6/2019 | C07D 209/82 |
| KR | 10-2019-0112231 | 10/2019 | |

OTHER PUBLICATIONS

Machine translation of KR-20190064202-A, translation generated May 2025, 17 pages. (Year: 2025).*

* cited by examiner

*Primary Examiner* — Robert S Loewe
(74) *Attorney, Agent, or Firm* — Womble Bond Dickinson (US) LLP

(57) ABSTRACT

Provided are a heterocyclic compound, a light-emitting device including the heterocyclic compound, and an electronic apparatus including the light-emitting device. The heterocyclic compound is represented by Formula 1, which is explained in the specification. The light-emitting device is capable of maintaining efficiency and color expression at constant levels.

18 Claims, 4 Drawing Sheets

[Formula 1]

HETEROCYCLIC COMPOUND, LIGHT-EMITTING DEVICE INCLUDING THE SAME, AND ELECTRONIC APPARATUS INCLUDING THE LIGHT-EMITTING DEVICE

CROSS-REFERENCE TO RELATED APPLICATION(S)

This application claims priority to and benefits of Korean Patent Application No. 10-2021-0043497 under 35 U.S.C. § 119, filed on Apr. 2, 2021 in the Korean Intellectual Property Office, the entire contents of which are incorporated herein by reference.

BACKGROUND

1. Technical Field

Embodiments, relate to a heterocyclic compound, a light-emitting device including the same, and an electronic apparatus including the light-emitting device.

2. Description of the Related Art

From among light-emitting devices, organic light-emitting devices (OLEDs) are self-emissive devices that, as compared with devices of the related art, have wide viewing angles, high contrast ratios, short response times, and excellent characteristics in terms of luminance, driving voltage, and response speed, and produce full-color images.

OLEDs may include a first electrode on a substrate, and a hole transport region, an emission layer, an electron transport region, and a second electrode sequentially stacked on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition from an excited state to a ground state to thereby generate light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Provided are a heterocyclic compound, a light-emitting device including the same, and an electronic apparatus including the light-emitting device.

Additional aspects will be set forth in part in the description, which follows and, in part, will be apparent from the description, or may be learned by practice of the embodiments of the disclosure.

According to embodiments, a heterocyclic compound may be represented by Formula 1.

[Formula 1]

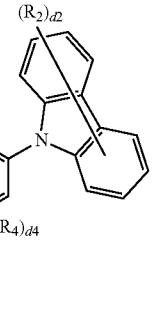

In Formula 1,

X may be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, n1 may be an integer from 1 to 3, a1 and a2 may each independently be an integer from 0 to 4, the sum of a1 and a2 may be 1 or more, $R_1$ to $R_4$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), d1 and d2 may each independently be an integer from 1 to 8, d3 and d4 may each independently be an integer from 1 to 4, and $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2$$(Q_{21})$, —P(=O)$(Q_{21})(Q_{22})$, or any combination thereof, or —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2$$(Q_{31})$, or —P(=O)$(Q_{31})$$(Q_{32})$.

$Q_1$ to $Q_3$, $Q_{11}$ to $Q_{13}$, $Q_{21}$ to $Q_{23}$ and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, a $C_7$-$C_{60}$ aryl alkyl group; or a $C_2$-$C_{60}$ heteroaryl alkyl group.

In an embodiment, the heterocyclic compound may satisfy Condition 1, which is explained below.

In an embodiment, X may be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-a fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$, and $R_{10a}$ may be the same as described in connection with Formula 1.

In an embodiment, *—X—*' in Formula 1 may be a group represented by one of Formulae 3-1 to 3-26, which are explained below.

In an embodiment, n1 in Formula 1 may be 1.

In an embodiment, a moiety represented by

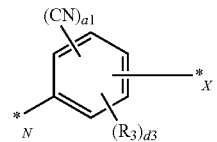

in Formula 1 may be a moiety represented by one of Formulae 4-1 to 4-20, which are explained below.

In an embodiment, the heterocyclic compound represented by Formula 1 may be represented by Formula 1-1 or Formula 1-2, which are explained below.

In an embodiment, the heterocyclic compound may be one selected from Compounds 1 to 9, which are explained below.

According to embodiments, a light-emitting device may include a first electrode, a second electrode facing the first electrode, an interlayer between the first electrode and the second electrode and including an emission layer, and at least one of the heterocyclic compound.

In an embodiment, the first electrode may be an anode, the second electrode may be a cathode, the interlayer may further include a hole transport region between the emission layer and the first electrode and an electron transport region between the emission layer and the second electrode, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In an embodiment, the emission layer may include the at least one heterocyclic compound.

In an embodiment, the emission layer may further include a hole-transporting compound.

In an embodiment, an amount of the heterocyclic compound may be in a range of about 10 parts by weight to about 90 parts by weight based on 100 parts by weight of a total of the heterocyclic compound and the hole-transporting compound.

In an embodiment, the emission layer may further include a phosphorescent compound.

According to embodiments, a light-emitting device may include a first electrode, a second electrode facing the first electrode, m light-emitting units between the first electrode and the second electrode and including at least one emission layer, and m−1 charge generation layers between two neighboring light-emitting units from among the m light-emitting units, wherein m may be an integer of 2 or more, and at least one of the m light-emitting units may include the heterocyclic compound.

In an embodiment, a maximum emission wavelength of light emitted from at least one light-emitting unit of the m light-emitting units may be different from a maximum emission wavelength of light emitted from at least one light-emitting unit of the remaining m−1 light-emitting units.

According to embodiments, an electronic apparatus may include the light-emitting device.

In an embodiment, the electronic apparatus may further include a thin-film transistor. The thin-film transistor may include a source electrode and a drain electrode, and the first electrode of the light-emitting device may be electrically connected to the source electrode or the drain electrode.

In an embodiment, electronic apparatus may further include a color filter, a color conversion layer, a touch screen layer, a polarizing layer, or any combination thereof.

BRIEF DESCRIPTION OF THE DRAWINGS

The above and other aspects and features of the disclosure will become more apparent by describing in detail embodiments thereof with reference to the accompanying drawings, in which.

DETAILED DESCRIPTION OF THE EMBODIMENTS

Figure 1:
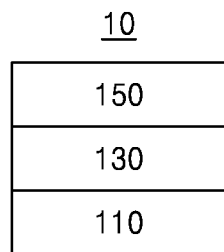
FIG. 1 is a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

A heterocyclic compound according to an embodiment of the disclosure may be represented by Formula 1:

[Formula 1]

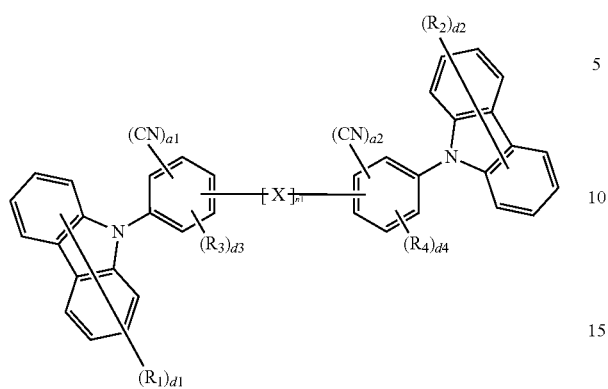

In Formula 1, X may be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, X may be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-a fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$.

In embodiments, X may be a naphthalene group, an anthracene group, a phenanthrene group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, or a dibenzothiophene 5,5-dioxide group, each unsubstituted or substituted with at least one $R_{10a}$.

In embodiments, *—X—*' in Formula 1 may be a group represented by one of Formulae 3-1 to 3-26:

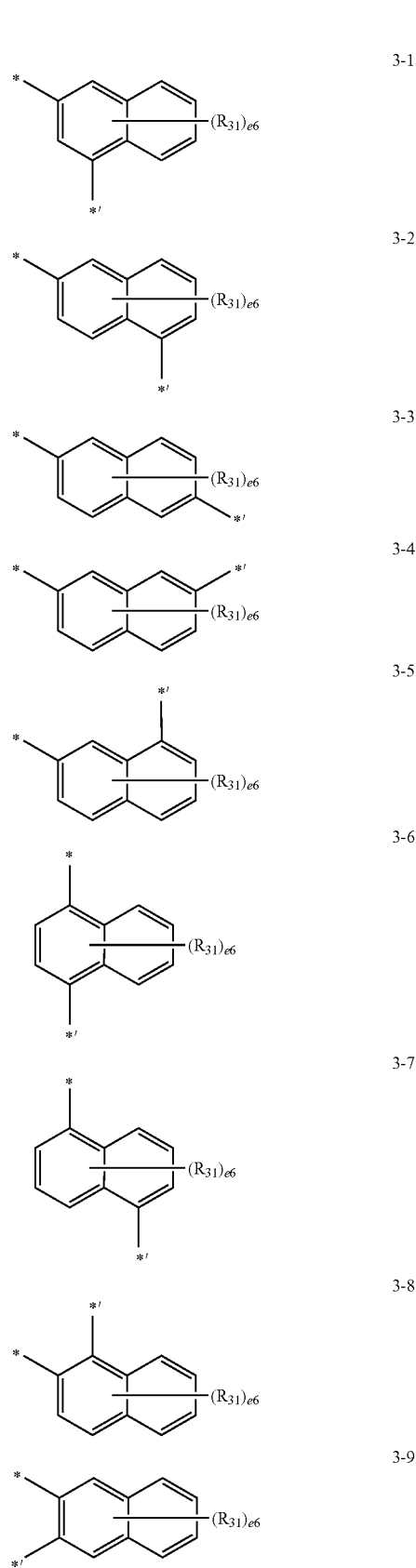

-continued
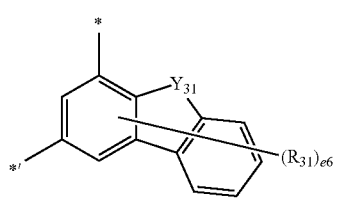
3-10
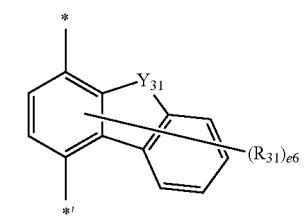
3-11
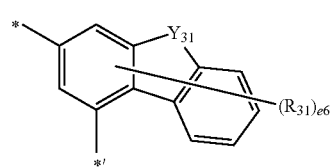
3-12
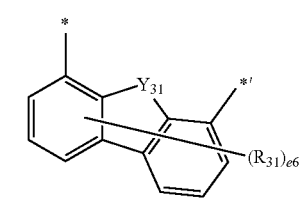
3-13
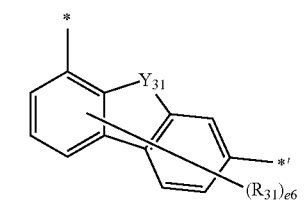
3-14
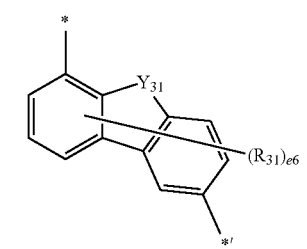
3-15
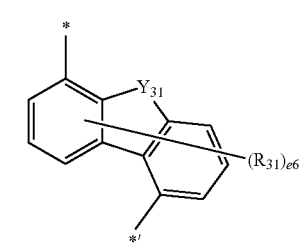
3-16
-continued
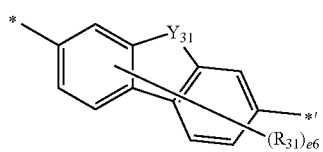
3-17
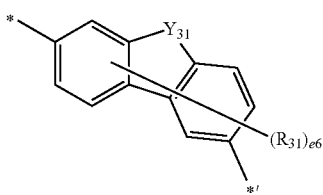
3-18
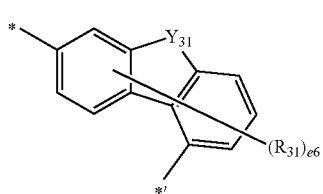
3-19
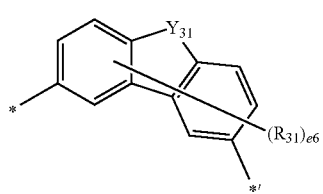
3-20
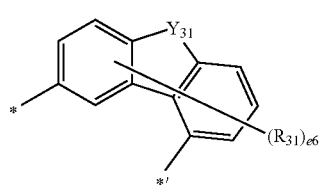
3-21
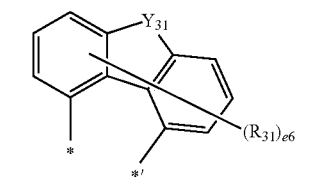
3-22
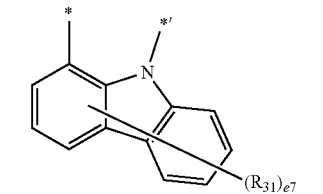
3-23
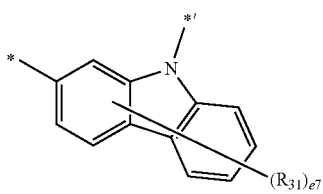
3-24

-continued 3-25
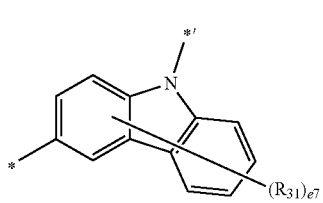

3-26
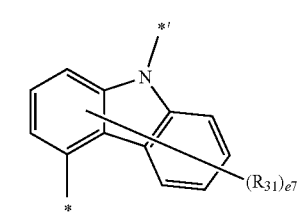

In Formulae 3-1 to 3-26,
$Y_{31}$ may be O, S, $N(R_{32})$, or $C(R_{32})(R_{33})$,
$R_{31}$ to $R_{33}$ may each independently be the same as described in connection with $R_1$ in Formula 1,
e6 may be an integer from 1 to 6,
e7 may be an integer from 1 to 7, and
* and *' each indicate a binding site to a neighboring atom.

In Formula 1, n1 may be an integer from 1 to 3.
In an embodiment, n1 may be 1.
In Formula 1, a1 and a2 may each independently be an integer from 0 to 4, and the sum of a1 and a2 may be 1 or more.
In an embodiment, a1 may be 1, and a2 may be 1.
In Formula 1, $R_1$ to $R_4$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$).

$R_{10a}$ as used herein may be:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, or any combination thereof.

In Formula 1, d1 and d2 may each independently be an integer from 1 to 8.

In Formula 1, d3 and d4 may each independently be an integer from 1 to 4.

In an embodiment, a moiety represented by

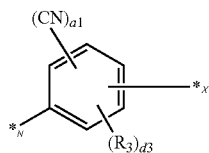

in Formula 1 may be a moiety represented by one of Formulae 4-1 to 4-20:

4-1
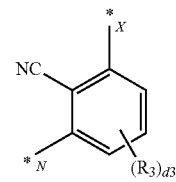

4-2
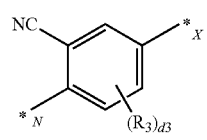

4-3
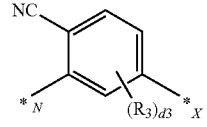

4-4
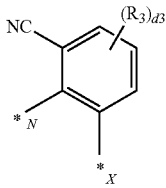

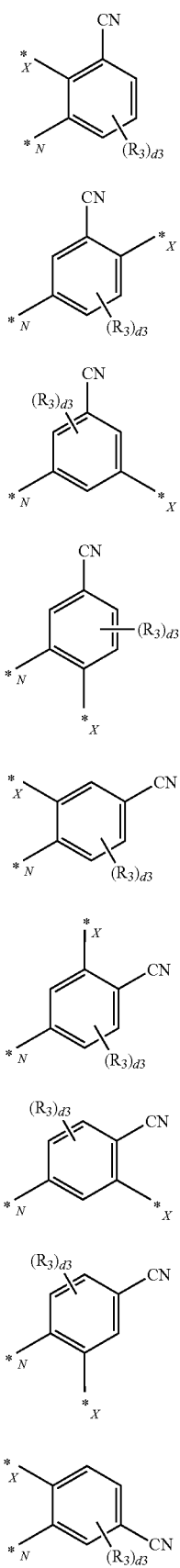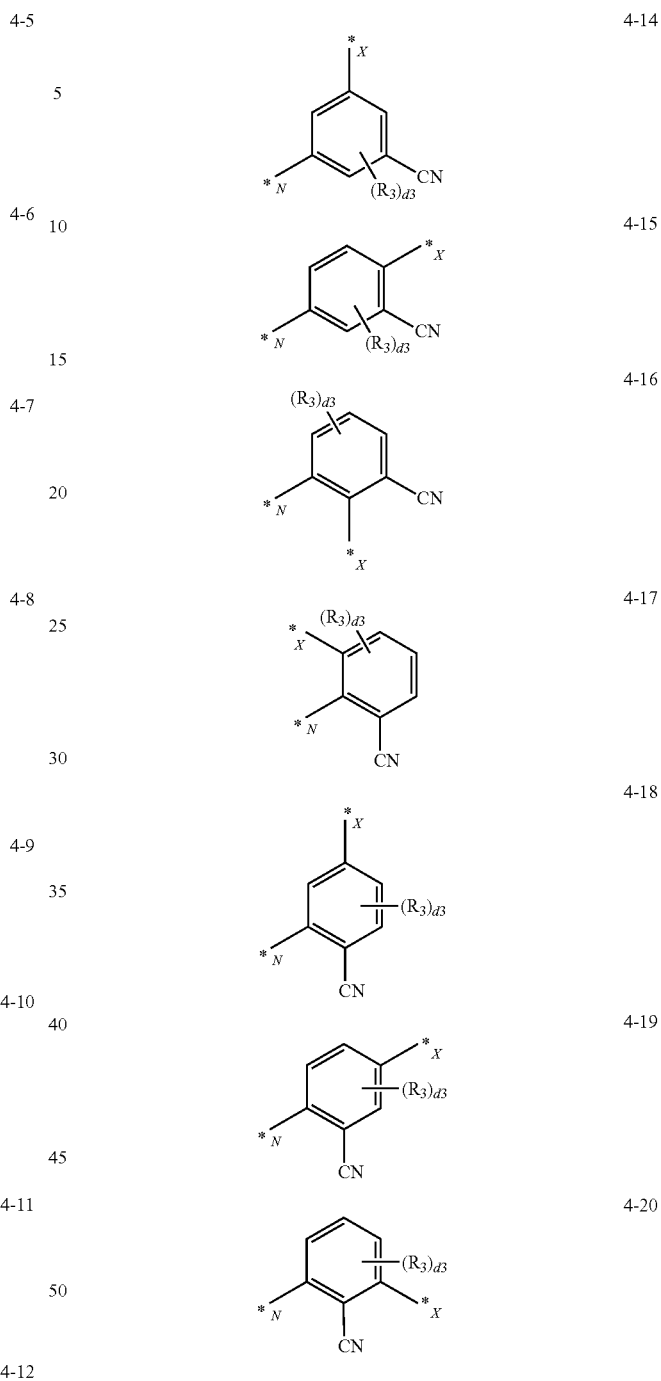
In Formulae 4-1 to 4-20,
R₃ may be the same as described in connection with Formula 1,
d3 may be an integer from 1 to 3,
*$_N$ indicates a binding site to N of a carbazole group in Formula 1, and
*$_X$ indicates a binding site to X in Formula 1.
In an embodiment, the heterocyclic compound represented by Formula 1 may be represented by Formula 1-1 or Formula 1-2:

[Formula 1-1]

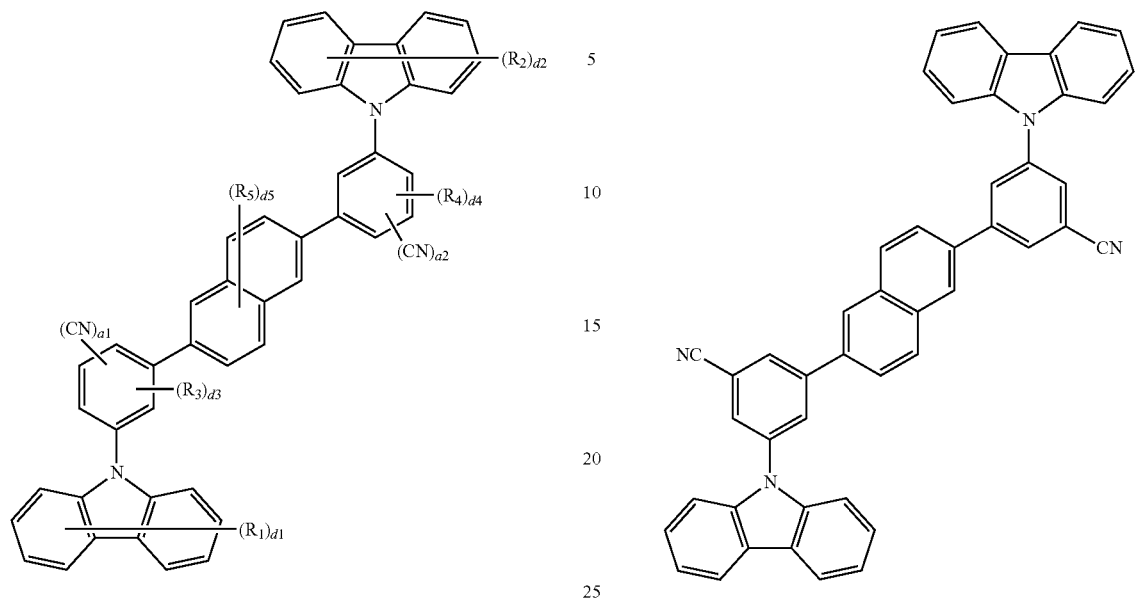

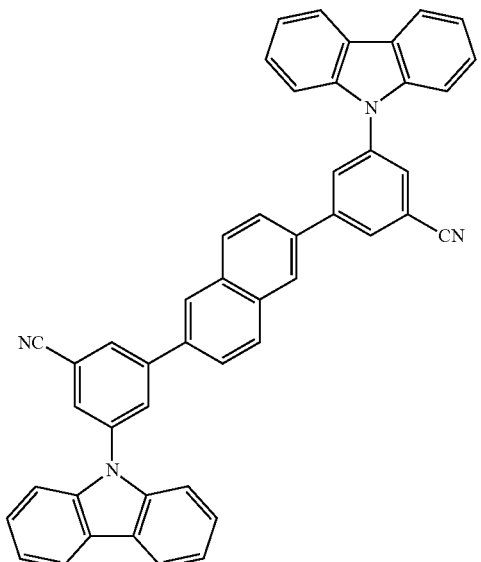

[Formula 1-2]

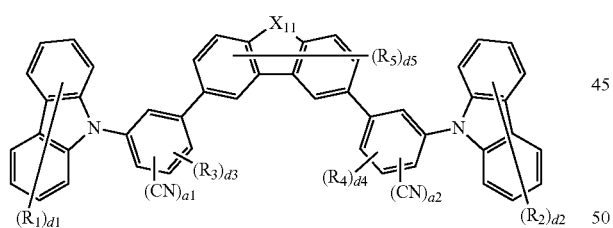

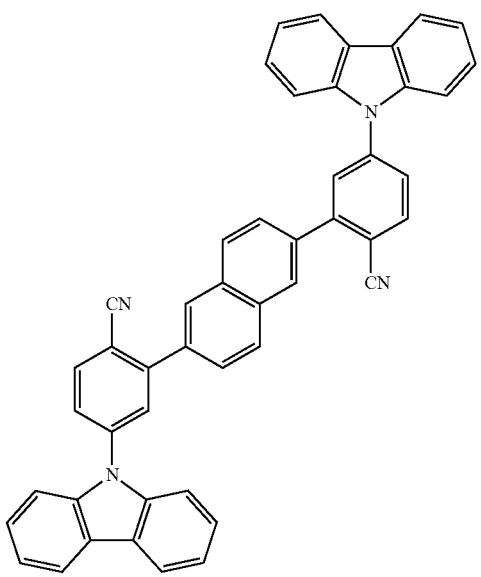

In Formulae 1-1 and 1-2, $X_{11}$ may be O, S, N($R_{11}$), or C($R_{11}$)($R_{12}$), $R_5$, $R_{11}$, and $R_{12}$ may each independently be the same as described in connection with $R_1$ in Formula 1, d5 may be an integer from 1 to 6, and $R_1$ to $R_4$, d1 to d4, a1, and a2 may each be the same as described in connection with Formula 1.

In an embodiment, the heterocyclic compound may be one selected from Compounds 1 to 9, but embodiments of the disclosure are not limited thereto:

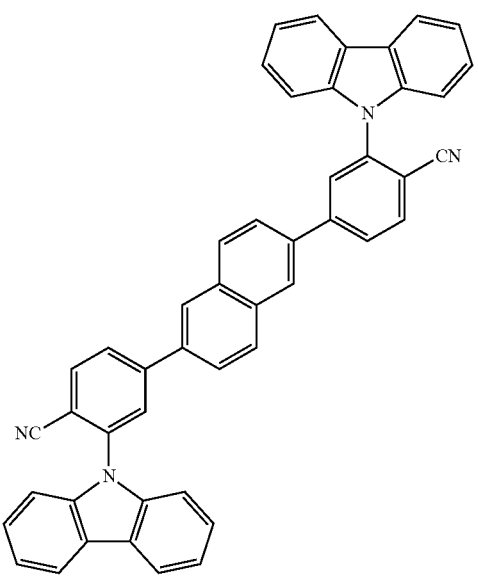

3

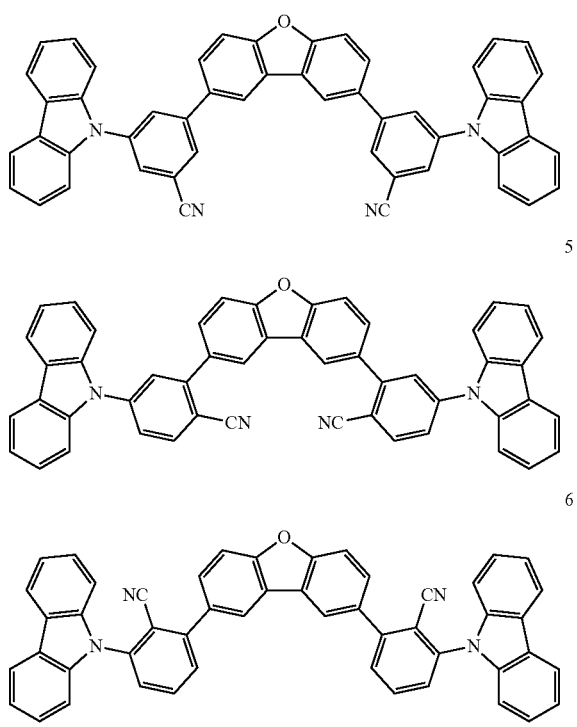

4

5

6

7

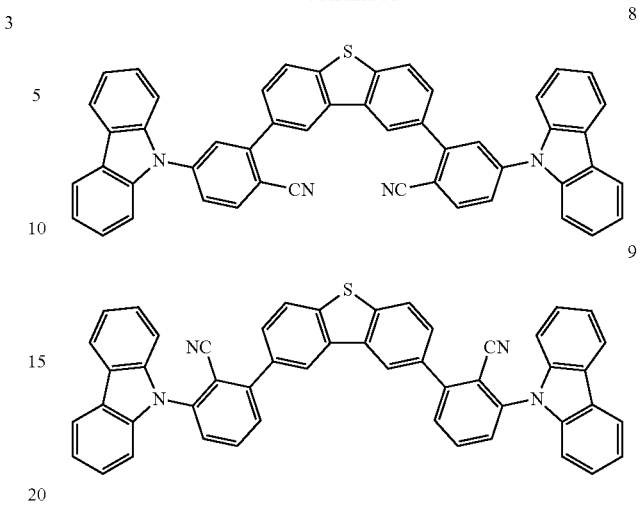

8

9

In an embodiment, the heterocyclic compound may satisfy Condition 1:

$E_{LUMO}(C1) \geq -2.5$ eV       [Condition 1]

In Condition 1, $E_{LUMO}(C1)$ indicates a lowest unoccupied molecular orbital (LUMO) energy level (eV) of the heterocyclic compound.

Highest occupied molecular orbital (HOMO) and LUMO energy levels as used herein may be measured by differential pulse voltammetry (DPV). A solvent used for the measurement may be dimetylformamide (DMF), and tetrabutylammonium fluoride (TBAF) may be used as an electrolyte. A reference electrode Ag/Ag+ may be used, and a counter electrode Pt and a working electrode Pt may be used. During the measurement, ferrocene (Fc) may be used as a reference material, and a HOMO of Fc is known to be −4.8 eV. Accordingly, HOMO and LUMO energy levels of the heterocyclic compound may be calculated by applying a potential value measured by DPV to the data calculation method used to obtain results shown in Table 1 below.

TABLE 1

|      | Measurement potential | Energy level (eV) |
|------|-----------------------|-------------------|
| Ref. | α                     | −4.8              |
| HOMO | β                     | −4.8 − (β − α)    |
| LUMO | γ                     | −4.8 − (−γ − α)   |

Lowest excited triplet energy level (T1) and lowest excited singlet energy level (S1) as used herein may be measured in a solution state from a photoluminescence (PL) spectrum. The PL spectrum may be measured by using LS-55 of Perkin Elmer Inc., and the emission spectrum at an excitation wavelength of 300 nm may be in a range of about 400 nm to about 700 nm. T1 of the heterocyclic compound is the lowest excited triplet energy level at the onset wavelength of the low-temperature PL spectrum of the compound. The term "lowest excited triplet energy level at the onset wavelength" as used herein refers to the triplet energy at the beginning of the low-temperature PL spectrum, and may be calculated from the triplet energy at the point (for example, an x-intercept) where the curve of the function obtained by plotting the PL spectrum as a quadratic function meets the axis of wavelength. S1 of the heterocyclic compound is the lowest excited singlet energy level at the onset wavelength of the room temperature PL spectrum of the compound. The term "lowest excited singlet energy level at the onset wavelength" as used herein refers to the singlet energy at the beginning of the room temperature PL spectrum, and may be calculated from the singlet energy at the point (for example, a y-intercept) where the curve of the function obtained by plotting the PL spectrum as a quadratic function meets the axis of wavelength.

The heterocyclic compound represented by Formula 1 may have a structure in which a core consisting of a carbocyclic group or a heterocyclic group is substituted with a substituent including a phenylene group including two or more carbazole group and at least one cyano group.

Since the heterocyclic compound represented by Formula 1 has high LUMO energy due to the inclusion of the core consisting of the carbocyclic group or the heterocyclic group, a band gap of an emission layer of a light-emitting device may be increased. Since a phenylene group neighboring the carbazole rings is substituted with a cyano group, the bonding distance between N of a carbazole group and C of the neighboring phenylene group may be shortened, and thus, the binding stability of molecules may be improved, and the stability of materials may be increased.

Furthermore, in the heterocyclic compound represented by Formula 1, since the carbocyclic group or the heterocyclic group and the carbazole rings are linked via a phenylene group including at least one cyano group, high LUMO energy may be formed, and injection of electrons from a neighboring layer may be controlled, and thus, the amount of holes and electrons injected into the emission layer may be easily adjusted. Since holes and electrons are easily adjusted from low current density to high current density, a decrease in luminance may be suppressed.

When one or more hosts are combined, efficiency according to a change in current density may be maintained constant by adjusting the weight ratio of the heterocyclic compound. For example, the difference in efficiency changes between a fluorescent device and a phosphorescent device may be reduced according to current density, and thus, color expression may be maintained constant according to the current density in a panel of the light-emitting device.

Accordingly, an electronic device, for example, a light-emitting device, using the heterocyclic compound represented by Formula 1 may have little change in efficiency according to current density, and may have high efficiency even at high current density. Accordingly, the color expression may be maintained constant even when the current density varies, and white light may be stably realized even when the luminance is increased from the time of initial operation.

Methods of synthesizing the heterocyclic compound represented by Formula 1 should be readily apparent to those of ordinary skill in the art by referring to Examples described herein.

At least one heterocyclic compound represented by Formula 1 may be used in a light-emitting device (for example, an organic light-emitting device).

According to embodiments, a light-emitting device may include a first electrode, a second electrode facing the first electrode, an interlayer between the first electrode and the second electrode and including an emission layer; and at least one of the heterocyclic compound described above.

In an embodiment, the first electrode may be an anode, the second electrode may be a cathode, the interlayer may further include a hole transport region between the emission layer and the first electrode and an electron transport region between the emission layer and the second electrode, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In an embodiment, the emission layer may include the heterocyclic compound.

In an embodiment, the emission layer may further include a hole-transporting compound.

In an embodiment, the hole-transporting compound may include at least one electron donating group.

The electron donating group may be a π electron-rich $C_3$-$C_{60}$ cyclic group unsubstituted or substituted with at least one $R_{20a}$ or —N(Ar$_1$)(Ar$_2$), Ar$_1$ and Ar$_2$ may each independently be a π electron-rich $C_3$-$C_{60}$ cyclic group unsubstituted or substituted with at least one $R_{20a}$, and $R_{20a}$ may be:

deuterium (-D), a hydroxyl group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, a hydroxyl group, a nitro group, a π electron-rich $C_3$-$C_{60}$ cyclic group, a $C_6$-$C_{60}$ aryloxy group, a $C_6$-$C_{60}$ arylthio group, —Si($Q_{41}$)($Q_{42}$)($Q_{43}$), —N($Q_{41}$)($Q_{42}$), —B($Q_{41}$)($Q_{42}$), or any combination thereof;

a π electron-rich $C_3$-$C_{60}$ cyclic group, a $C_6$-$C_{60}$ aryloxy group, or a $C_6$-$C_{60}$ arylthio group, each unsubstituted or substituted with deuterium, a hydroxyl group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a π electron-rich $C_3$-$C_{60}$ cyclic group, a $C_6$-$C_{60}$ aryloxy group, a $C_6$-$C_{60}$ arylthio group, —Si($Q_{51}$)($Q_{52}$)($Q_{53}$), —N($Q_{51}$)($Q_{52}$), —B($Q_{51}$)($Q_{52}$), or any combination thereof; or —Si($Q_{61}$)($Q_{62}$)($Q_{63}$), —N($Q_{61}$)($Q_{62}$), or —B($Q_{61}$)($Q_{62}$), wherein $Q_{41}$ to $Q_{43}$, $Q_{51}$ to $Q_{53}$, and $Q_{61}$ to $Q_{63}$ may each independently be: hydrogen; deuterium; a hydroxyl group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a π electron-rich $C_3$-$C_{60}$ cyclic group unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the hole-transporting compound may be a compound represented by Formula 2:

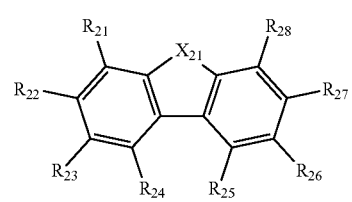

[Formula 2]

In Formula 2, $X_{21}$ may be O, S, N($R_{29}$), or C($R_{29}$)($R_{30}$), $R_{21}$ to $R_{30}$ may each independently be *-(L$_{21}$)$_{a11}$-(A$_{21}$)$_{b11}$, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), $L_{21}$ may be a single bond, a π electron-rich $C_3$-$C_{60}$ cyclic group unsubstituted or substituted with at least one $R_{20a}$, *—C($Ar_3$)($Ar_4$)—*', *—Si($Ar_3$)($Ar_4$)—*', *—B($Ar_3$)—*', or *—N($Ar_3$)—*', a11 may be an integer from 1 to 5, $A_{21}$ may a $C_1$-$C_{60}$ alkyl group unsubstituted or substituted with at least one $R_{20a}$, a π electron-rich $C_3$-$C_{60}$ cyclic group unsubstituted or substituted with at least one $R_{20a}$, —C($Ar_5$)($Ar_6$)($Ar_7$), —Si($Ar_5$)($Ar_6$)($Ar_7$), —N($Ar_5$)($Ar_6$), or —B($Ar_5$)($Ar_6$), b11 may be an integer from 1 to 10, $R_{10a}$ may be the same as described in the specification, $Q_1$ to $Q_3$ and $R_{20a}$ may be the same as described in the specification, $Ar_3$ to $Ar_7$ may each independently be the same as described in connection with $Ar_1$, and

* and *' each indicate a binding site to a neighboring atom.

In an embodiment, an amount of the heterocyclic compound may be in a range of about 10 parts by weight to about 90 parts by weight based on 100 parts by weight of a total of the heterocyclic compound and the hole-transporting compound.

In an embodiment, the emission layer may further include a phosphorescent compound.

In an embodiment, the phosphorescent compound may be a transition metal compound.

According to embodiments, a light-emitting device may include a first electrode, a second electrode facing the first electrode, m light-emitting units between the first electrode and the second electrode and including at least one emission layer, and m−1 charge generation layers between two neighboring light-emitting units from among the m light-emitting units, wherein m may be an integer of 2 or more, and at least one of the m light-emitting units may include a heterocyclic compound represented by Formula 1.

In an embodiment, a maximum emission wavelength of light emitted from at least one light-emitting unit of the m light-emitting units may be different from a maximum emission wavelength of light emitted from at least one light-emitting unit of the remaining m−1 light-emitting units.

In an embodiment, a maximum emission wavelength of light emitted from the m light-emitting units may all be the same.

The term "(an interlayer) includes a heterocyclic compound" as used herein may include a case in which "(an interlayer) includes identical heterocyclic compounds represented by Formula 1" and a case in which "(an interlayer) includes two or more different heterocyclic compounds represented by Formula 1."

In an embodiment, the interlayer may include only Compound 1 as the heterocyclic compound. In this regard, Compound 1 may exist in the emission layer of the light-emitting device. In embodiments, the interlayer may include, as the heterocyclic compound, Compound 1 and Compound 2. In this regard, Compound 1 and Compound 2 may exist in an identical layer (for example, both Compound 1 and Compound 2 may exist in an emission layer), or may exist in different layers (for example, Compound 1 may exist in an emission layer and Compound 2 may exist in an electron transport region).

The term "interlayer" as used herein refers to a single layer or multiple layers located between a first electrode and a second electrode of a light-emitting device.

According to embodiments, an electronic apparatus may include the light-emitting device.

In an embodiment, the electronic apparatus may further include a thin-film transistor. In an embodiment, the electronic apparatus may further include a thin-film transistor including a source electrode and a drain electrode, and the first electrode of the light-emitting device may be electrically connected to the source electrode or the drain electrode.

In an embodiment, the electronic apparatus may further include a color filter, a color conversion layer, a touch screen layer, a polarizing layer, or any combination thereof. In an embodiment, the electronic apparatus may be a flat panel display apparatus, but embodiments of the disclosure are not limited thereto.

More details on the electronic apparatus are the same as described in the specification.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 1.

[First Electrode 110]

In FIG. 1, a substrate may be further included under the first electrode 110 or above the second electrode 150. The substrate may be a glass substrate or a plastic substrate. In embodiments, the substrate may be a flexible substrate, and may include plastics with excellent heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode.

The first electrode 110 may have a structure consisting of a single layer or a structure including multiple layers. In an embodiment, the first electrode 110 may have a three-layered structure of ITO/Ag/ITO.

[Interlayer 130]

The interlayer 130 may be on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include, in addition to various organic materials, metal-containing compounds such as organometallic compounds, inorganic materials such as quantum dots, and the like.

In embodiments, the interlayer 130 may include two or more light-emitting units sequentially stacked between the first electrode 110 and the second electrode 150 and at least one charge generation layer between the two or more light-emitting units. When the interlayer 130 includes the two or more emitting units and the at least one charge generation layer as described above, the light-emitting device 10 may be a tandem light-emitting device.

[Hole Transport Region in Interlayer 130]

The hole transport region may have a structure consisting of a layer consisting of a single material, a structure consisting of a layer consisting of different materials, or a multi-layered structure including layers including different materials.

The hole transport region may include a hole injection layer, a hole transport layer, an emission auxiliary layer, an electron blocking layer, or any combination thereof.

In an embodiment, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers may be stacked from the first electrode 110 in its respective stated order, but embodiments are not limited thereto.

The hole transport region may include a compound represented by Formula 201, a compound represented by Formula 202, or any combination thereof:

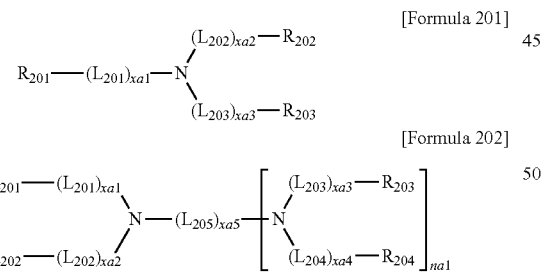

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, na1 may be an integer from 1 to 4, and * and *' each indicate a binding site to a neighboring atom. $R_{10a}$ may be the same as described in the specification.

In an embodiment, each of Formulae 201 and 202 may include at least one of groups represented by Formulae CY201 to CY217:

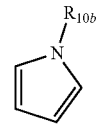

CY201

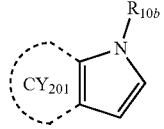

CY202

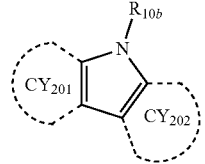

CY203

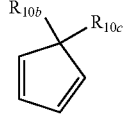

CY204

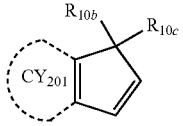

CY205

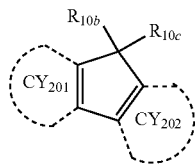

CY206

CY207 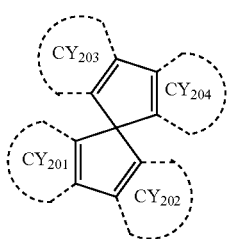

CY208 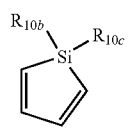

CY209 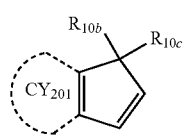

CY210 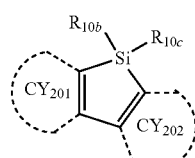

CY211 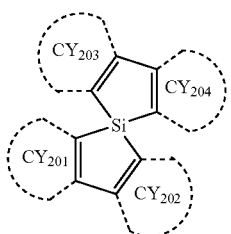

CY212 

CY213 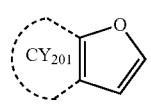

CY214 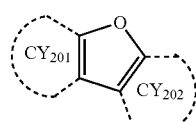

CY215 

CY216 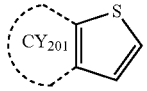

CY217 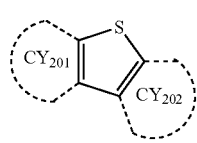

In Formulae CY201 to CY217, $R_{10b}$ and $R_{10c}$ may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In embodiments, each of Formulae 201 and 202 may include at least one of groups represented by Formulae CY201 to CY203.

In embodiments, Formula 201 may include at least one of groups represented by Formulae CY201 to CY203 and at least one of groups represented by Formulae CY204 to CY217.

In embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In embodiments, each of Formulae 201 and 202 may not include a group represented by one of Formulae CY201 to CY203.

In embodiments, each of Formulae 201 and 202 may not include a group represented by one of Formulae CY201 to CY203, and may include at least one of groups represented by Formulae CY204 to CY217.

In embodiments, each of Formulae 201 and 202 may not include a group represented by one of Formulae CY201 to CY217.

In an embodiment, the hole transport region may include one of Compounds HT1 to HT46, m-MTDATA, TDATA, 2-TNATA, NPB(NPD), R-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
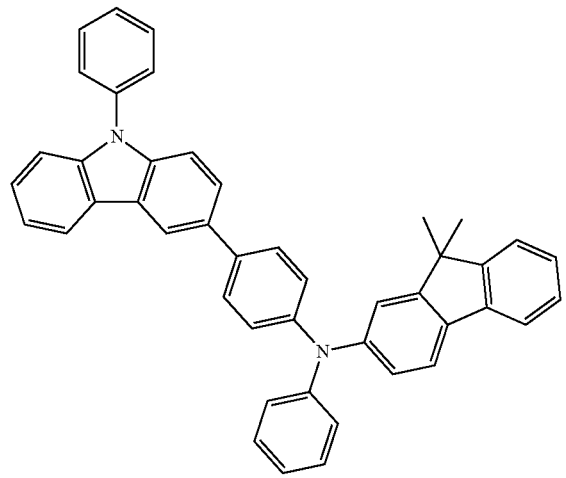
HT2
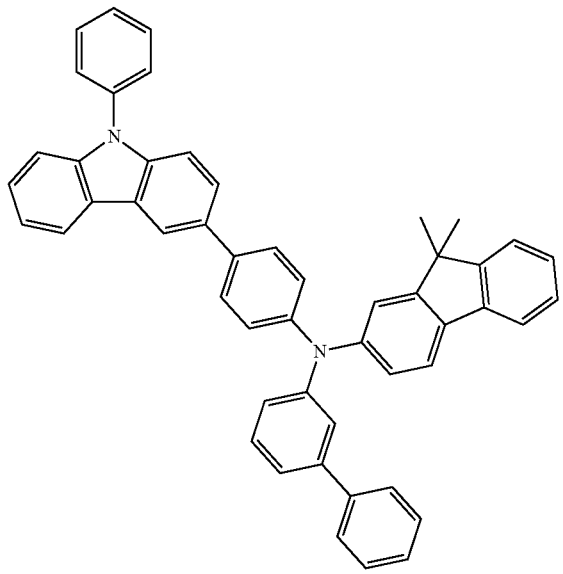
HT3
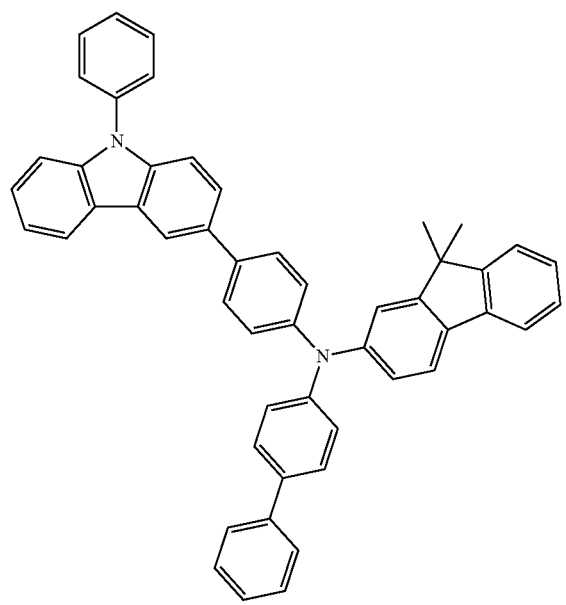
HT4
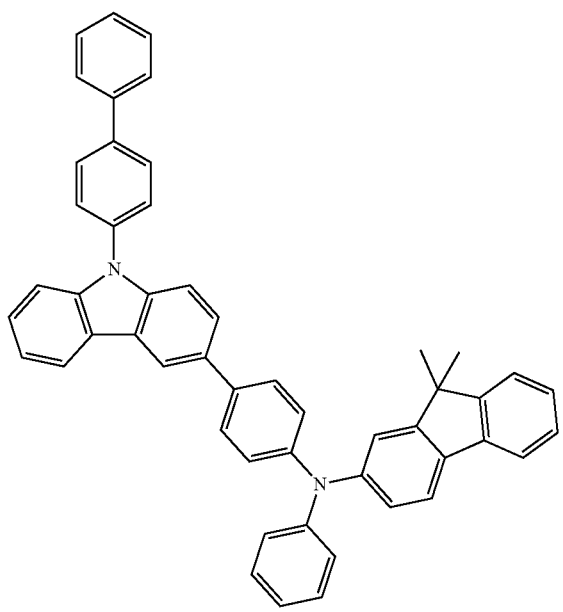

-continued
HT5
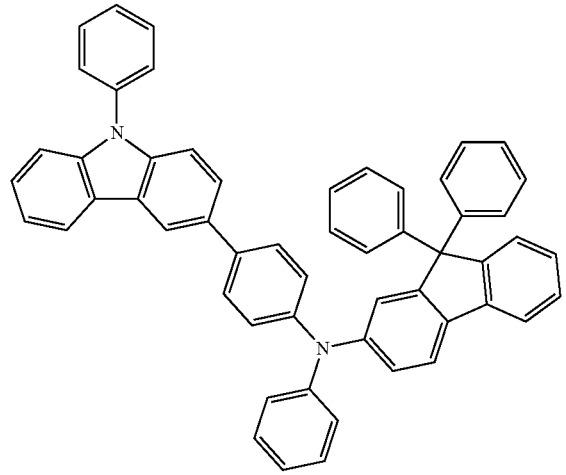
HT6
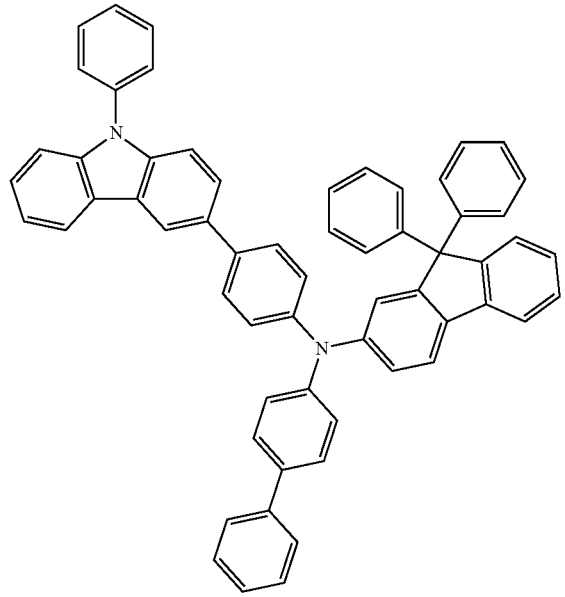
HT7
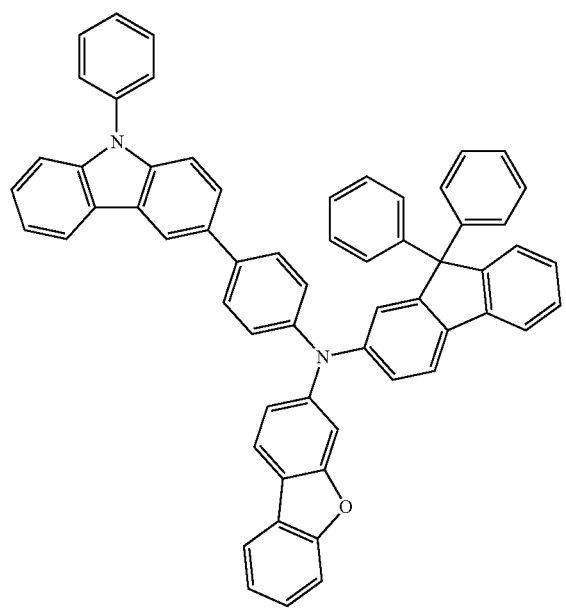
HT8
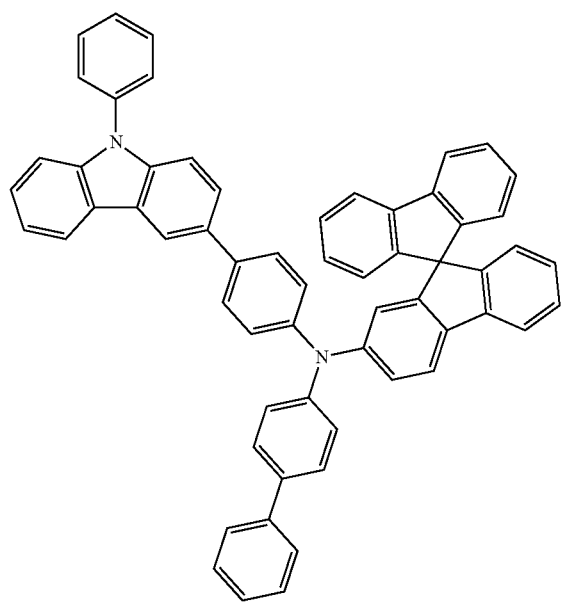

HT9
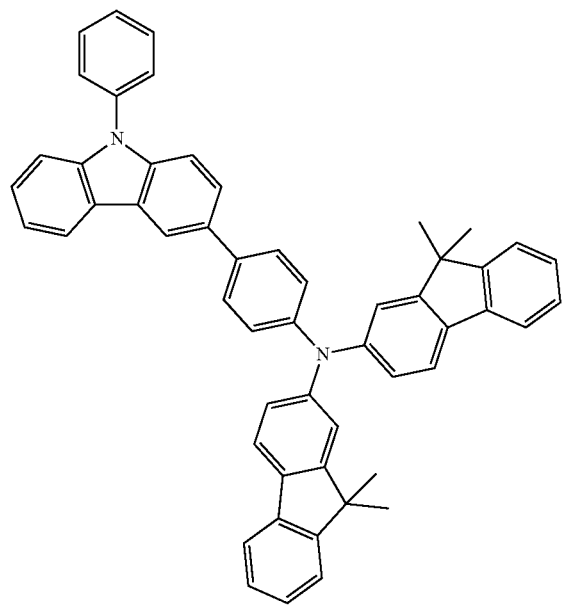
HT10
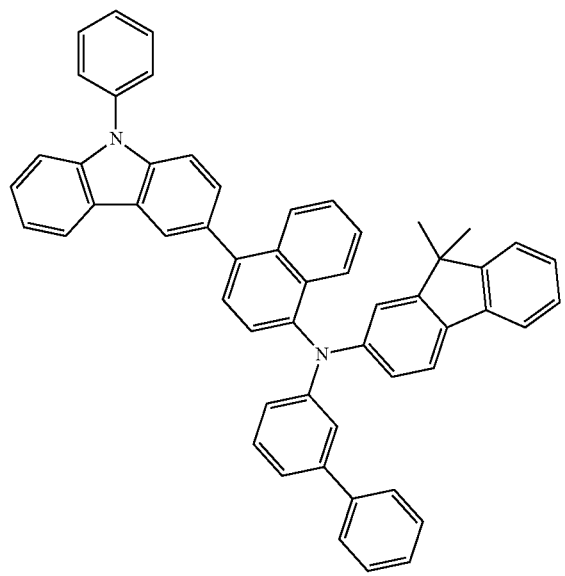
HT11
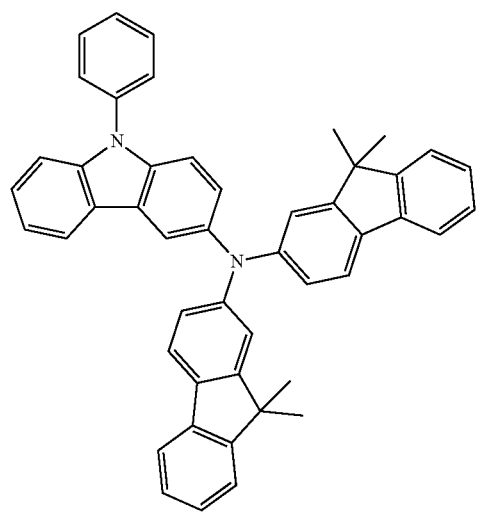
HT12
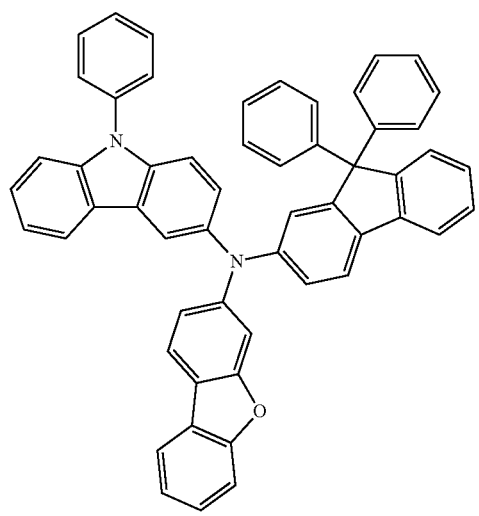

-continued
HT13
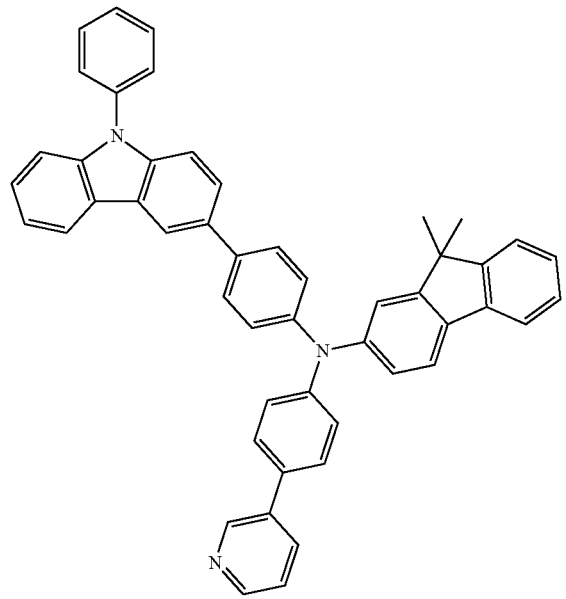
HT14
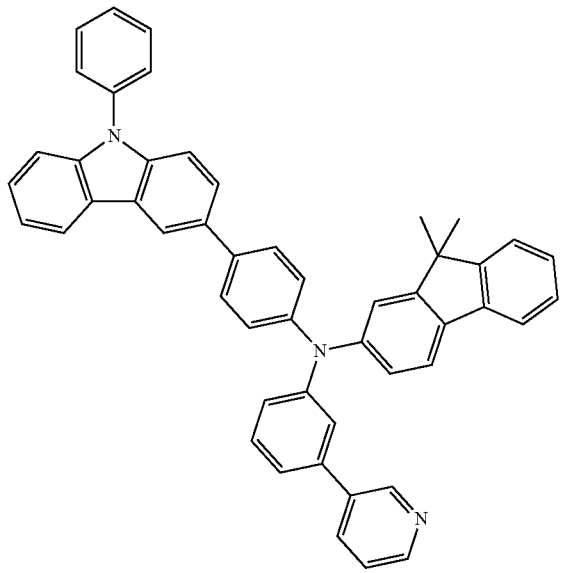
HT15
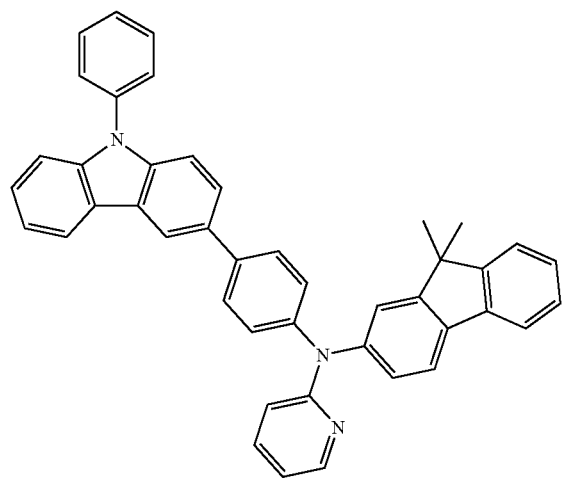
HT16
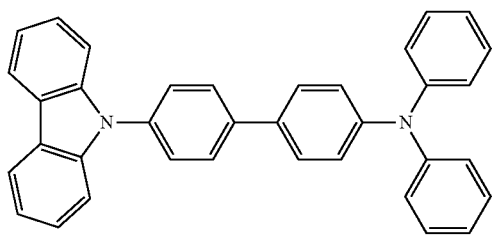
HT17
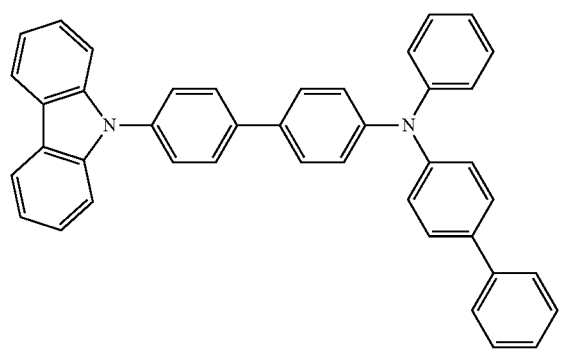
HT18
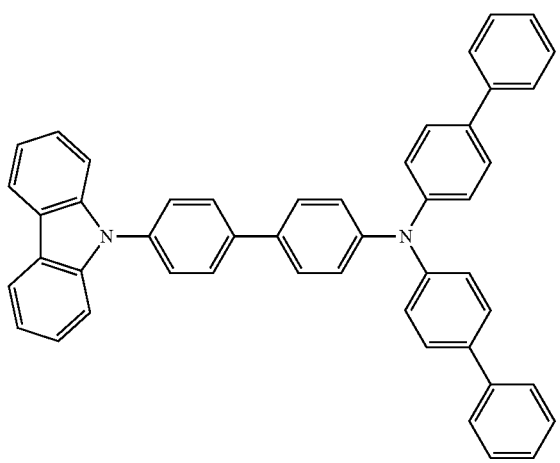

-continued
HT19
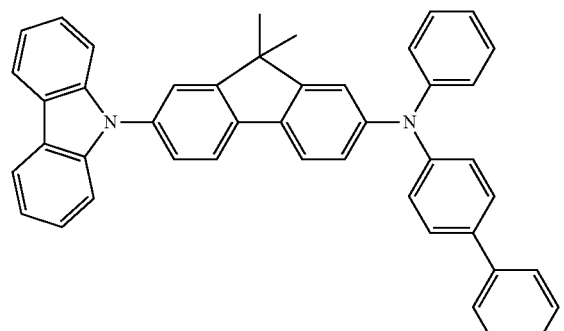
HT20
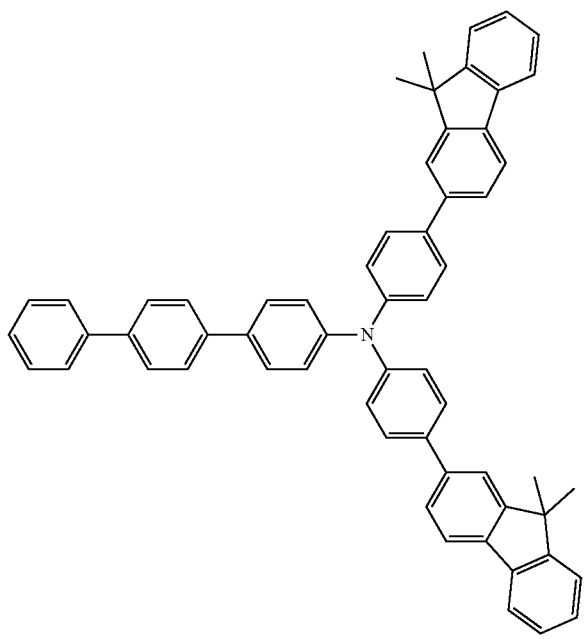
HT21
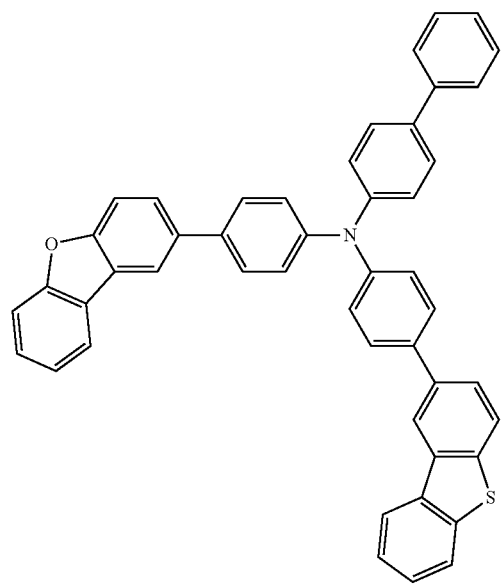
HT22
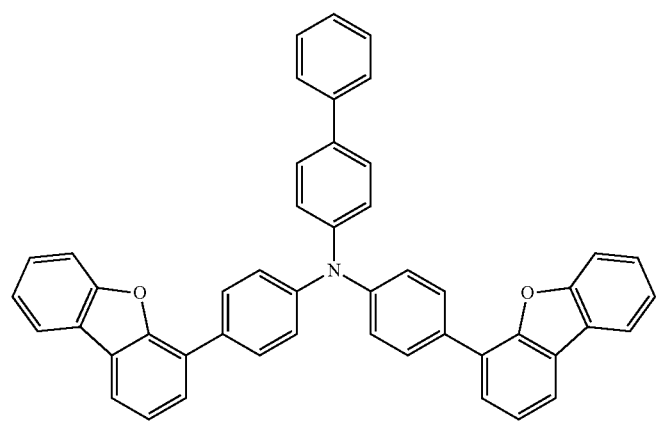

-continued
HT23
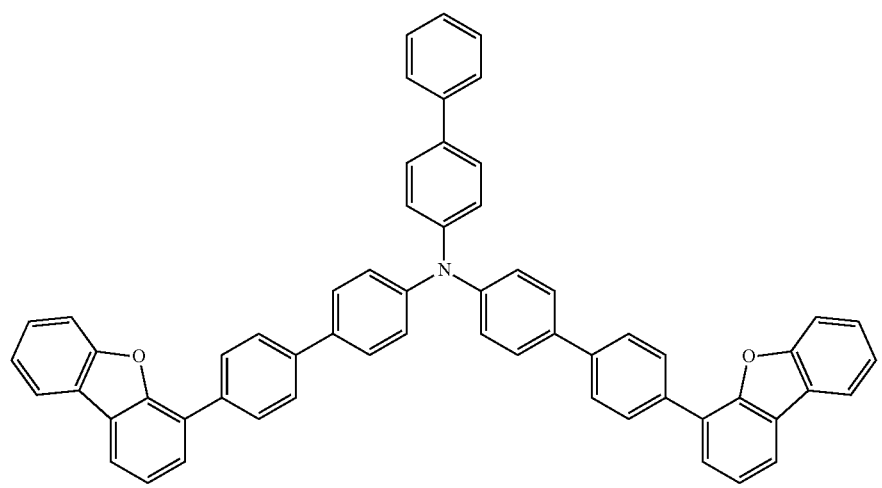
HT24
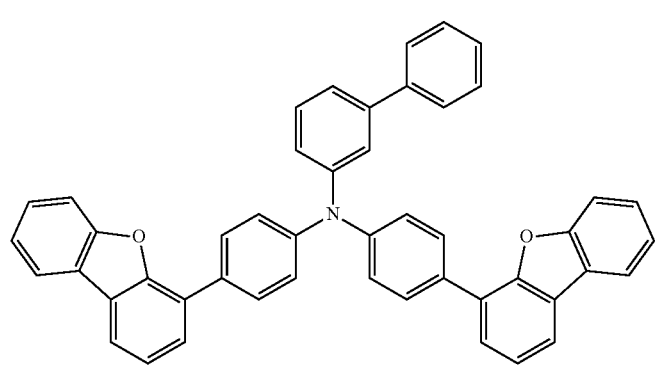
HT25
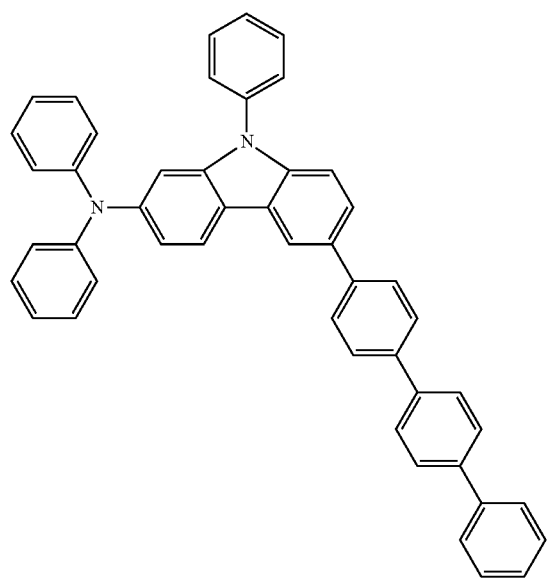
HT26
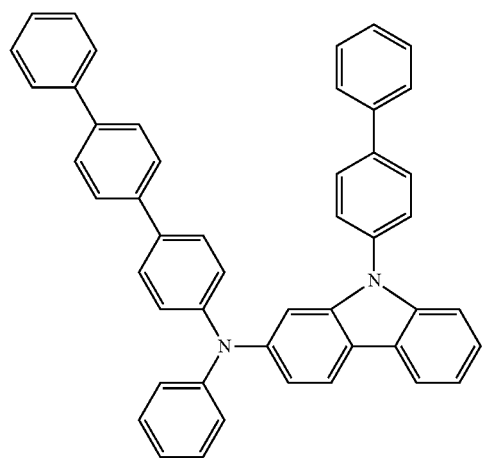

-continued
HT27
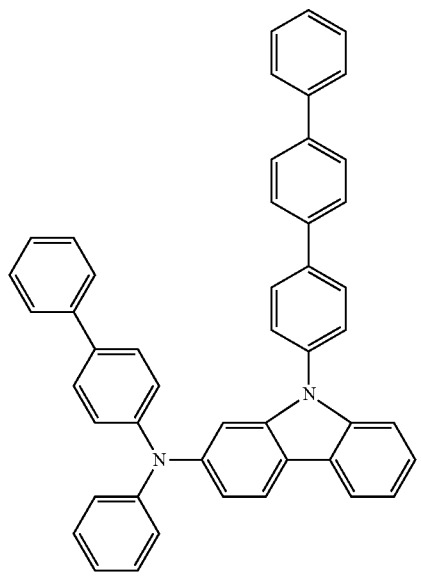
HT28
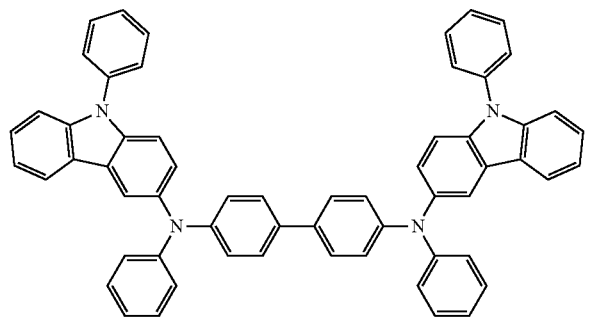
HT29
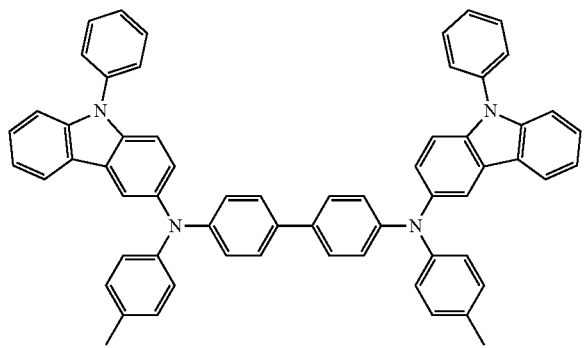
HT30
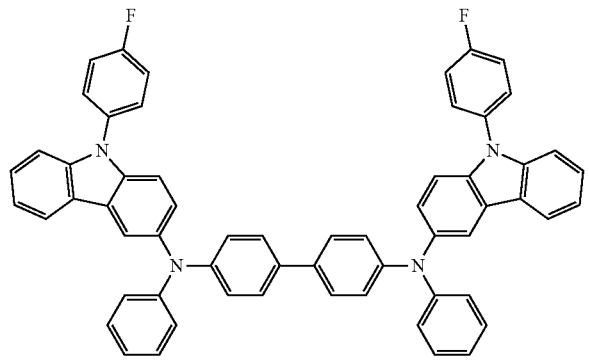
HT31
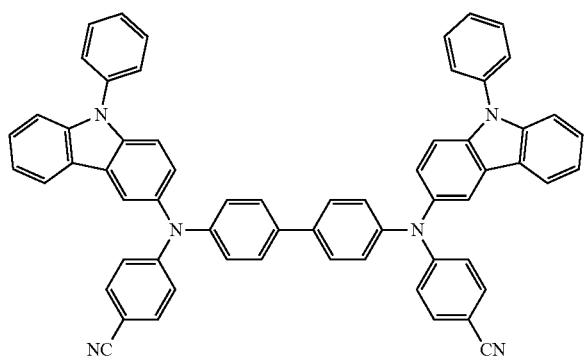
HT32
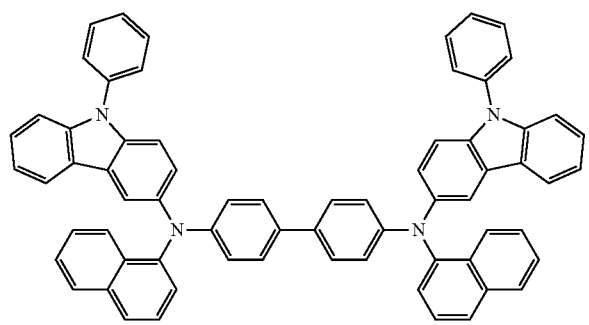

-continued
HT33
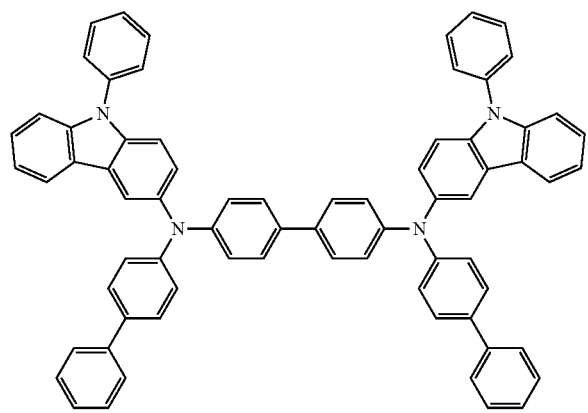
HT34
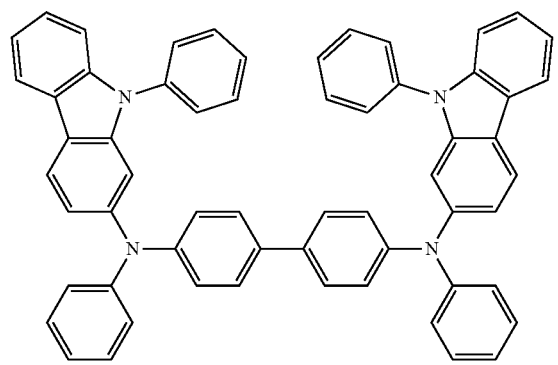
HT35
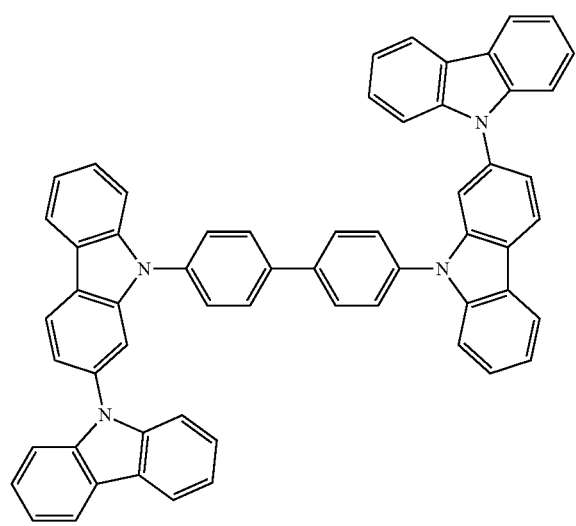
HT36
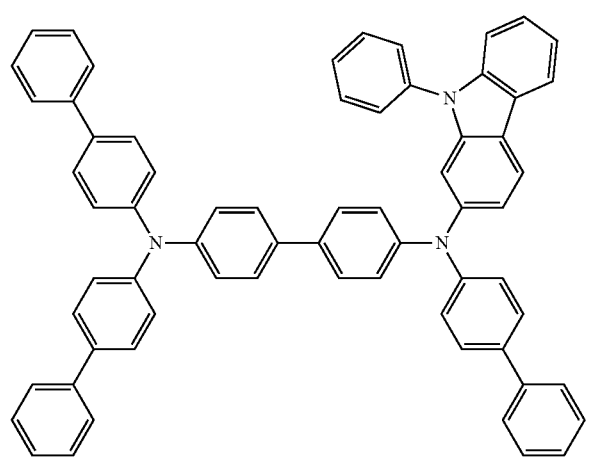
HT37
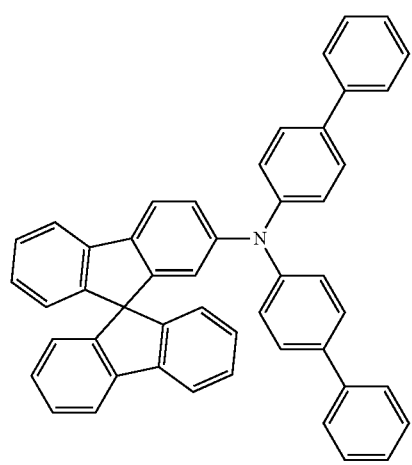
HT38
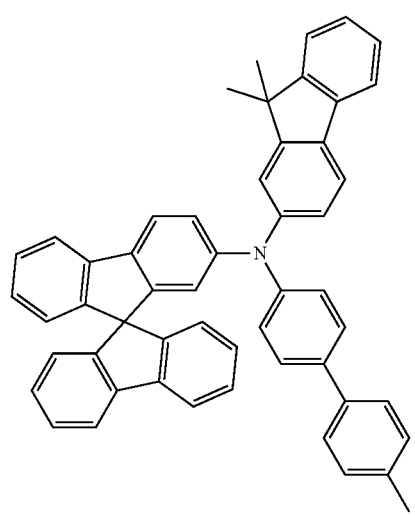

-continued
HT39
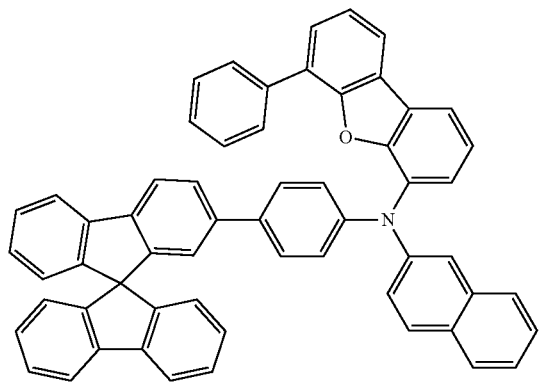
HT40
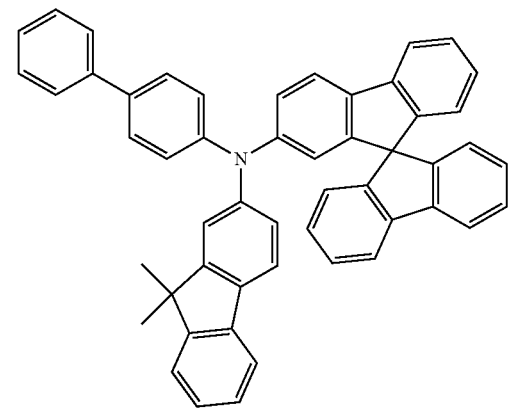
HT41
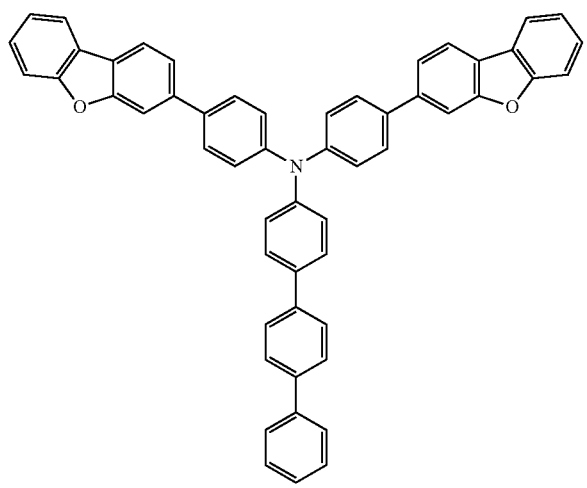
HT42
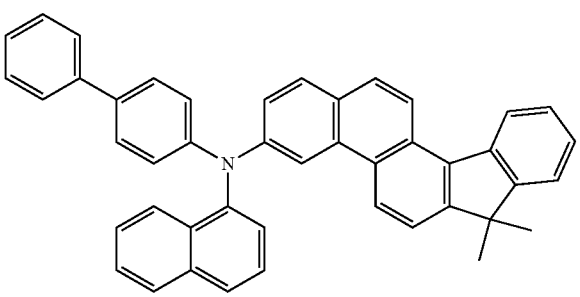
HT43
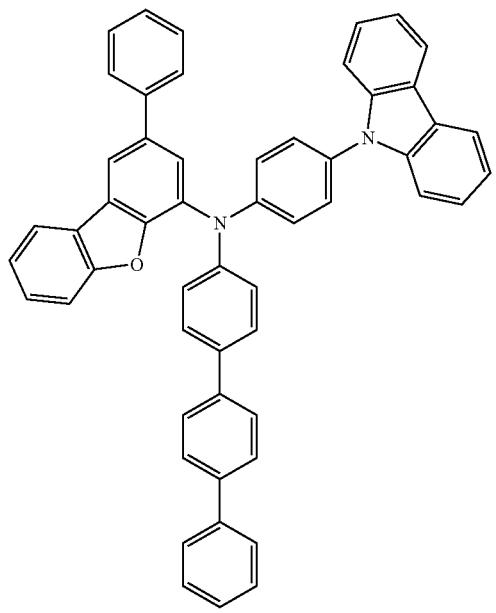
HT44
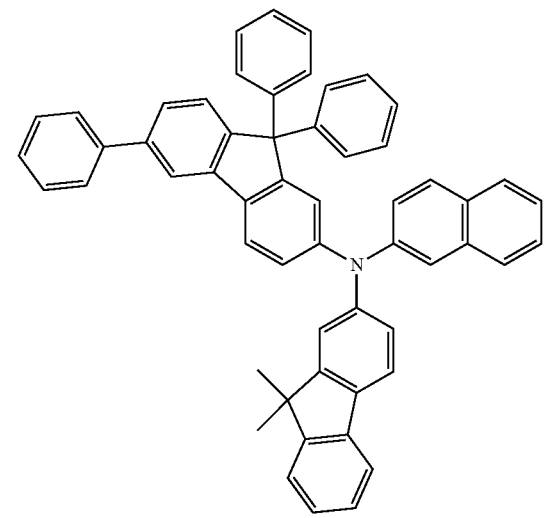

-continued
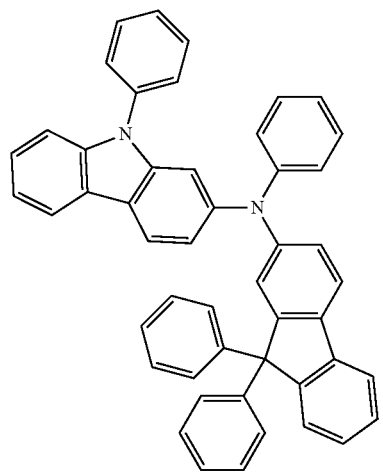
HT45
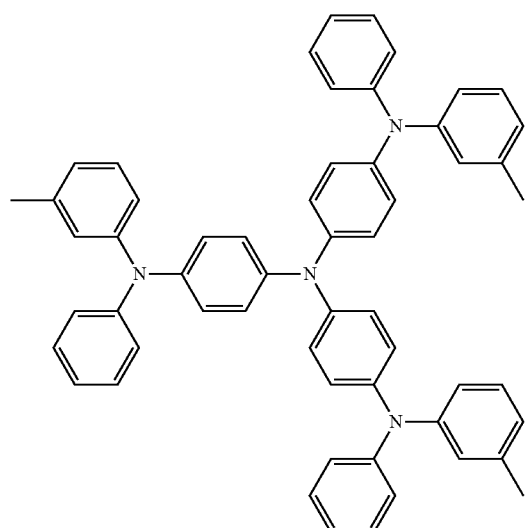
m-MTDATA
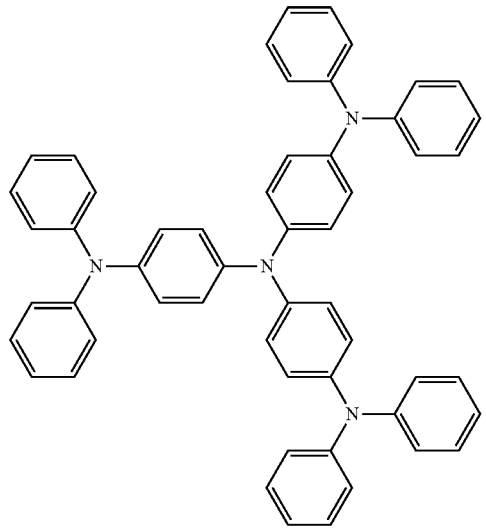
TDATA
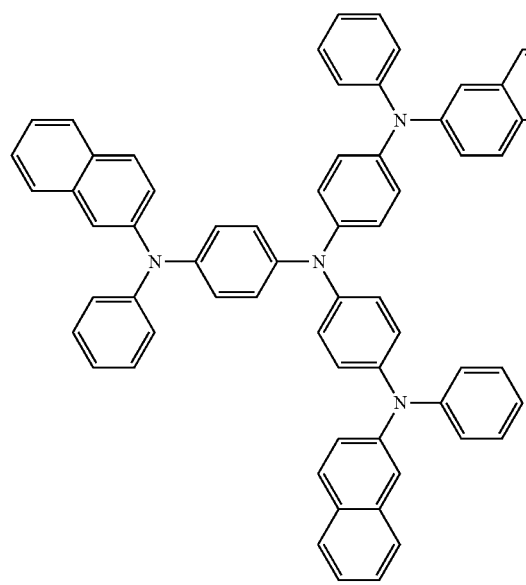
2-TNATA
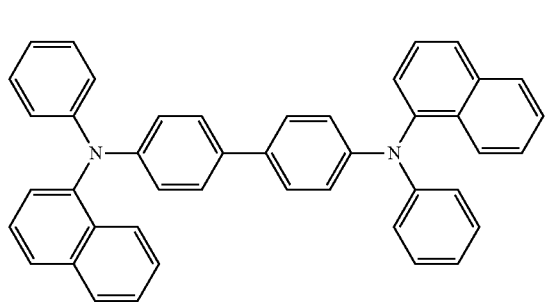
NPB

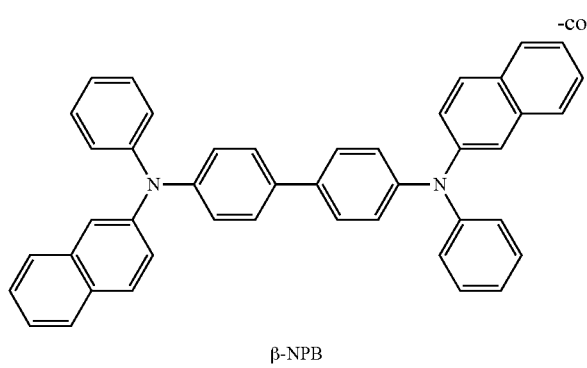

β-NPB

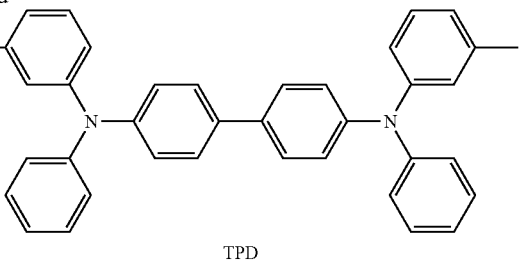

TPD

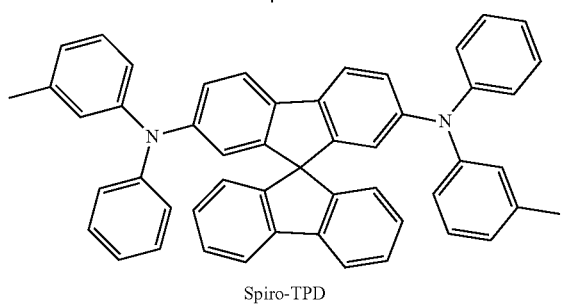

Spiro-TPD

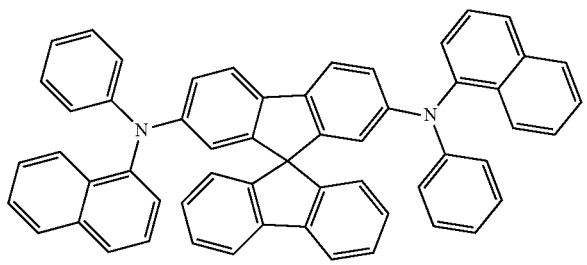

Spiro-NPB

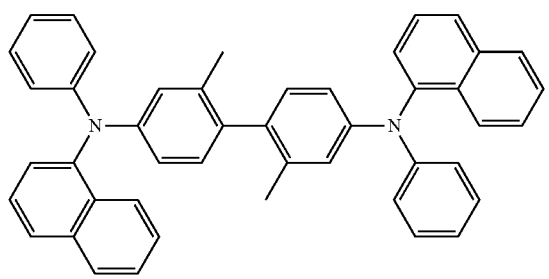

methylated-NPB

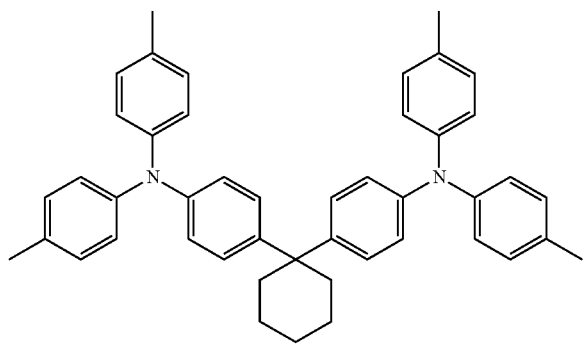

TAPC

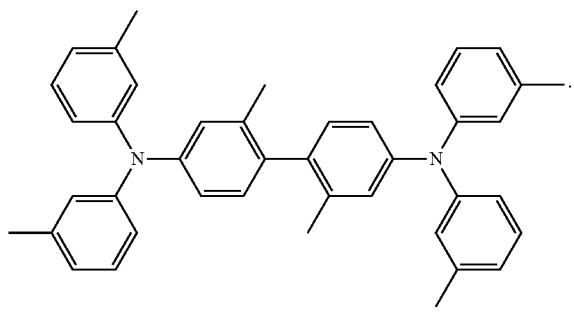

HMTPD

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to a wavelength of light emitted by an emission layer, and the electron blocking layer may block the leakage of electrons from an emission layer to a hole transport region. Materials that may be included in the hole transport region may be included in the emission auxiliary layer and the electron blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In an embodiment, a LUMO energy level of the p-dopant may be equal to or less than about −3.5 eV.

In an embodiment, the p-dopant may include a quinone derivative, a cyano group-containing compound, a compound including element EL1 and element EL2, or any combination thereof.

Examples of the quinone derivative may include TCNQ and F4-TCNQ.

Examples of the cyano group-containing compound may include HAT-CN and a compound represented by Formula 221.

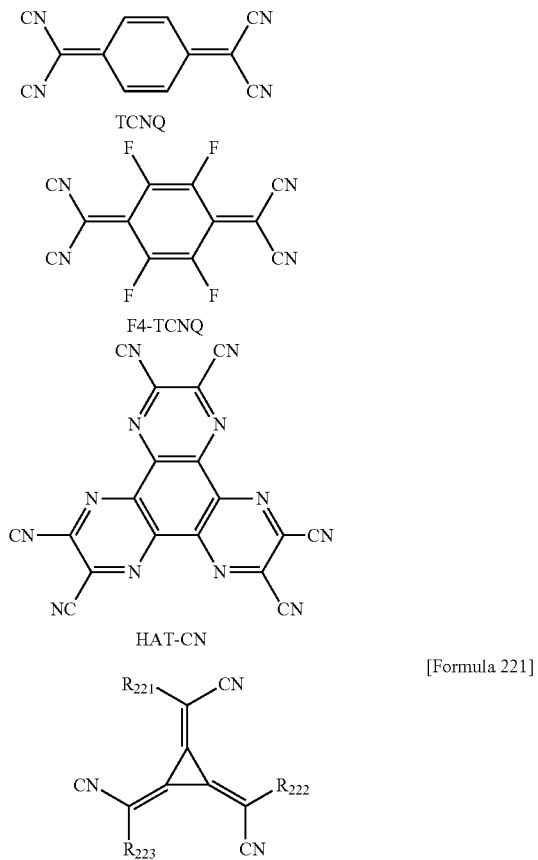

In Formula 221,

R$_{221}$ to R$_{223}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, and at least one of R$_{221}$ to R$_{223}$ may each independently be a C$_3$-C$_{60}$ carbocyclic group or a C$_1$-C$_{60}$ heterocyclic group, each substituted with a cyano group; —F; —Cl; —Br; —I; a C$_1$-C$_{20}$ alkyl group substituted with a cyano group, —F, —Cl, —Br, —I, or any combination thereof; or any combination thereof.

In the compound including element EL1 and element EL2, element EL1 may be a metal, a metalloid, or any combination thereof, and element EL2 may be a non-metal, a metalloid, or any combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and a halogen (for example, F, Cl, Br, I, etc.).

In an embodiment, examples of the compound containing element EL1 and element EL2 may include a metal oxide, a metal halide (for example, metal fluoride, metal chloride, metal bromide, or metal iodide), a metalloid halide (for example, metalloid fluoride, metalloid chloride, metalloid bromide, or metalloid iodide), a metal telluride, or any combination thereof.

Examples of the metal oxide may include tungsten oxide (for example, WO, W$_2$O$_3$, WO$_2$, WO$_3$, W$_2$O$_5$, etc.), vanadium oxide (for example, VO, V$_2$O$_3$, VO$_2$, V$_2$O$_5$, etc.), molybdenum oxide (MoO, Mo$_2$O$_3$, MoO$_2$, MoO$_3$, Mo$_2$O$_5$, etc.), and rhenium oxide (for example, ReO$_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include BeF$_2$, MgF$_2$, CaF$_2$, SrF$_2$, BaF$_2$, BeCl$_2$, MgCl$_2$, CaCl$_2$), SrCl$_2$, BaCl$_2$, BeBr$_2$, MgBr$_2$, CaBr$_2$, SrBr$_2$, BaBr$_2$, BeI$_2$, MgI$_2$, CaI$_2$, SrI$_2$, and BaI$_2$.

Examples of the transition metal halide may include titanium halide (for example, TiF$_4$, TiCl$_4$, TiBr$_4$, TiI$_4$, etc.), zirconium halide (for example, ZrF$_4$, ZrCl$_4$, ZrBr$_4$, ZrI$_4$, etc.), hafnium halide (for example, HfF$_4$, HfCl$_4$, HfBr$_4$, HfI$_4$, etc.), vanadium halide (for example, VF$_3$, VCl$_3$, VBr$_3$, VI$_3$, etc.), niobium halide (for example, NbF$_3$, NbCl$_3$, NbBr$_3$, NbI$_3$, etc.), tantalum halide (for example, TaF$_3$, TaCl$_3$, TaBr$_3$, TaI$_3$, etc.), chromium halide (for example, CrF$_3$, CrCl$_3$, CrBr$_3$, CrI$_3$, etc.), molybdenum halide (for example, MoF$_3$, MoCl$_3$, MoBr$_3$, MoI$_3$, etc.), tungsten halide (for example, WF$_3$, WCl$_3$, WBr$_3$, WI$_3$, etc.), manganese halide (for example, MnF$_2$, MnCl$_2$, MnBr$_2$, MnI$_2$, etc.), technetium halide (for example, TcF$_2$, TcCl$_2$, TcBr$_2$, TcI$_2$, etc.), rhenium halide (for example, ReF$_2$, ReCl$_2$, ReBr$_2$, ReI$_2$, etc.), iron halide (for example, FeF$_2$, FeCl$_2$, FeBr$_2$, FeI$_2$, etc.), ruthenium halide (for example, RuF$_2$, RuCl$_2$, RuBr$_2$, RuI$_2$, etc.), osmium halide (for example, OsF$_2$, OsCl$_2$, OsBr$_2$, OsI$_2$, etc.), cobalt halide (for example, CoF$_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include zinc halide (for example, $ZnF_2$, $ZnCl_2$, ZnBr2, $ZnI_2$, etc.), indium halide (for example, $InI_3$, etc.), and tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbJ_2$, $YbI_3$, and $SmI_3$.

Examples of the metalloid halide may include antimony halide (for example, $SbCl_5$, etc.).

Examples of the metal telluride may include an alkali metal telluride (for example, $Li_2Te$, a $na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Emission Layer in Interlayer 130]

When the light-emitting device 10 is a full-color light-emitting device, the emission layer may be patterned into a red emission layer, a green emission layer, and/or a blue emission layer, according to a subpixel. In embodiments, the emission layer may have a stacked structure of two or more layers selected from a red emission layer, a green emission layer, and a blue emission layer, in which the two or more layers may contact each other or may be separated from each other. In embodiments, the emission layer may include two or more materials selected from a red light-emitting material, a green light-emitting material, and a blue light-emitting material, in which the two or more materials may be mixed with each other in a single layer to emit white light.

The emission layer may include a host and a dopant. The dopant may include a phosphorescent dopant, a fluorescent dopant, or any combination thereof.

An amount of the dopant in the emission layer may be in a range of about 0.01 parts to about 15 parts by weight based on 100 parts by weight of the host.

In embodiments, the emission layer may include a quantum dot.

The emission layer may include a delayed fluorescence material. The delayed fluorescence material may act as a host or a dopant in the emission layer.

A thickness of the emission layer may be in a range of about 100 Å to about 1,000 Å. For example, the thickness of the emission layer may be in a range of about 200 Å to about 600 Å. When the thickness of the emission layer is within these ranges, excellent light-emission characteristics may be obtained without a substantial increase in driving voltage.

[Host]

The host may include a compound represented by Formula 301:

$$[Ar_{301}]_{xb11}-[(L_{301})_{xb1}-R_{301}]_{xb21} \quad \text{[Formula 301]}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each independently be the same as described in connection with $Q_1$.

In an embodiment, when xb11 in Formula 301 is 2 or more, two or more of $Ar_{301}$(s) may be linked to each other via a single bond.

In embodiments, the host may include a compound represented by Formula 301-1, a compound represented by Formula 301-2, or any combination thereof:

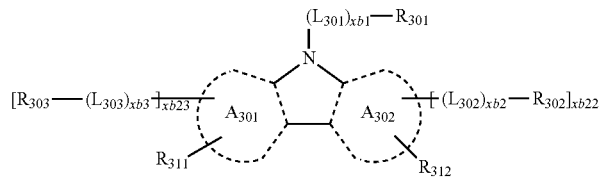

[Formula 301-1]

-continued

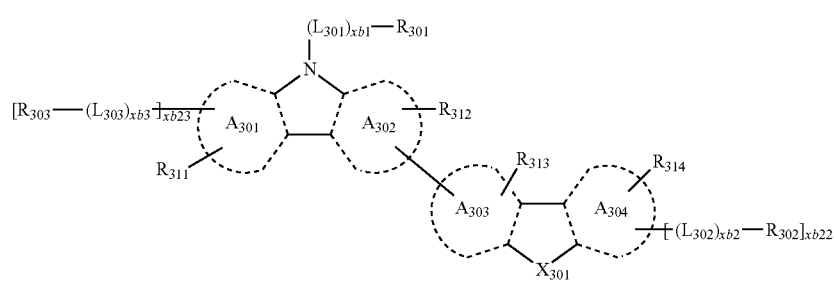

In Formulae 301-1 and 301-2,
ring $A_{301}$ to ring $A_{304}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb11, and $R_{301}$ may each respectively be the same as described in the specification, $L_{302}$ to $L_{304}$ may each independently be the same as described in connection with $L_{301}$, xb2 to xb4 may each independently be the same as described in connection with xb11, and $R_{302}$ to $R_{305}$ and $R_{31}$ to $R_{314}$ may each independently be the same as described in connection with $R_{301}$.

In embodiments, the host may include an alkali earth metal complex, a post-transition metal complex, or any combination thereof. In an embodiment, the host may include a Be complex (for example, Compound H55), a Mg complex, a Zn complex, or any combination thereof.

In embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof:

H1

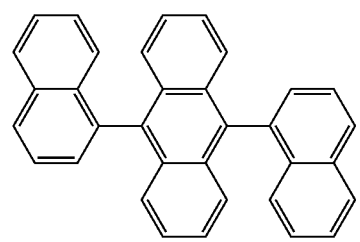

H2

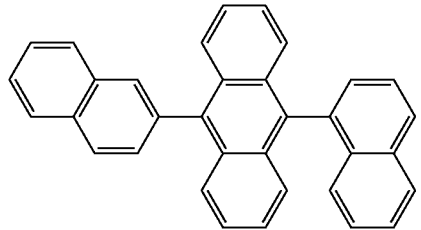

H3

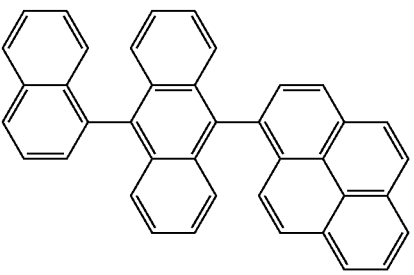

H4

H5

H6

H7

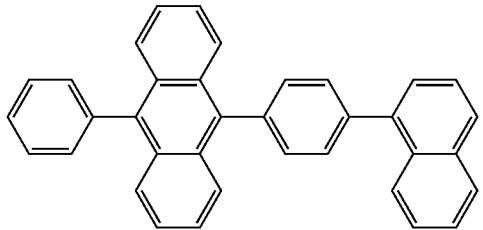

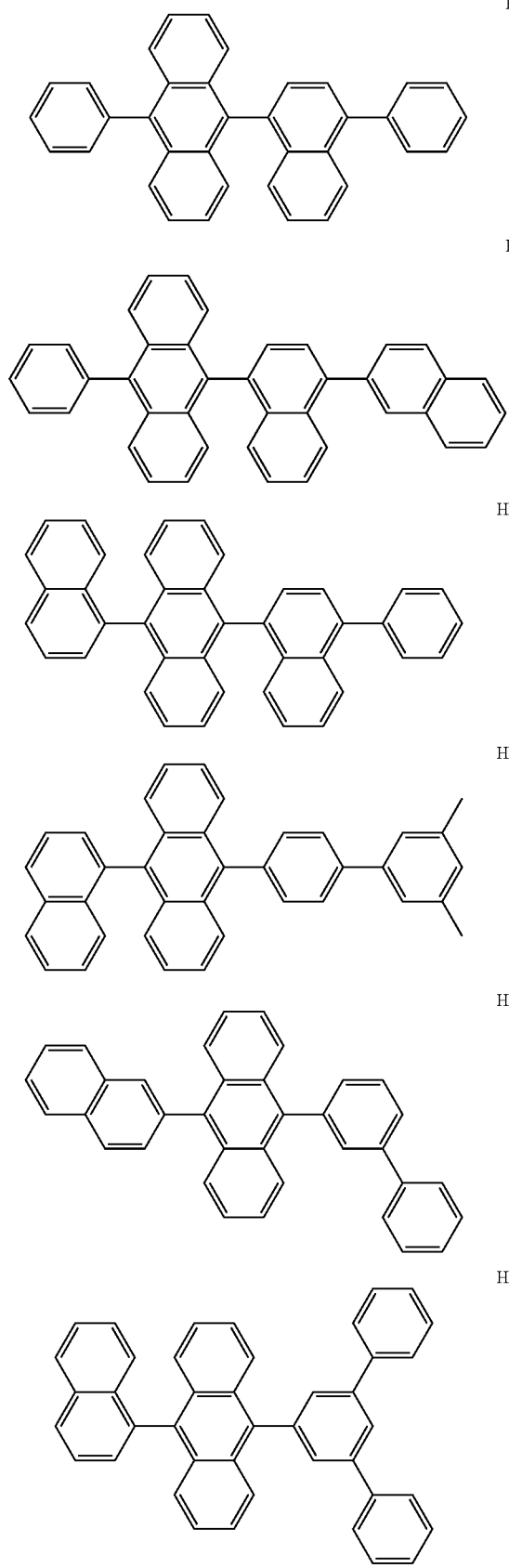
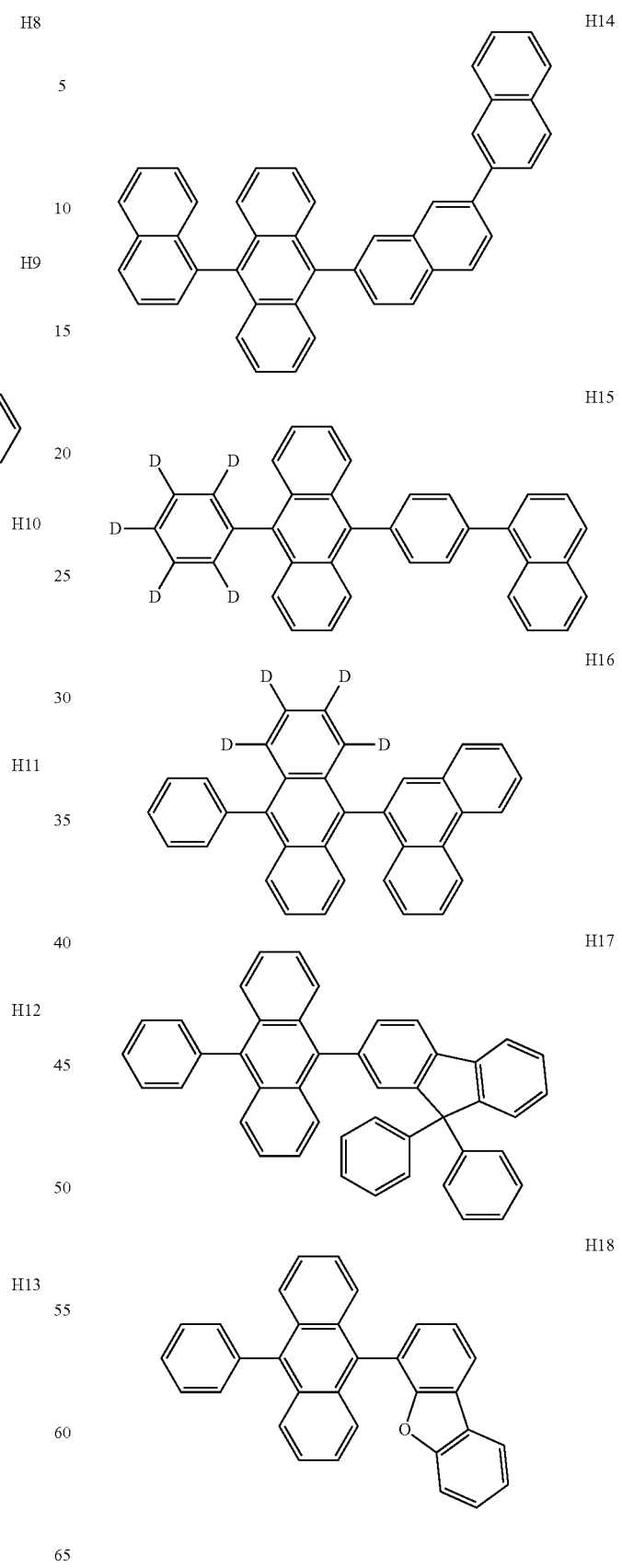

H19
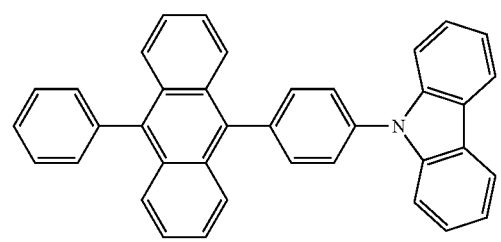
H20
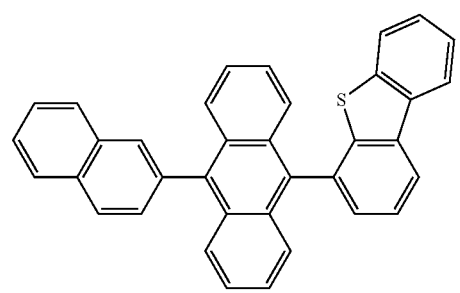
H21
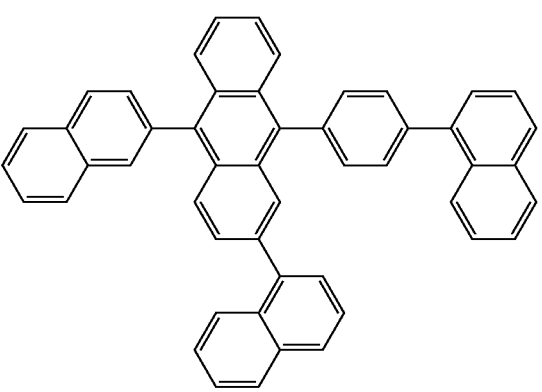
H22
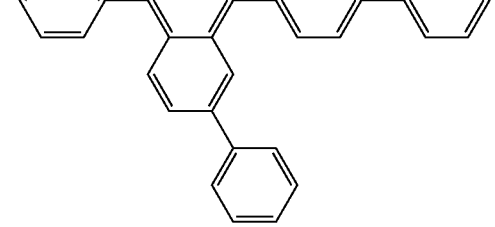
H23
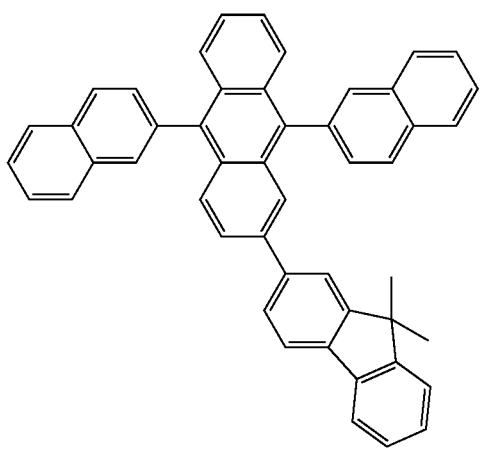
H24
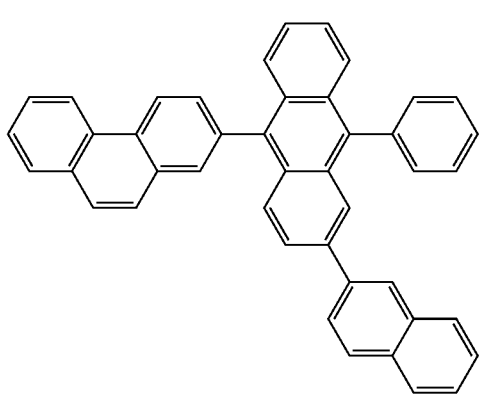
H25
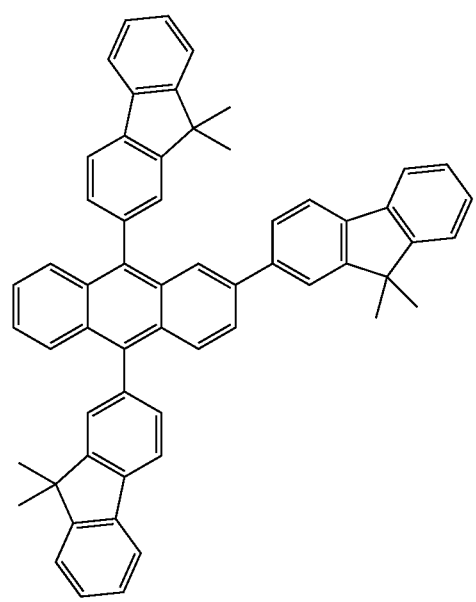

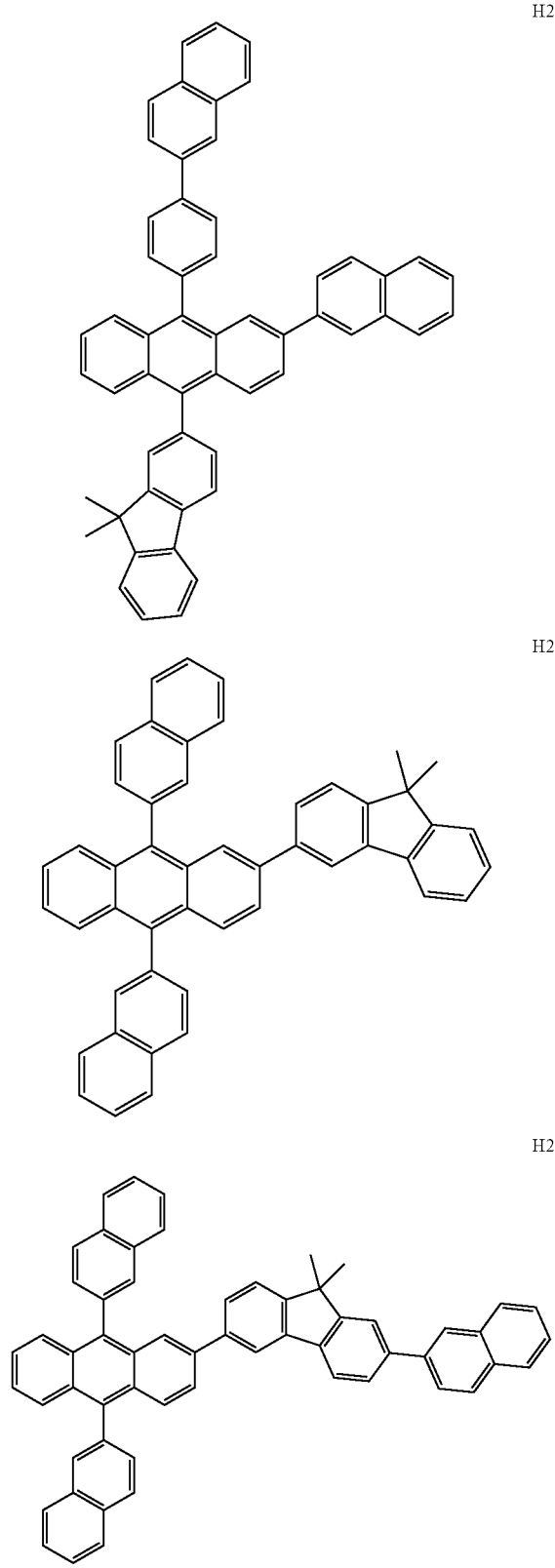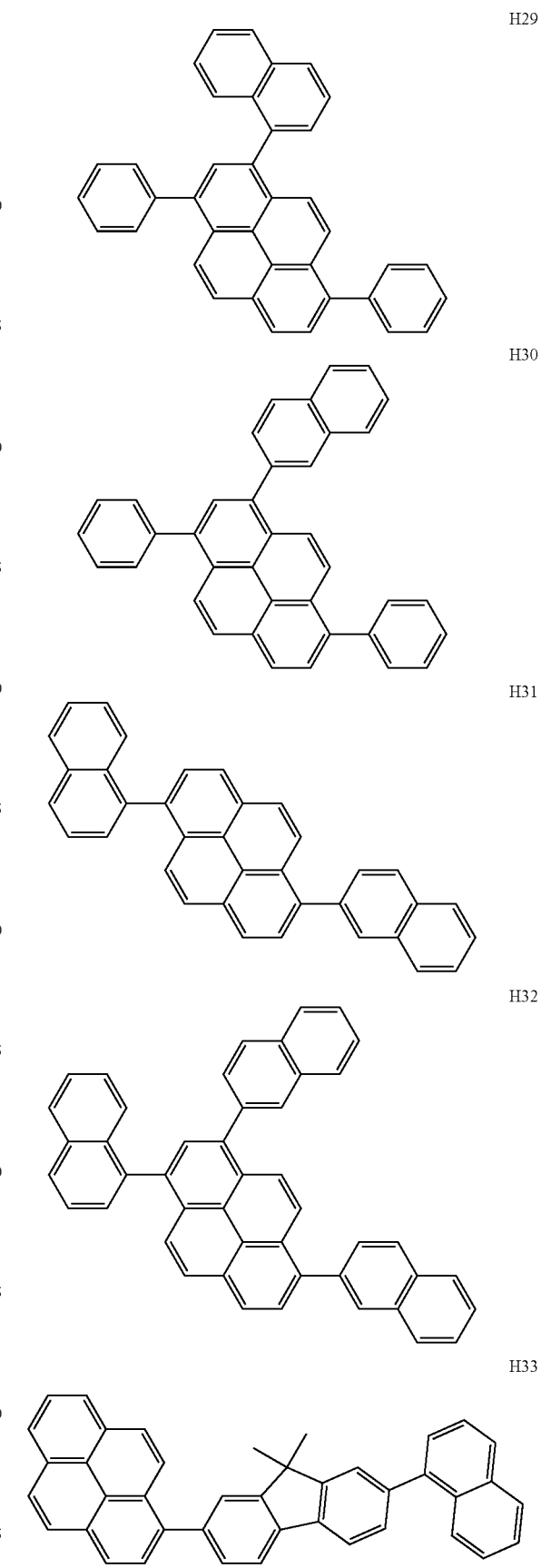

H34
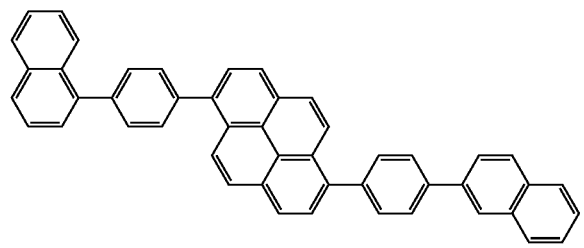
H35
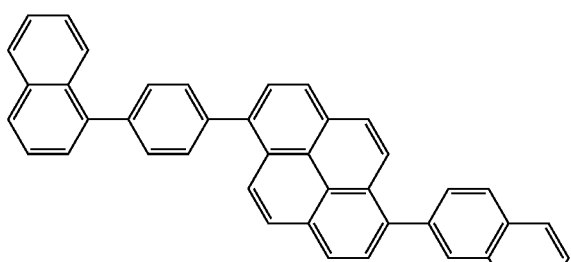
H36
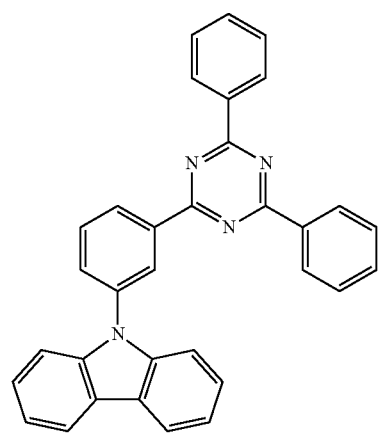
H37
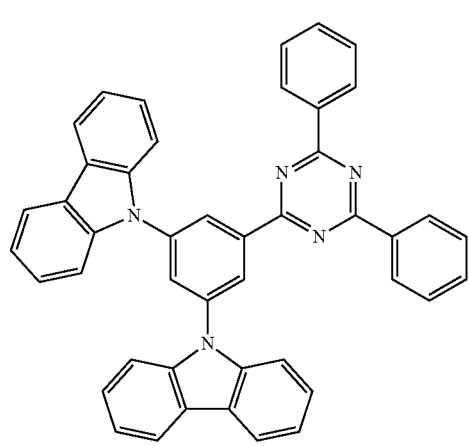
H38
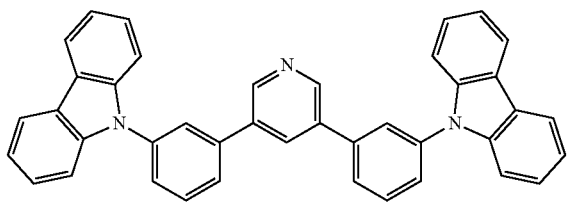
H39
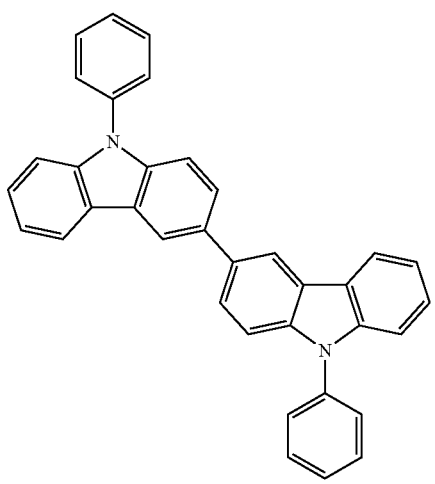
H40
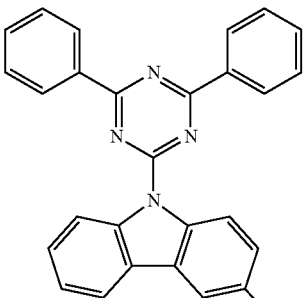

H41
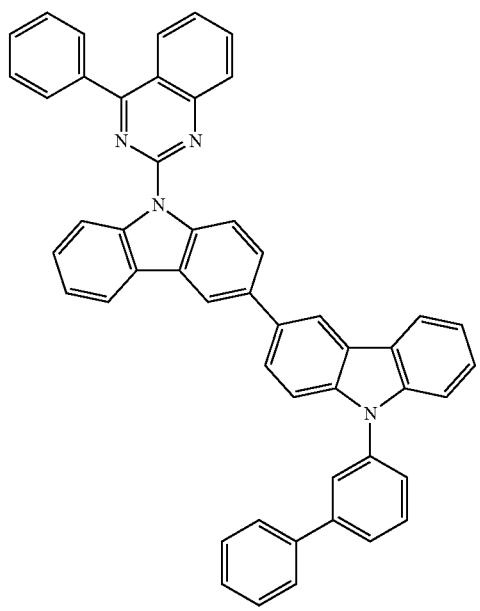
H42
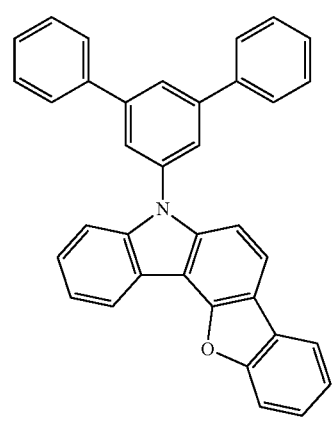
H43
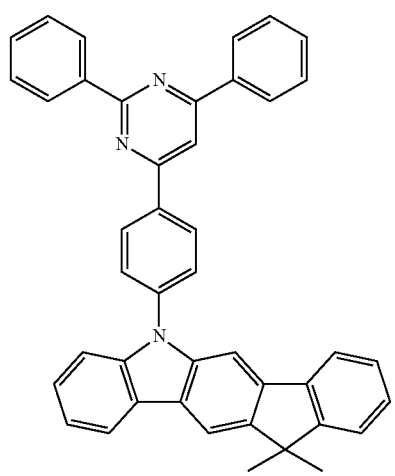
H44
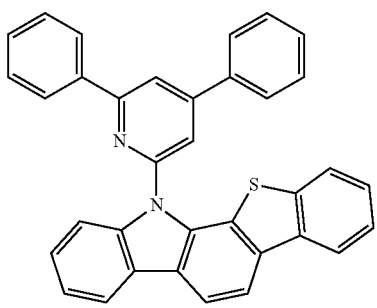
H45
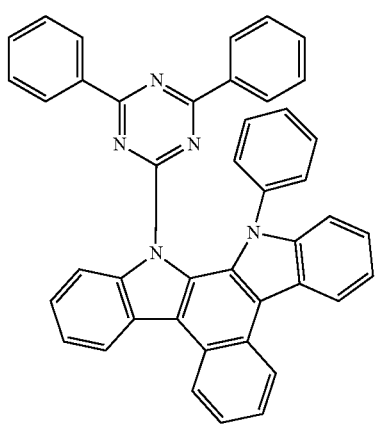
H46
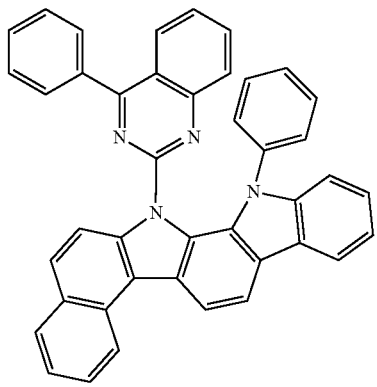
H47
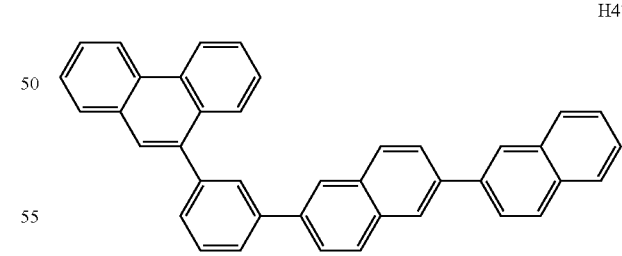
H48
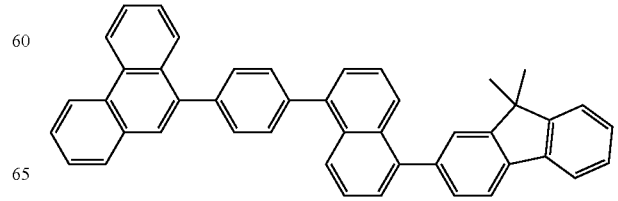

H49
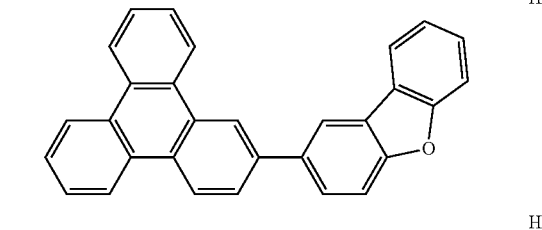
H50
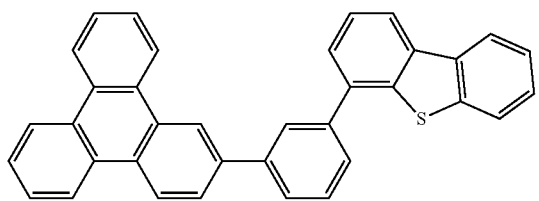
H51
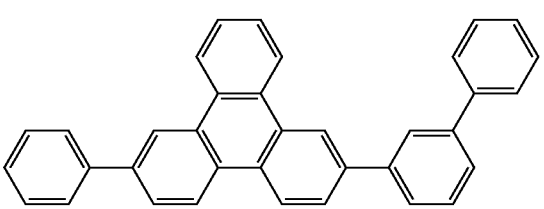
H52
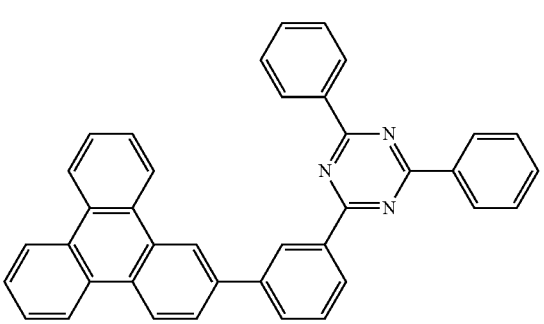
H53
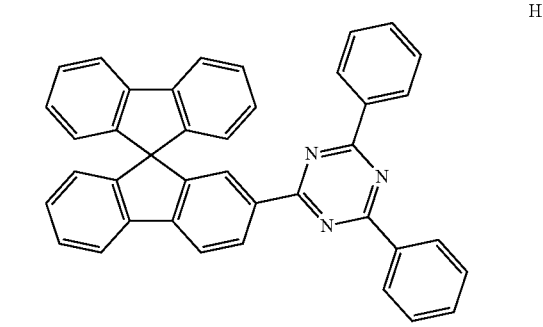
H54
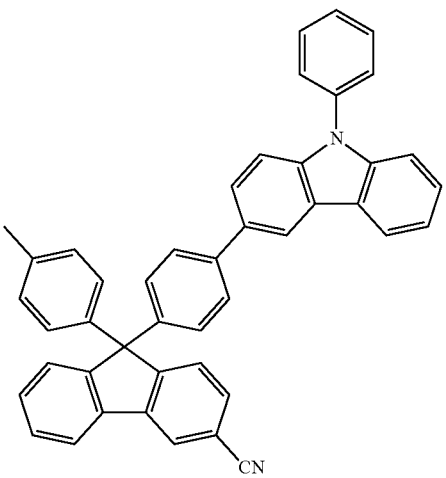
H55
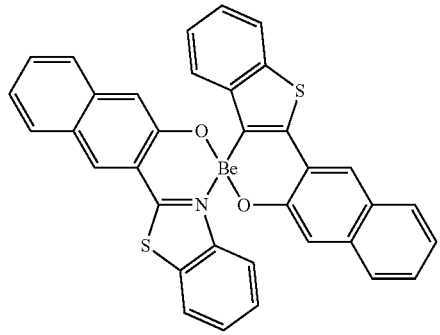
H56
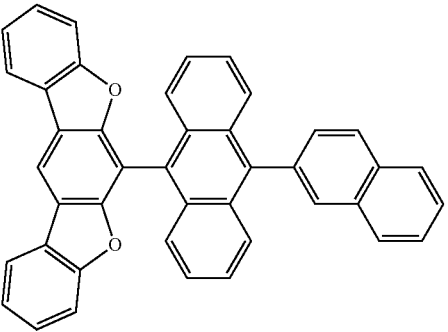
H57
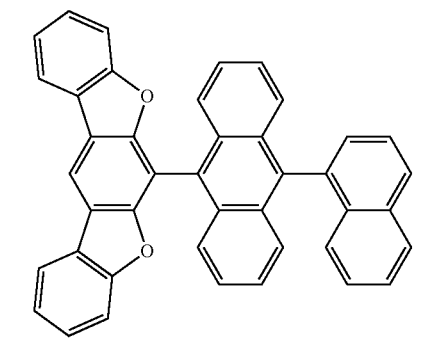

H58
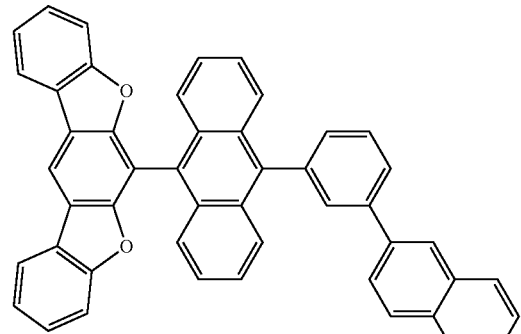
H59
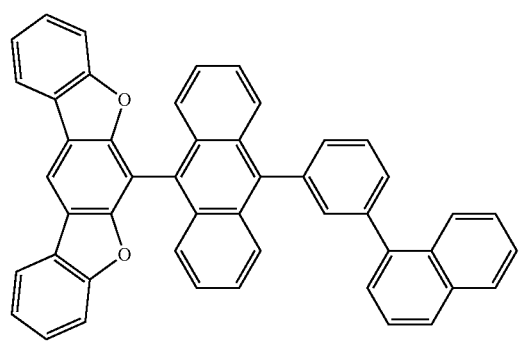
H60
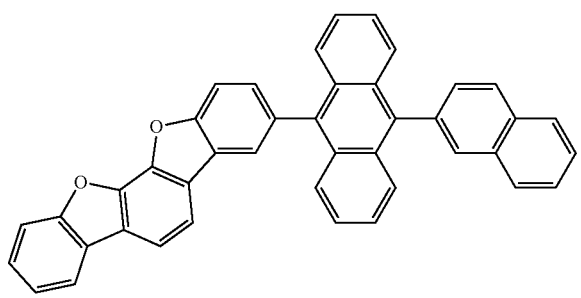
H61
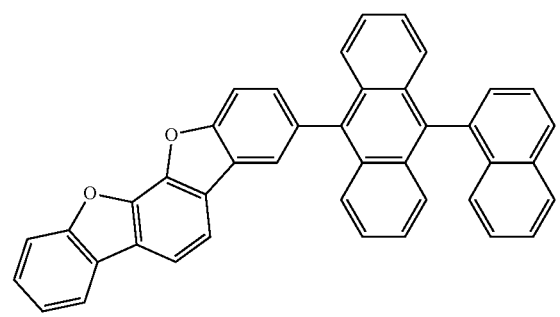
H62
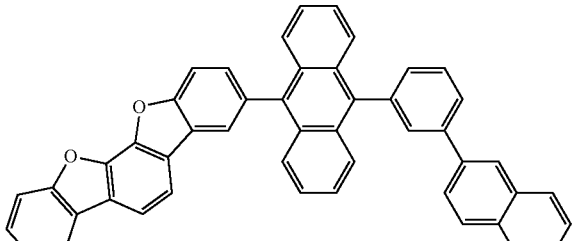
H63
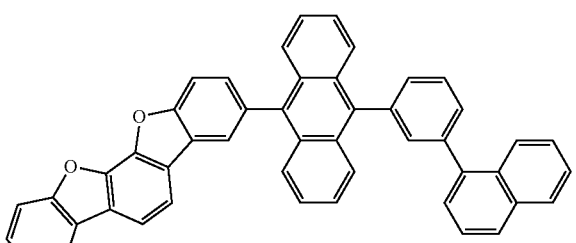
H64
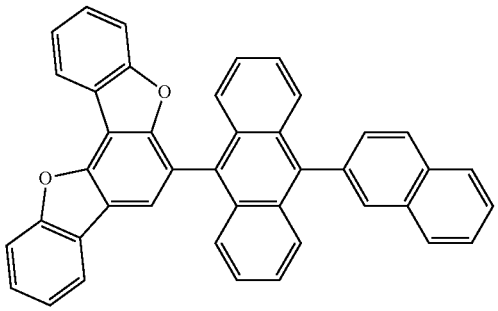
H65
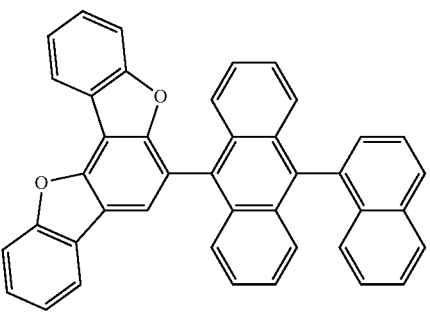
H66
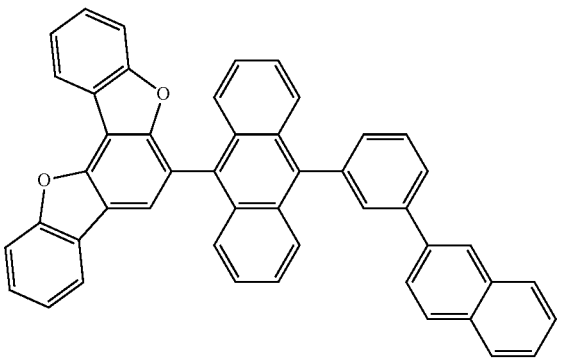

H67
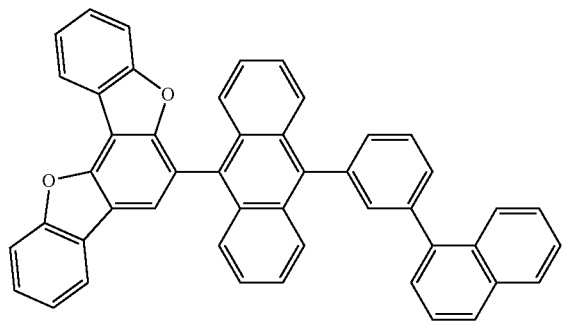
H68
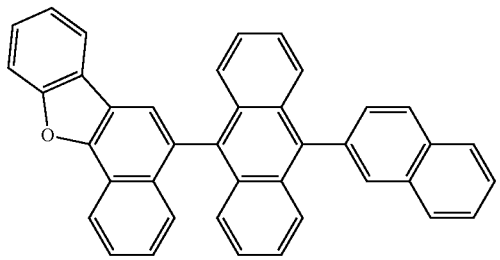
H69
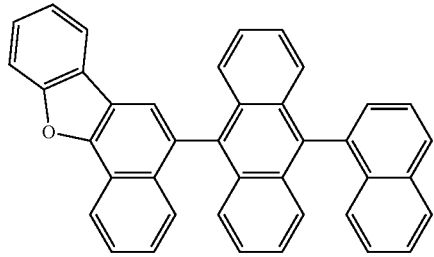
H70
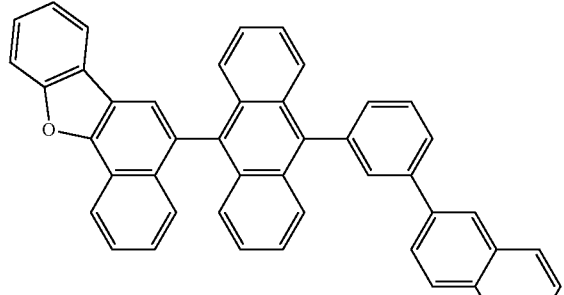
H71
H72
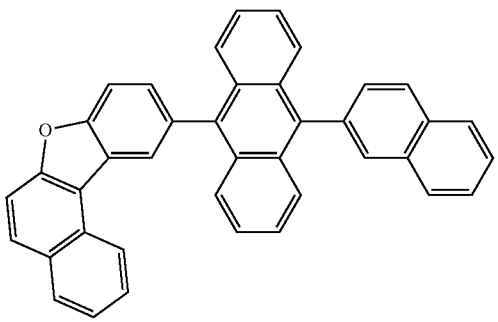
H73
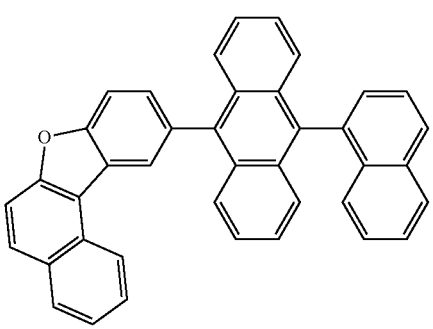
H74
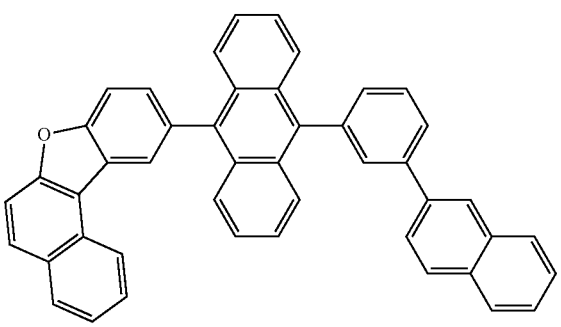
H75
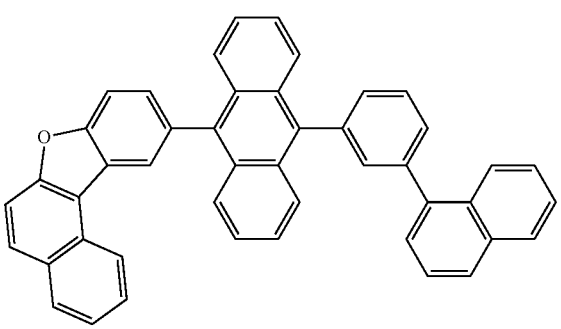
H76
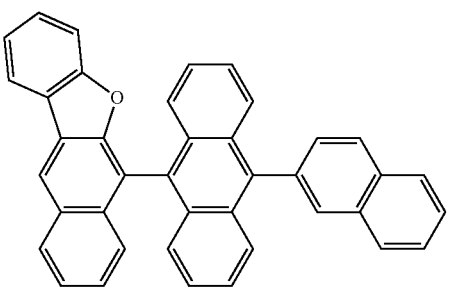

H77
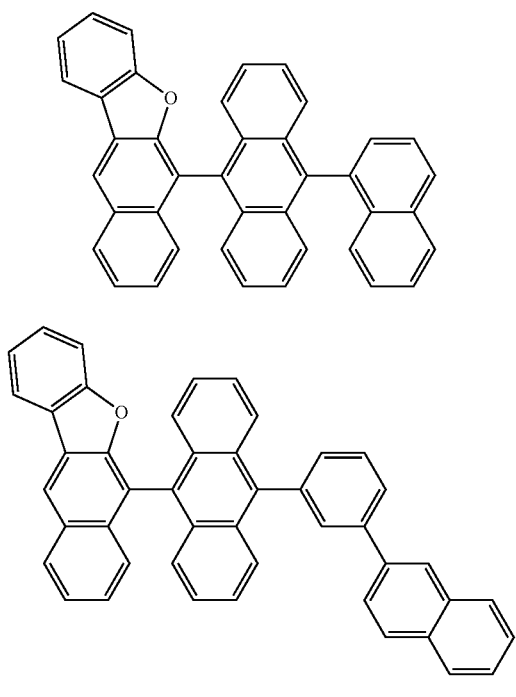
H78
H79
H80
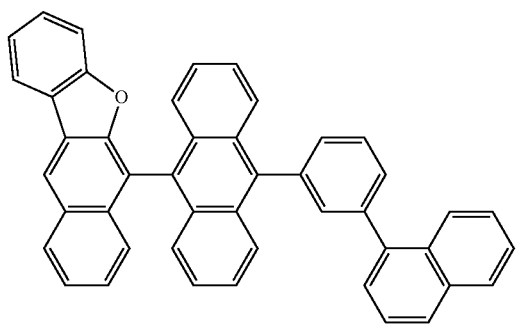
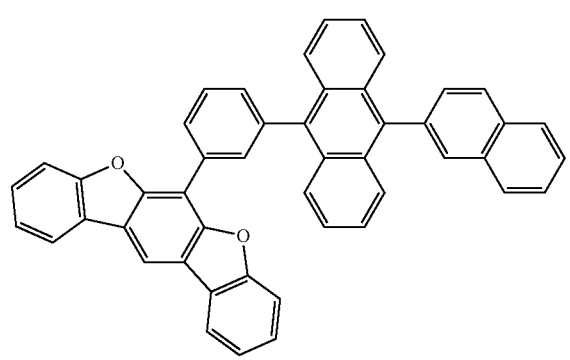
H81
H82
H83
H84
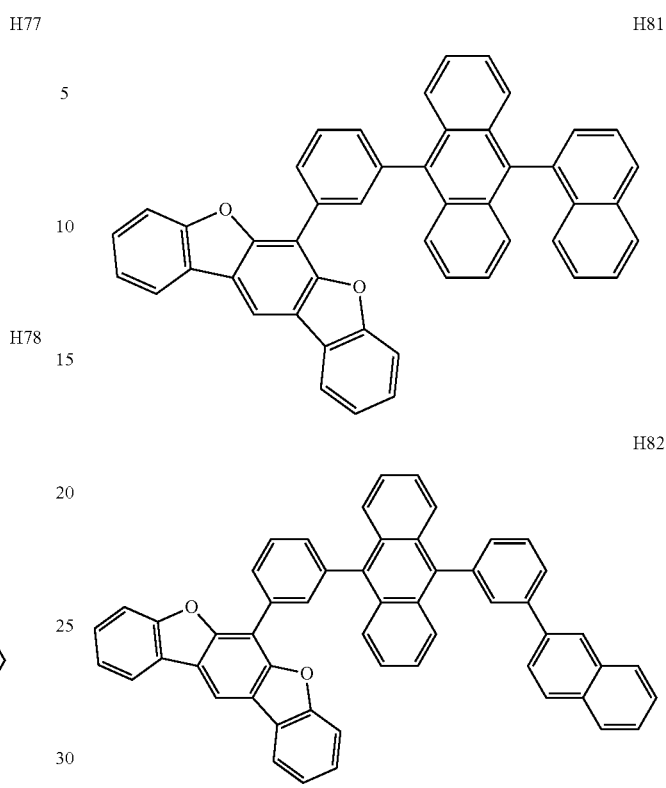

H85
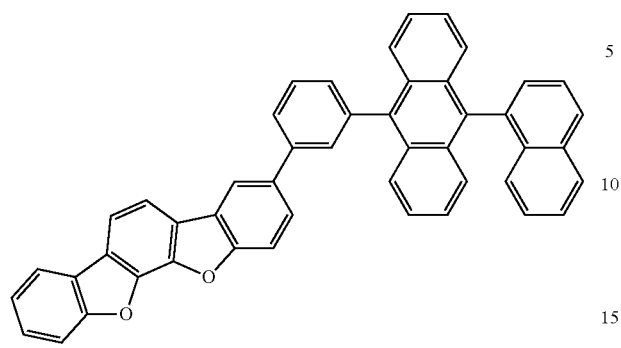
H86
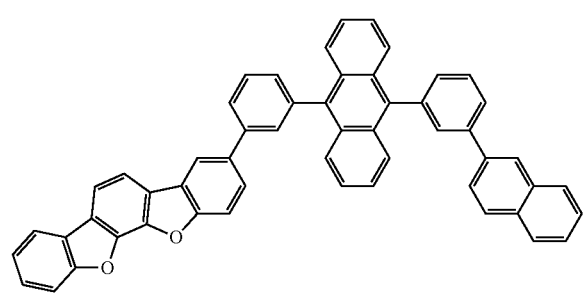
H87
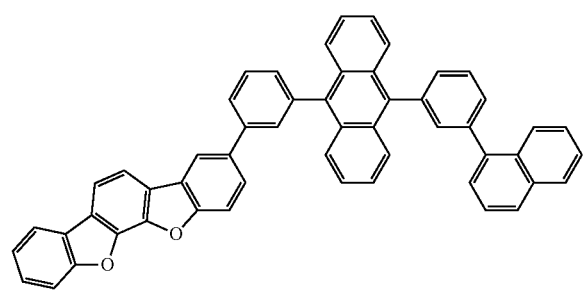
H88
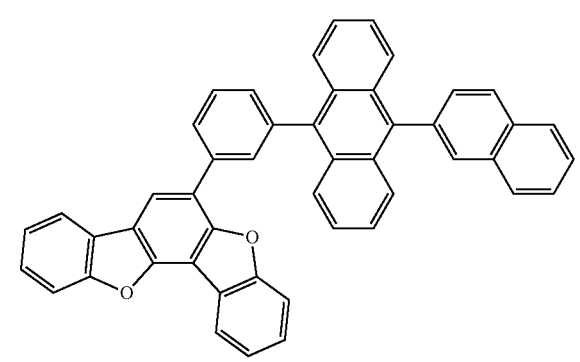
H89
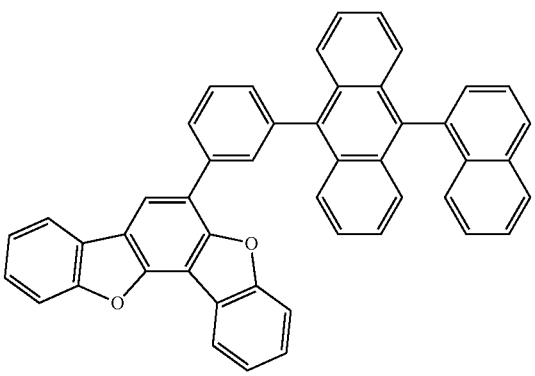
H90
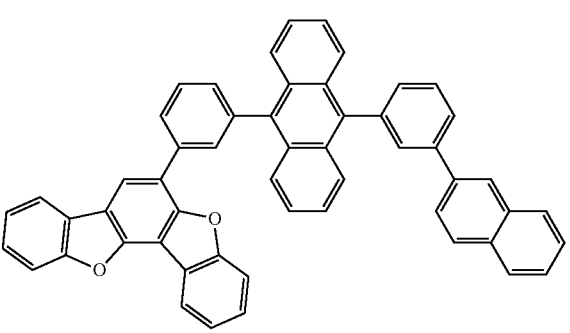
H91
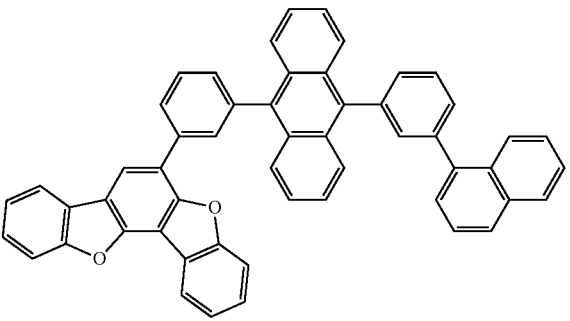
H92
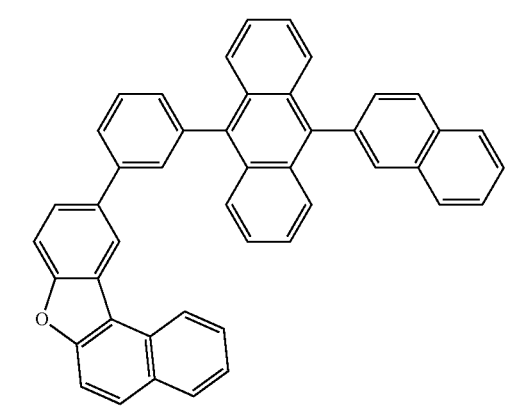

H93
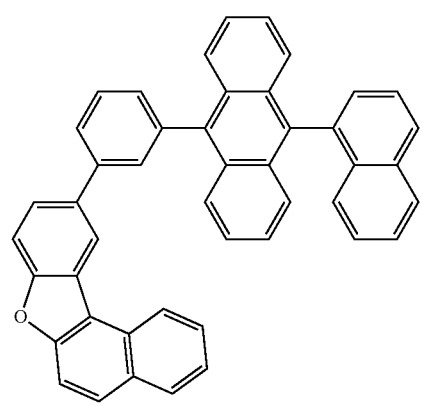
H94
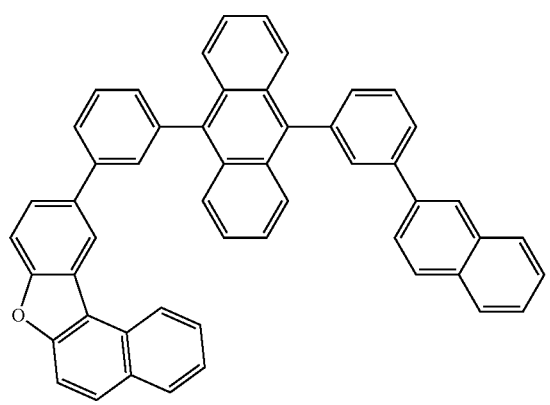
H95
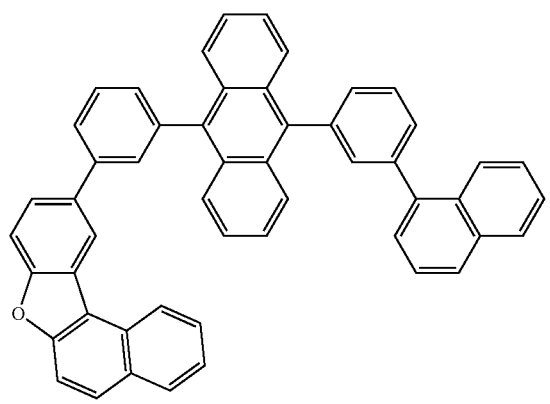
H96
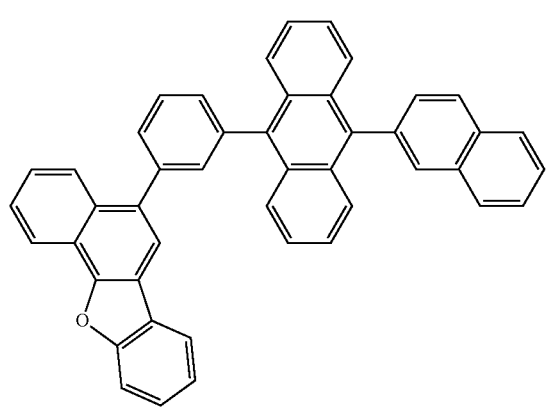
H97
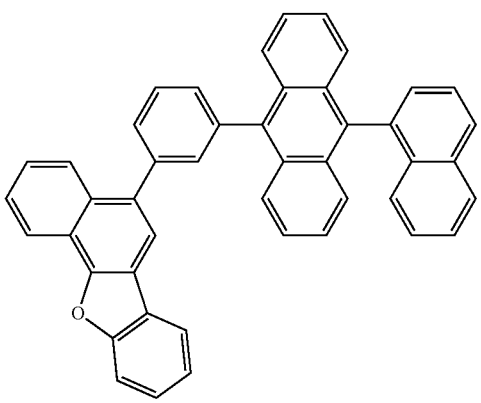
H98
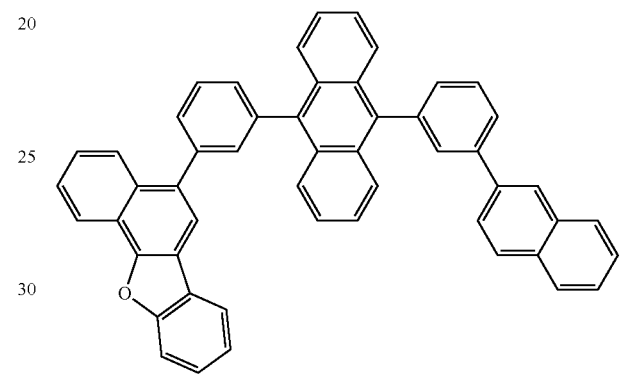
H99
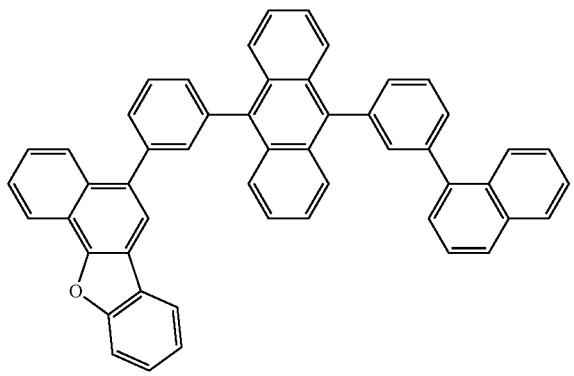
H100
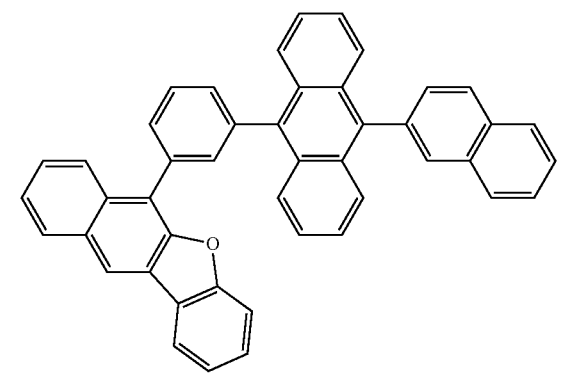

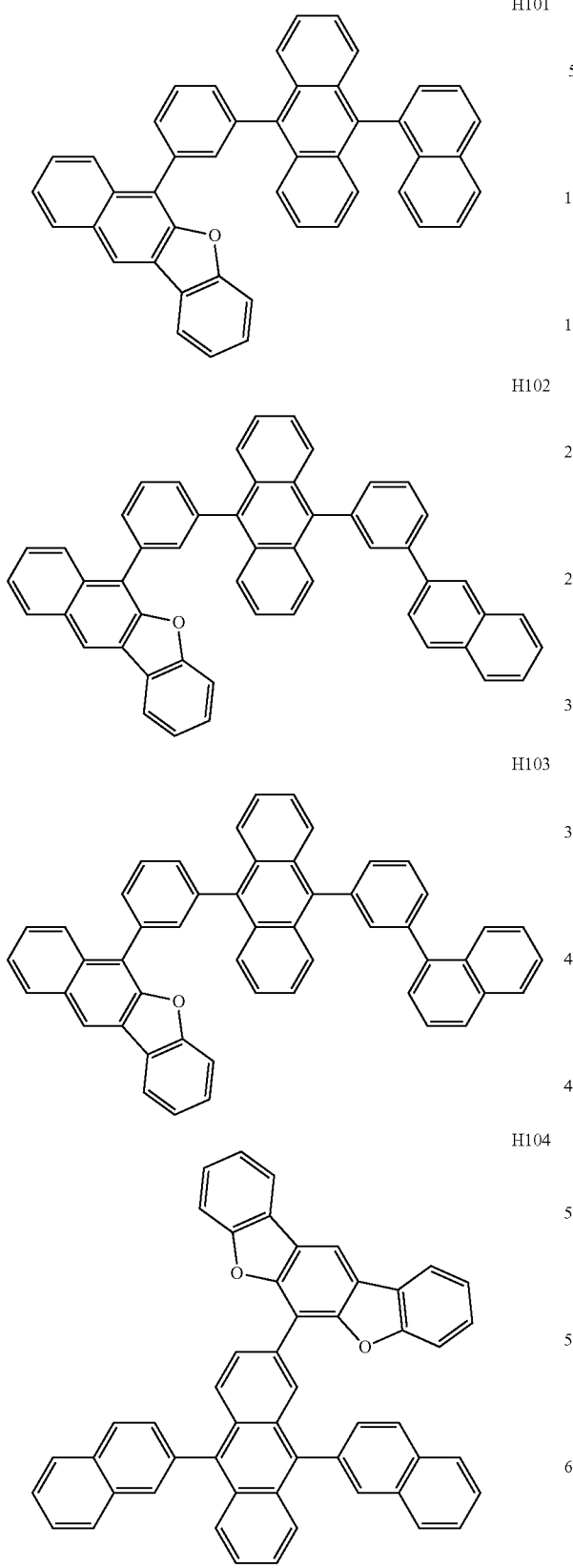
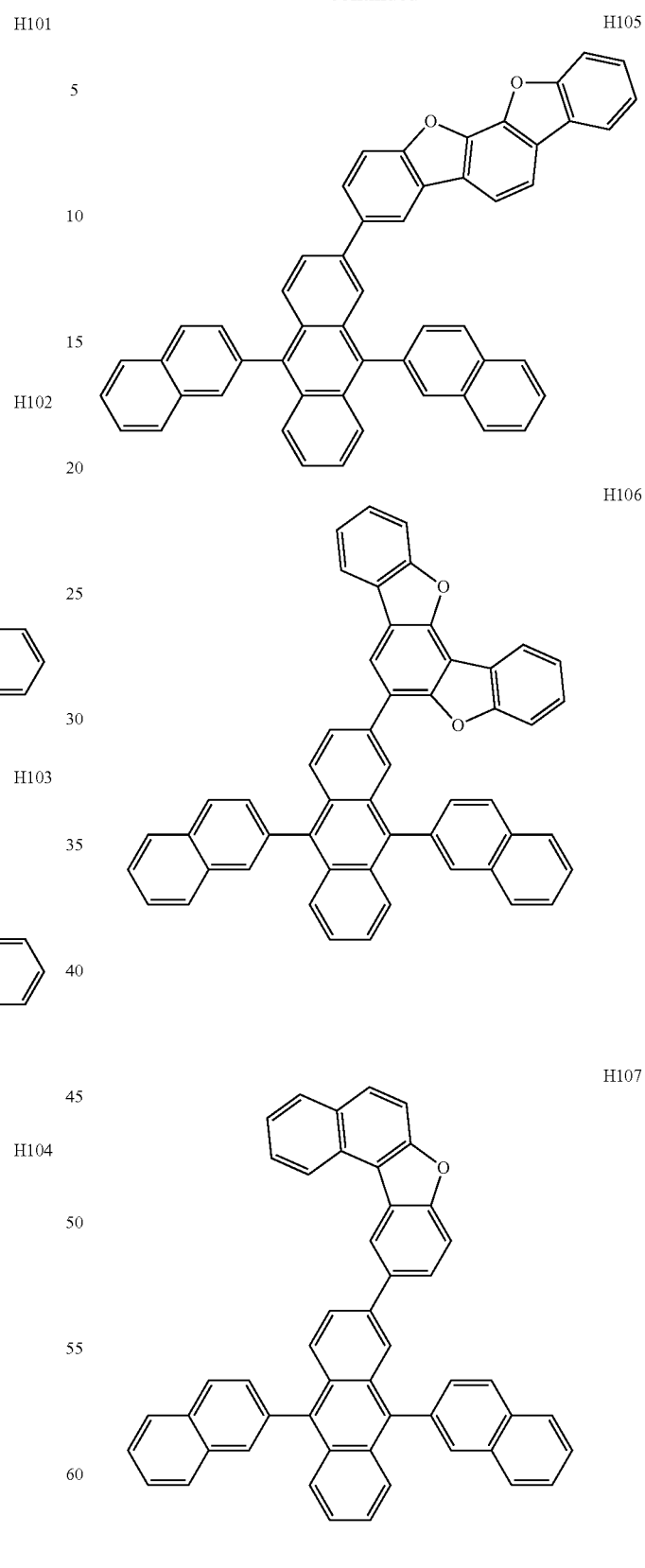

-continued
H108
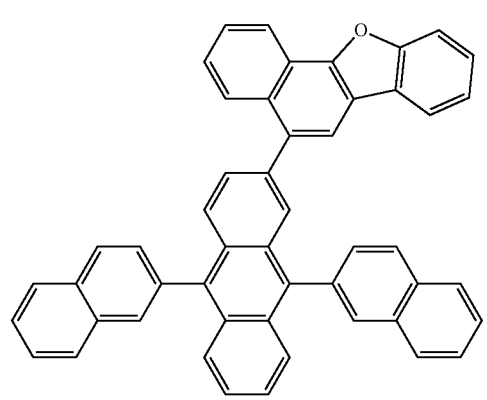
H109
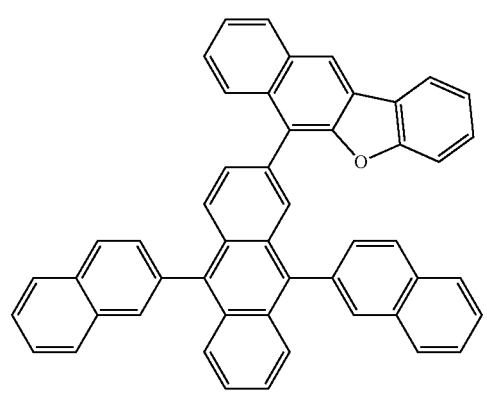
H110
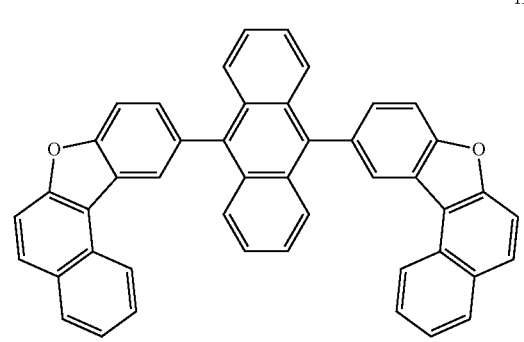
H111
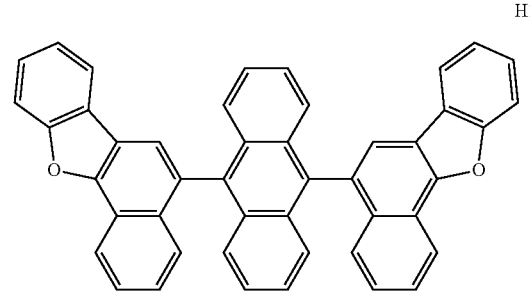
H112
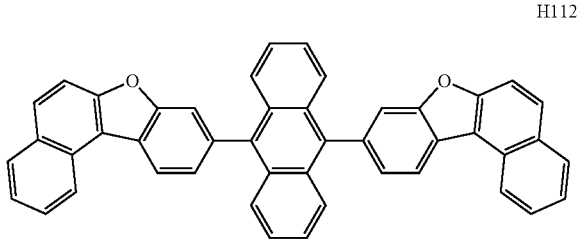
-continued
H113
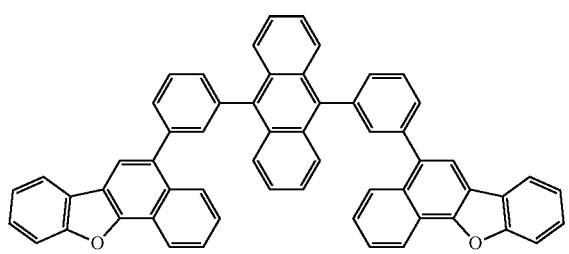
H114
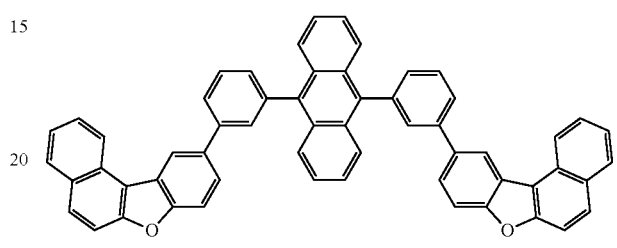
H115
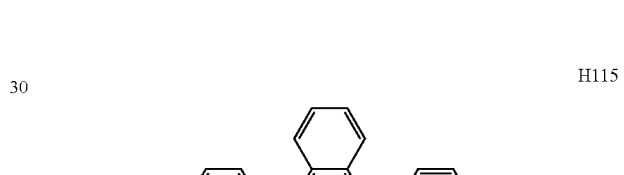
H116
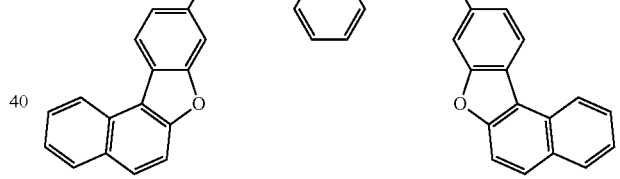

H117
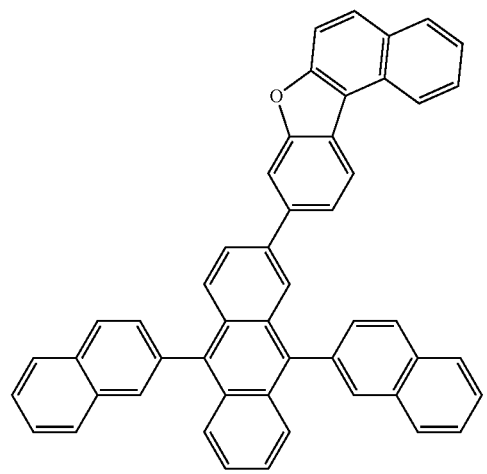
H118
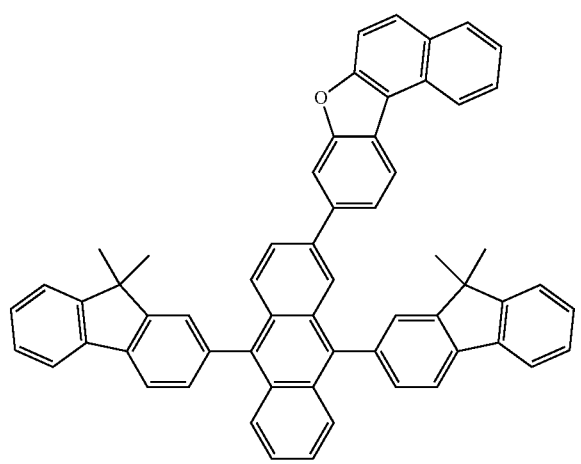
H119
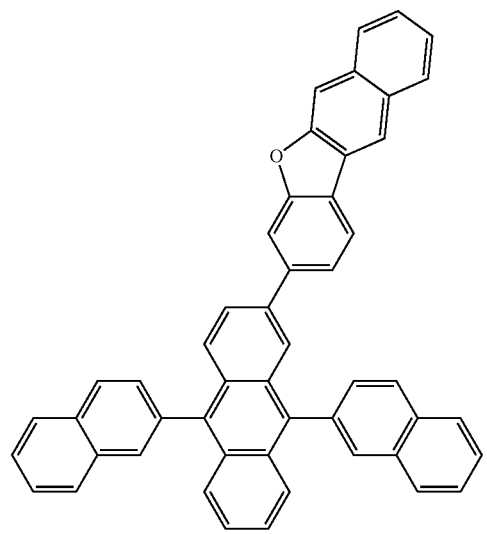
H120
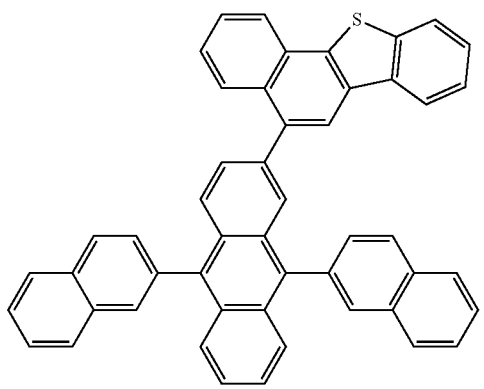
H121
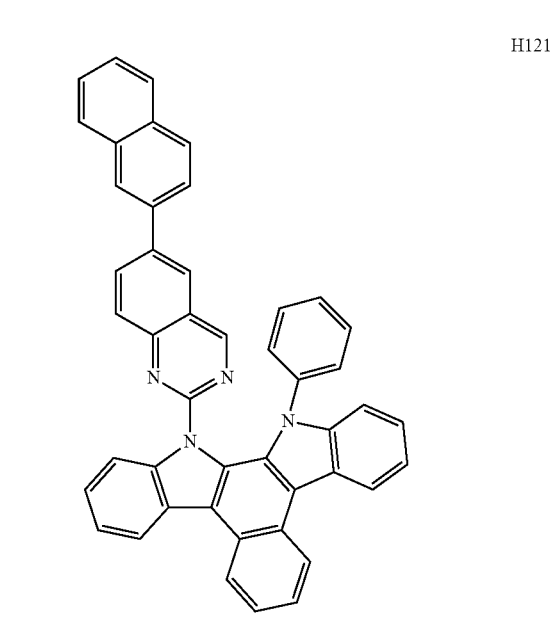
H122
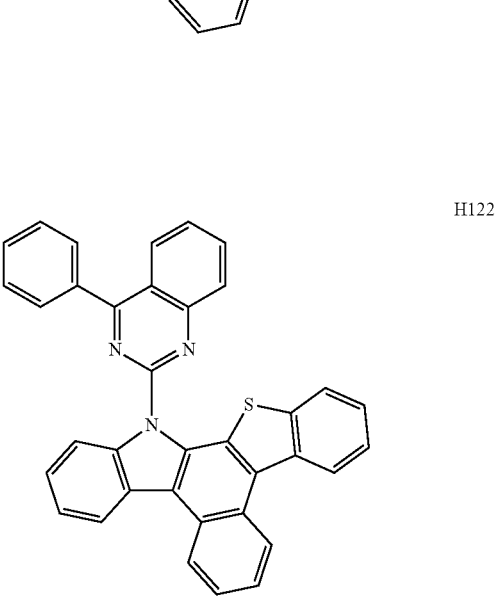

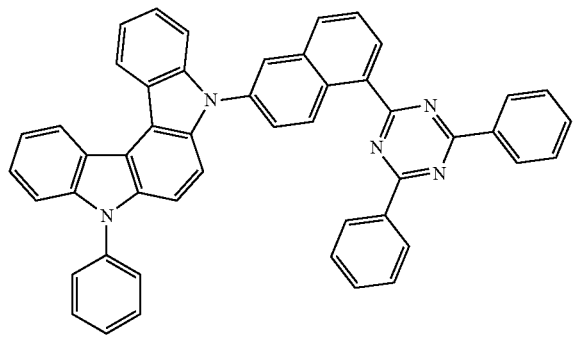

H123

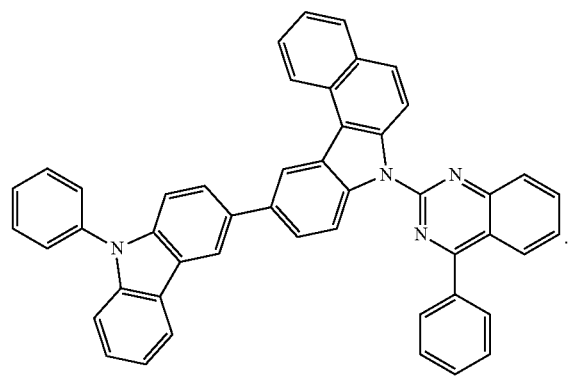

H124

[Phosphorescent Dopant]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

$$M(L_{401})_{xc1}(L_{402})_{xc2}$$ [Formula 401]

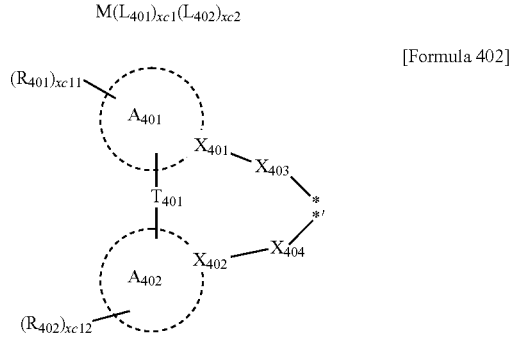 [Formula 402]

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is 2 or more, two or more of $L_{401}$(s) may be identical to or different from each other, $L_{402}$ may be an organic ligand, and xc2 may be 0, 1, 2, 3, or 4, wherein when xc2 is 2 or more, two or more of $L_{402}$(s) may be identical to or different from each other, $X_{401}$ and $X_{402}$ may each independently be nitrogen (N) or carbon (C), ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{41}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

In an embodiment, in Formula 402, $X_{401}$ may be nitrogen and $X_{402}$ may be carbon, or each of $X_{401}$ and $X_{402}$ may be nitrogen.

In embodiments, when xc1 in Formula 401 is 2 or more, two ring $A_{401}$(s) in two or more of $L_{401}$(s) may be optionally linked to each other via $T_{402}$, which is a linking group, and two ring $A_{402}$(s) may be optionally linked to each other via $T_{403}$, which is a linking group (see Compounds PD1 to PD4 and PD7). $T_{402}$ and $T_{403}$ may each independent be the same as described in connection with $T_{401}$.

$L_{402}$ in Formula 401 may be an organic ligand. In an embodiment, $L_{402}$ may include a halogen group, a diketone group (for example, an acetylacetonate group), a carboxylic acid group (for example, a picolinate group), —C(=O), an isonitrile group, —CN, a phosphorus group (for example, a phosphine group, a phosphite group, etc.), or any combination thereof.

The phosphorescent dopant may include, for example, one of Compounds PD1 to PD25, or any combination thereof:

PD1 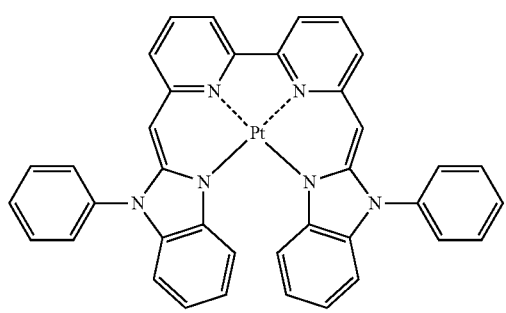
PD2 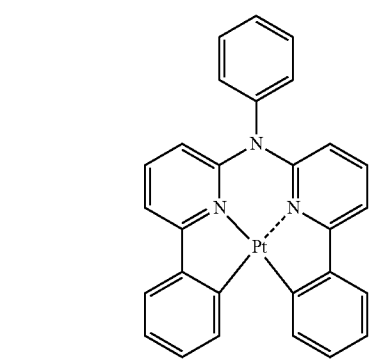
PD3 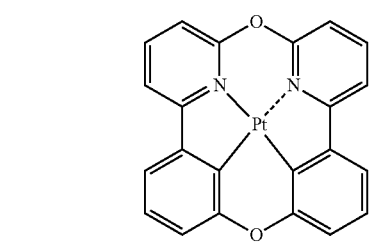
PD4 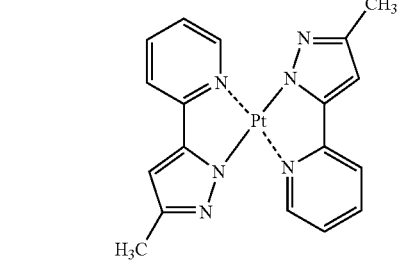
PD5 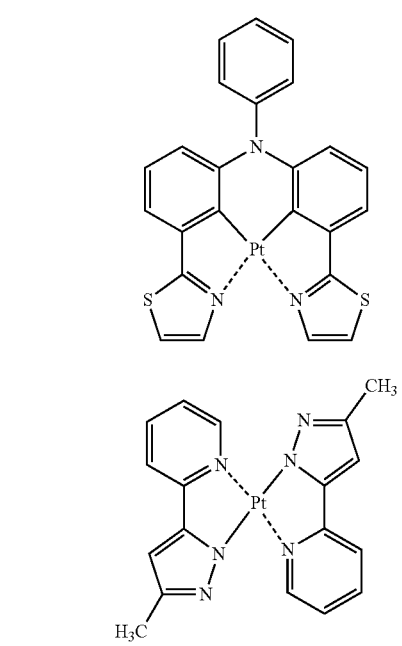
PD6 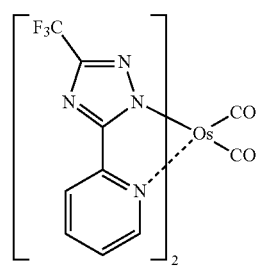
PD7 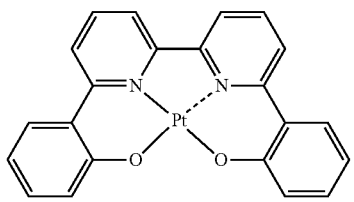
PD8 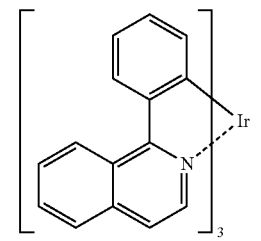
PD9 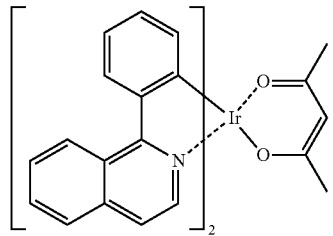
PD10 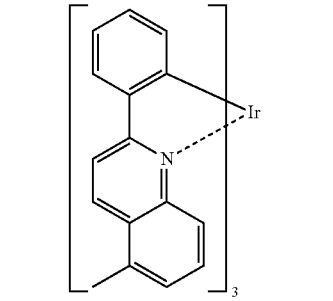
PD11 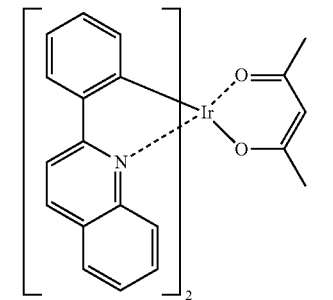

-continued
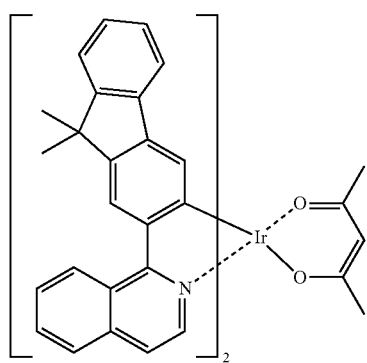
PD12
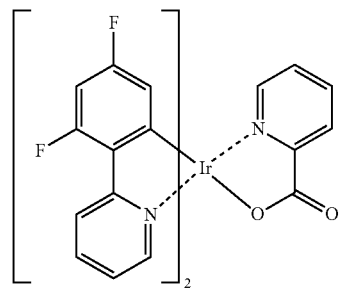
PD17
PD13
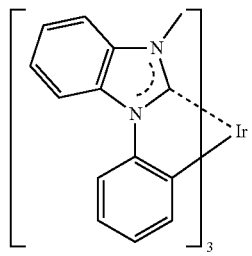
PD18
PD14
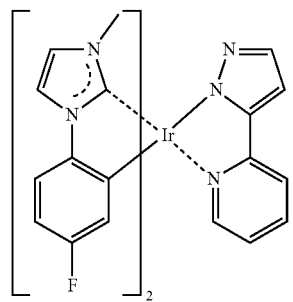
PD19
PD15
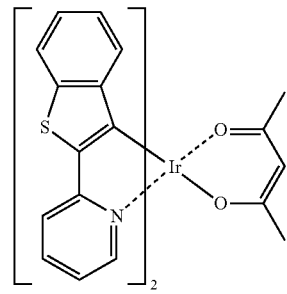
PD20
PD16
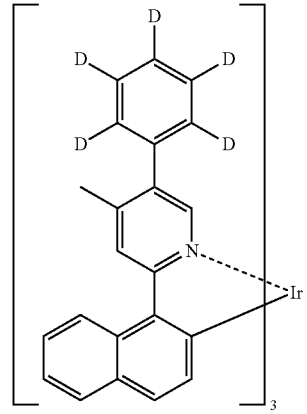
PD21

PD22 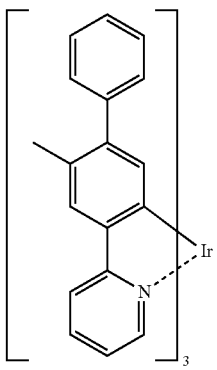

PD23 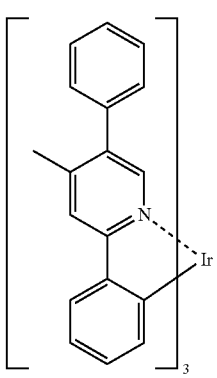

PD24 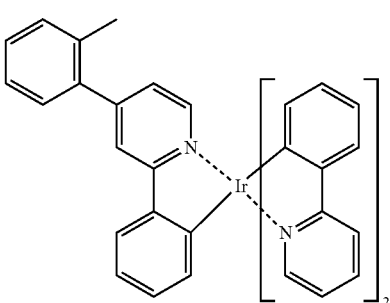

PD25 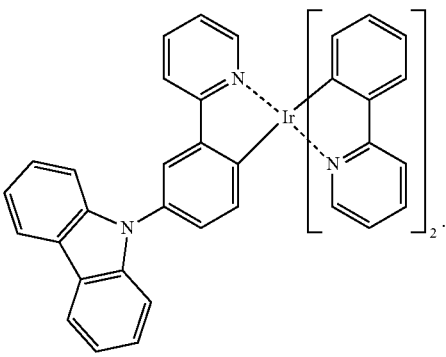

[Fluorescent Dopant]

The fluorescent dopant may include an amine group-containing compound, a styryl group-containing compound, or any combination thereof.

In an embodiment, the fluorescent dopant may include a compound represented by Formula 501:

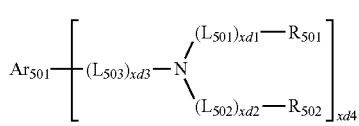

[Formula 501]

In Formula 501,

Ar$_{501}$, L$_{501}$ to L$_{503}$, R$_{501}$, and R$_{502}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, xd1 to xd3 may each independently be 0, 1, 2, or 3, and xd4 may be 1, 2, 3, 4, 5, or 6.

In an embodiment, Ar$_{501}$ in Formula 501 may be a condensed cyclic group (for example, an anthracene group, a chrysene group, or a pyrene group) in which three or more monocyclic groups are condensed together.

In embodiments, xd4 in Formula 501 may be 2.

In an embodiment, the fluorescent dopant may include one of Compounds FD1 to FD36, DPVBi, DPAVBi, or any combination thereof.

91
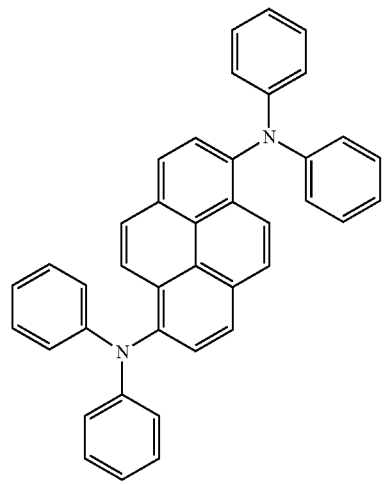
92
FD1
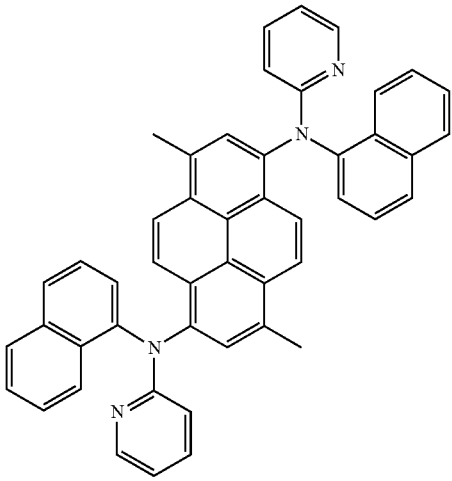
FD2
FD3
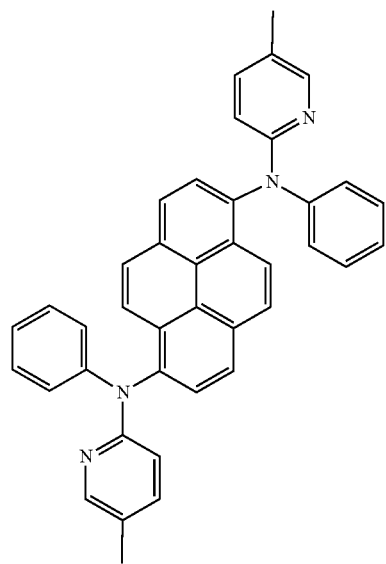
FD4
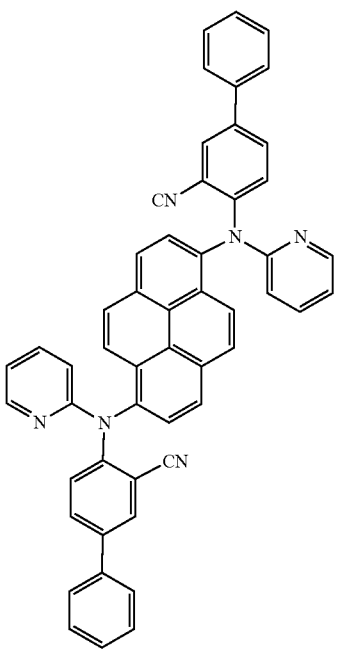
FD5
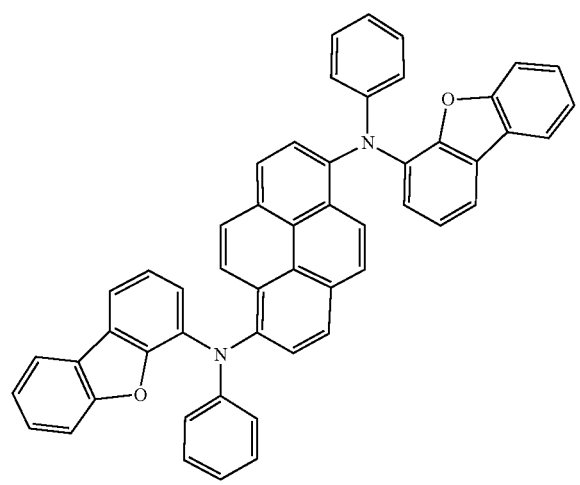
FD6
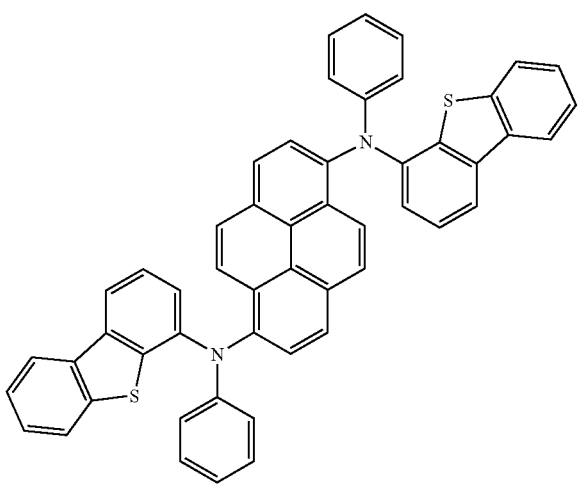

-continued
FD7
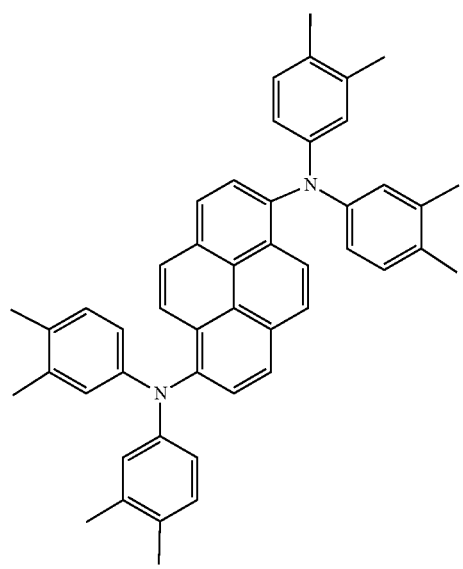
FD8
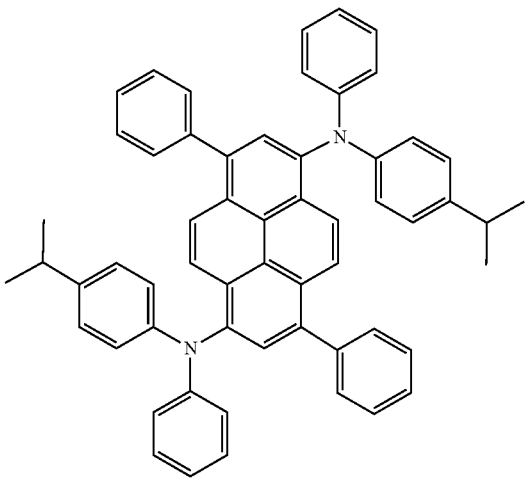
FD9
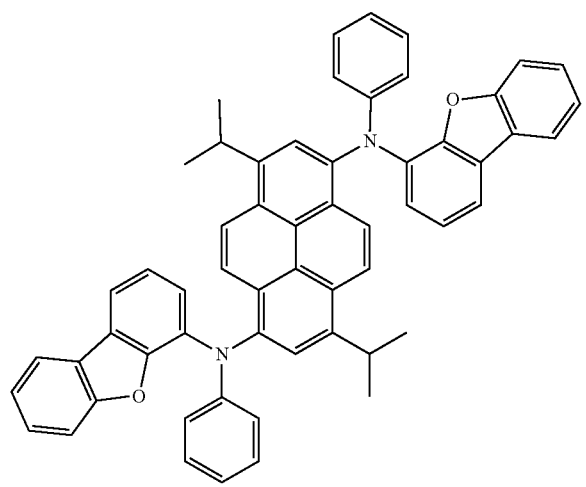
FD10
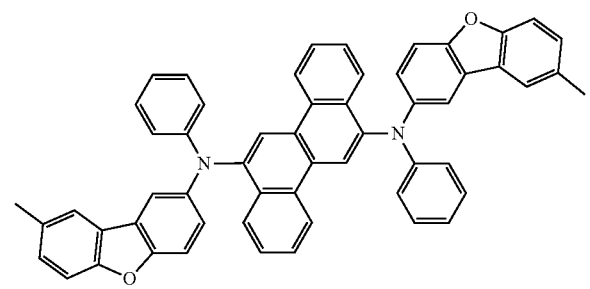
FD11
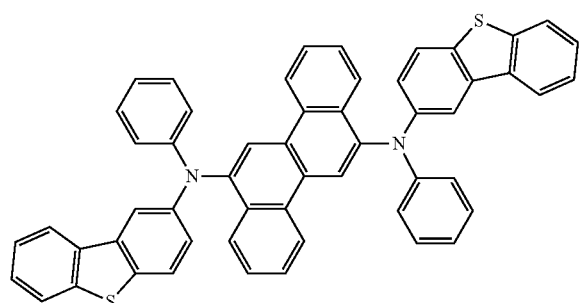
FD12
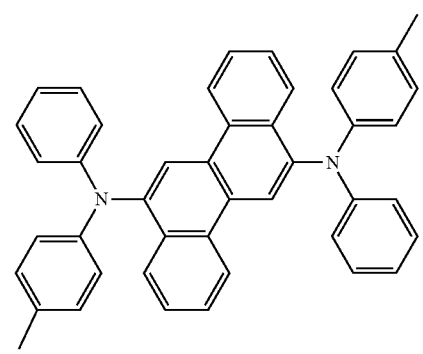

-continued
FD13
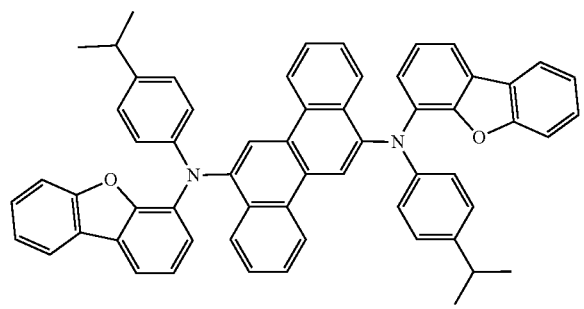
FD14
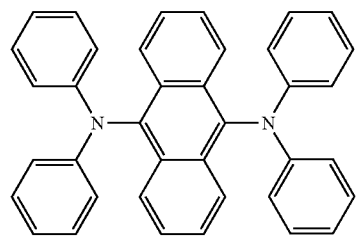
FD15
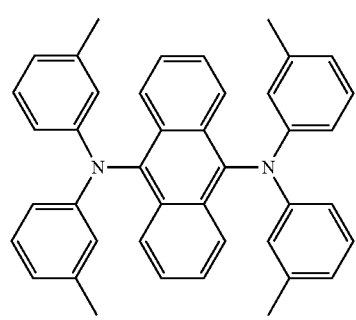
FD16
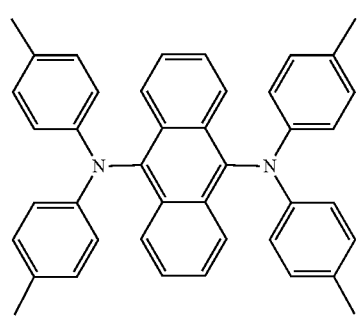
FD17
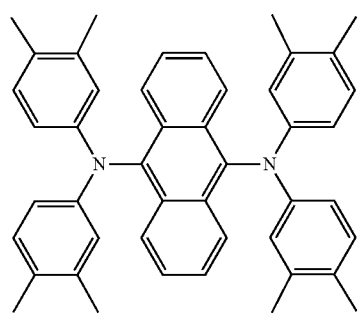
FD18
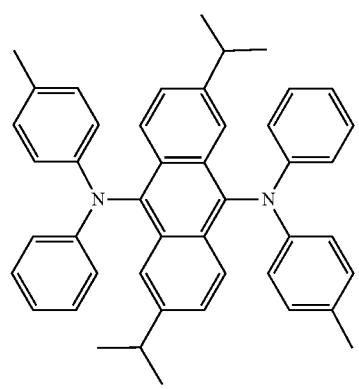
FD19
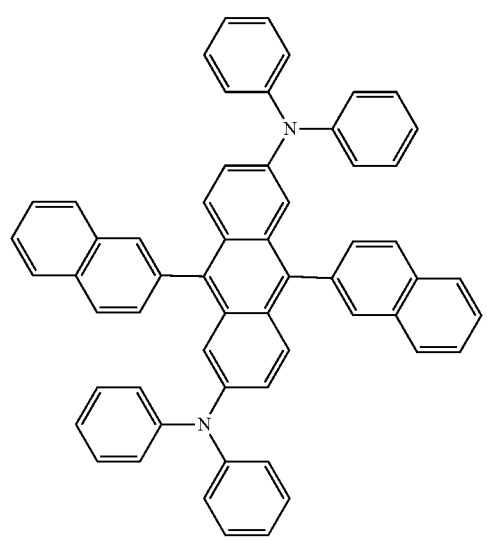
FD20
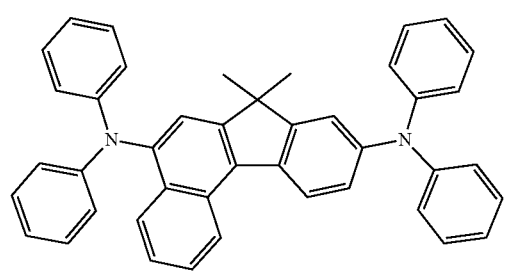

-continued
FD21
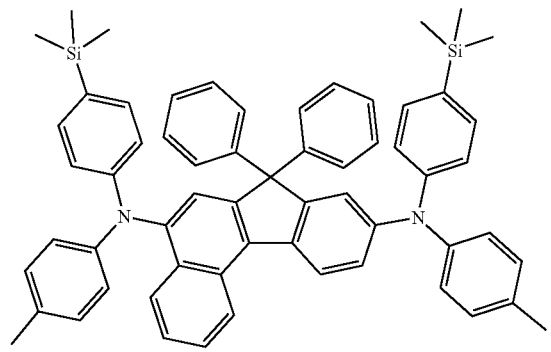
FD22
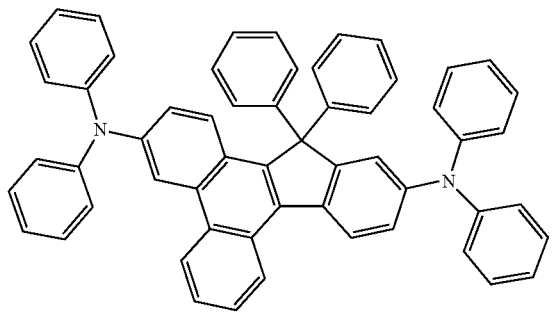
FD23
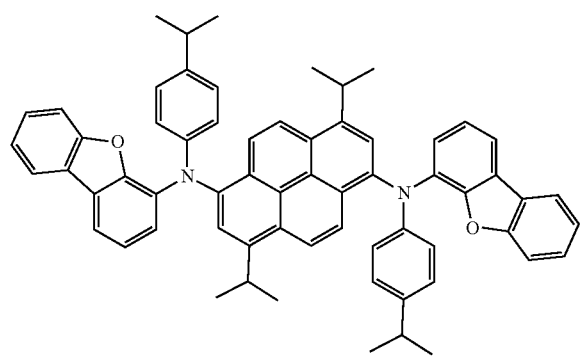
FD24
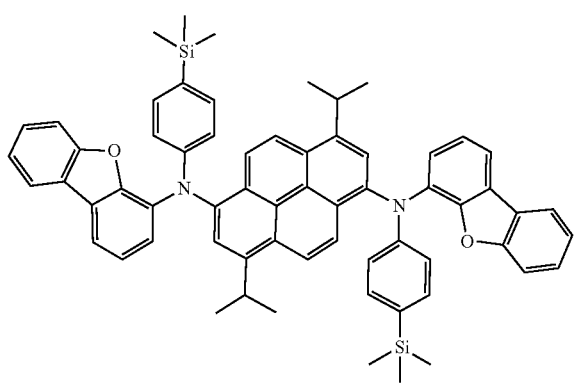
FD25
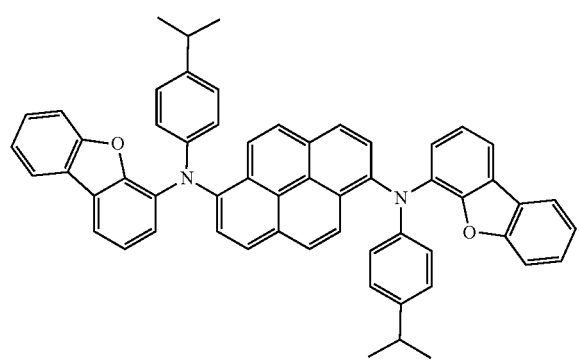
FD26
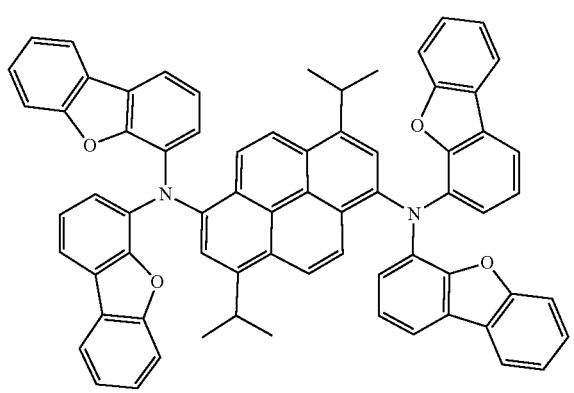
FD27
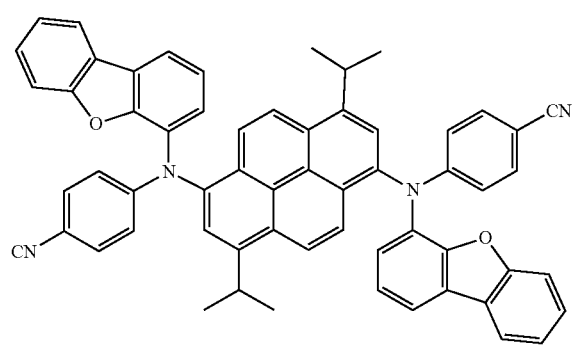
FD28
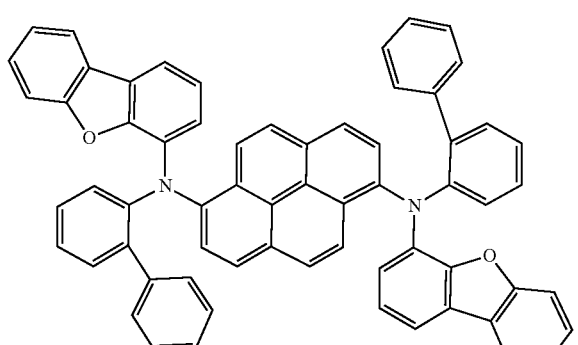

-continued
FD29
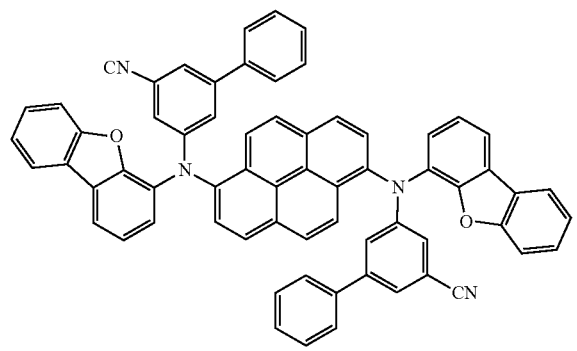
FD30
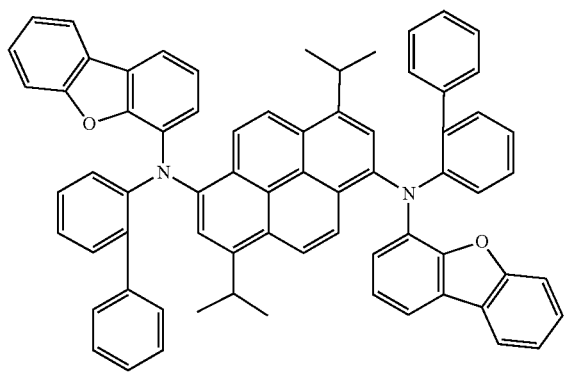
FD31
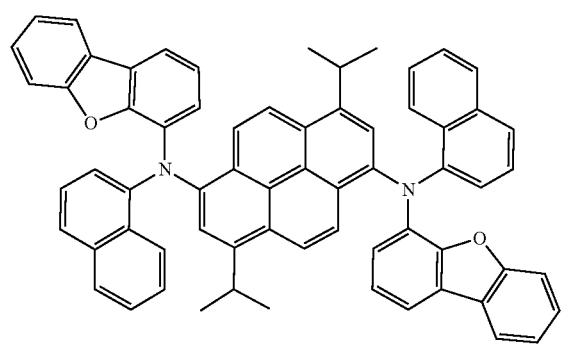
FD32
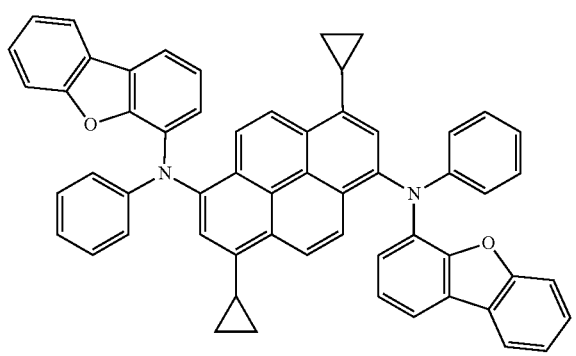
FD33
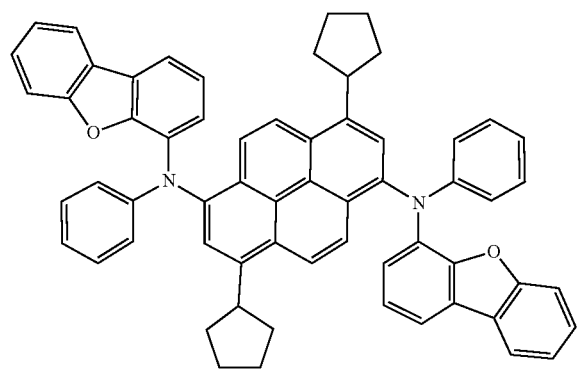
FD34
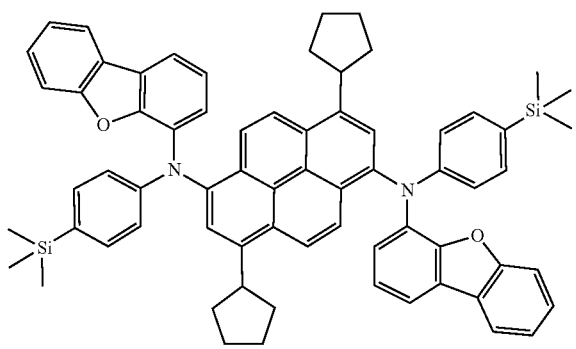
FD35
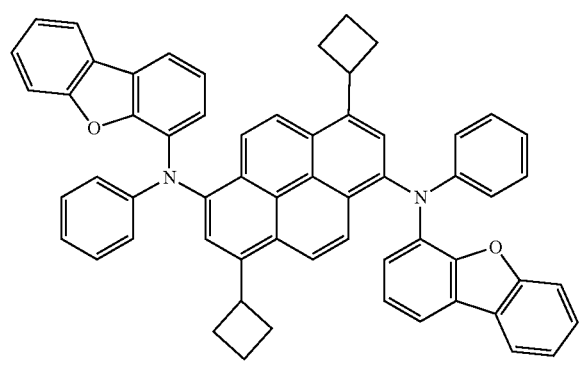
FD36
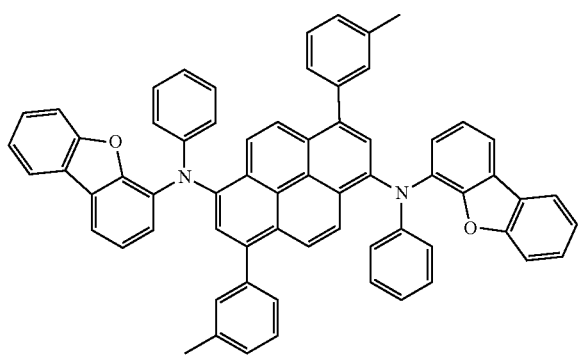

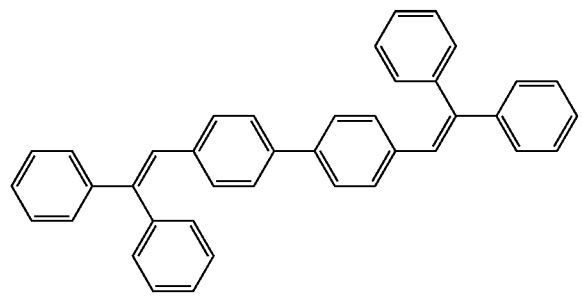

DPVBi

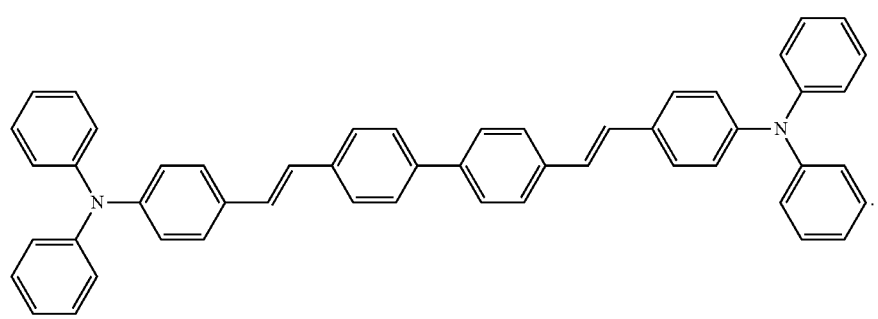

DPAVBi

[Delayed Fluorescence Material]

The emission layer may include a delayed fluorescence material.

In the specification, the delayed fluorescence material may be selected from compounds capable of emitting delayed fluorescence based on a delayed fluorescence emission mechanism.

The delayed fluorescence material included in the emission layer may act as a host or a dopant depending on the type of other materials included in the emission layer.

In an embodiment, a difference between a triplet energy level (eV) of the delayed fluorescence material and a singlet energy level (eV) of the delayed fluorescence material may be in a range of about 0 eV to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence material may effectively occur, and thus, the luminescence efficiency of the light-emitting device 10 may be improved.

In an embodiment, the delayed fluorescence material may include a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and a material including a $C_8$-$C_{60}$ polycyclic group in which two or more cyclic groups are condensed while sharing boron (B).

Examples of the delayed fluorescence material may include at least one of Compounds DF1 to DF9:

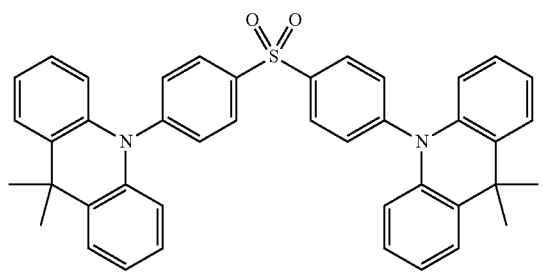

DF1

(DMAC-DPS)

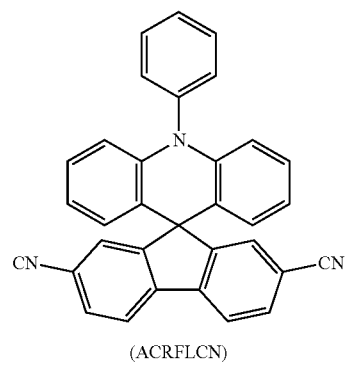

DF2

(ACRFLCN)

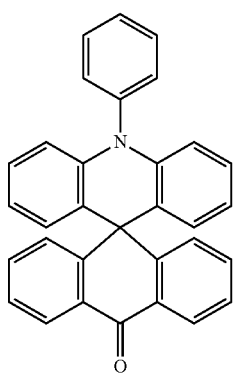
(ACRSA)
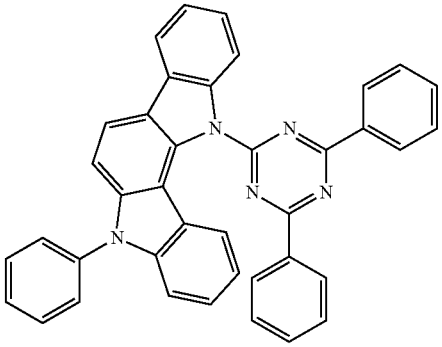
(PIC-TRZ2)
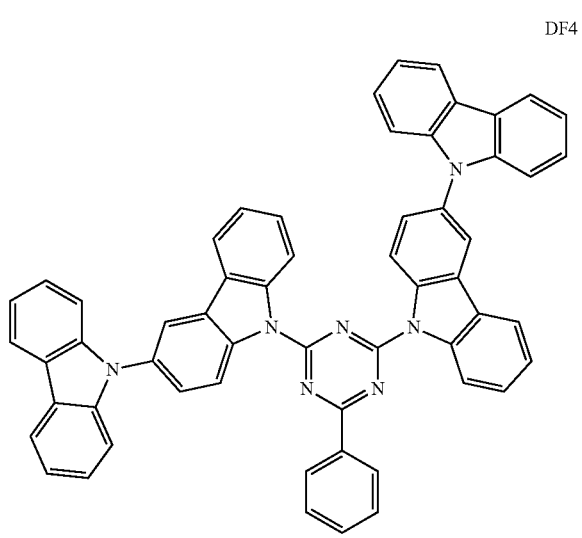
(CC2TA)
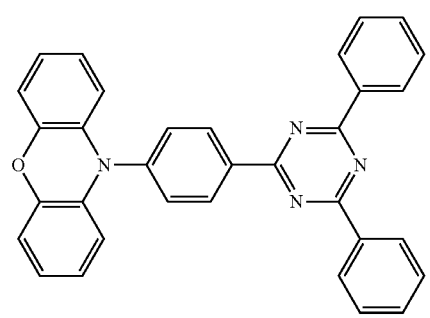
(PXZ-TRZ)
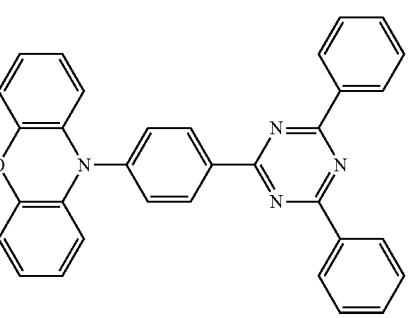
(DABNA-1)
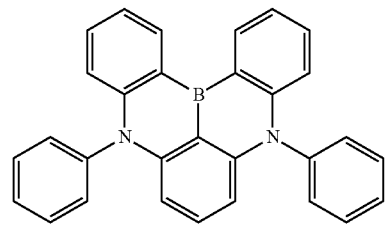
(DABNA-2)
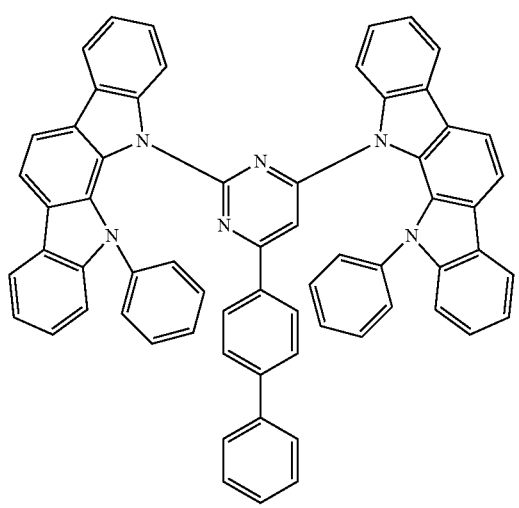
(PIC-TRZ)
[Quantum Dot]
The emission layer may include a quantum dot.
In the specification, a quantum dot may be a crystal of a semiconductor compound, and may include any material capable of emitting light of various emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) or molecular beam epitaxy (MBE), and which requires low costs.

The quantum dot may include Group II-VI semiconductor compounds, Group III-V semiconductor compounds, Group III-VI semiconductor compounds, Group I-III-VI semiconductor compounds, Group IV-VI semiconductor compounds, a Group IV element or compound, or any combination thereof.

Examples of the Group II-VI semiconductor compound may include a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. The Group III-V semiconductor compound may further include Group II elements. Examples of the Group III-V semiconductor compound further including Group II elements may include InZnP, InGaZnP, InAlZnP, etc.

Examples of the Group III-VI semiconductor compound may include a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; and any combination thereof.

Examples of the Group 1-III-VI semiconductor compound may include a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

The Group IV element or compound may include a single element compound, such as Si or Ge; a binary compound, such as SiC or SiGe; or any combination thereof.

Each element included in a multi-element compound such as the binary compound, the ternary compound, and the quaternary compound, may exist at a uniform concentration or at a non-uniform concentration in a particle.

The quantum dot may have a single structure or a core-shell structure. When the quantum dot has a single structure, the concentration of each element included in the corresponding quantum dot may be uniform. In an embodiment, when the quantum dot has a core-shell structure, a material contained in the core and a material contained in the shell may be different from each other.

The shell of the quantum dot may be a protective layer that prevents chemical degeneration of the core to maintain semiconductor characteristics and/or may be a charging layer that imparts electrophoretic characteristics to the quantum dot. The shell may be a single layer or a multi-layer. An interface between the core and the shell may have a concentration gradient in which the concentration of an element in the shell may decrease towards the core.

Examples of the shell of the quantum dot may include a metal oxide, a metalloid oxide, a non-metal oxide, a semiconductor compound, and any combination thereof. Examples of the metal oxide, the metalloid oxide, or the non-metal oxide may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or any combination thereof. Examples of the semiconductor compound may include, as described herein, Group II-VI semiconductor compounds; Group III-V semiconductor compounds; Group III-VI semiconductor compounds; Group 1-III-VI semiconductor compounds; Group IV-VI semiconductor compounds; or any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be equal to or less than about 45 nm. For example, a FWHM of an emission wavelength spectrum of the quantum dot may be equal to or less than about 40 nm. For example, a FWHM of an emission wavelength spectrum of the quantum dot may be equal to or less than about 30 nm. Within these ranges, color purity or color gamut may be increased. Light emitted through the quantum dot may be emitted in all directions, and a wide viewing angle may be improved.

The quantum dot may be a spherical particle, a pyramidal particle, a multi-arm particle, a cubic nanoparticle, a nanotube particle, a nanowire particle, a nanofiber particle, or a nanoplate particle.

Since the energy band gap may be adjusted by controlling the size of the quantum dot, light having various wavelength bands may be obtained from the quantum dot emission layer. Accordingly, by using quantum dots of different sizes, a light-emitting device that emits light of various wavelengths may be implemented. The size of the quantum dot may be selected to emit red, green, and/or blue light. The size of the quantum dot may be configured to emit white light by combining light of various colors.

[Electron Transport Region in Interlayer 130]

The electron transport region may have a structure consisting of a layer consisting of a single material, a single-layered structure consisting of a layer consisting of different materials, or a multi-layered structure including layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers may be stacked from an emission layer in its respective stated order, but embodiments are not limited thereto.

The electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

[Ar$_{601}$]$_{xe11}$-[(L$_{61}$)$_{xe1}$-R$_{60}$]$_{xe21}$  [Formula 601]

In Formula 601,

Ar$_{601}$ and L$_{601}$ may each independently be a $C_3$-$C_{60}$ carbocyclic group unsubstituted or substituted with at least one R$_{10a}$ or a $C_1$-$C_{60}$ heterocyclic group unsubstituted or substituted with at least one R$_{10a}$, xe11 may be 1, 2, or 3, xe1 may be 0, 1, 2, 3, 4, or 5, R$_{601}$ may be a $C_3$-$C_{60}$ carbocyclic group unsubstituted or substituted with at least one R$_{10a}$, a $C_1$-$C_{60}$ heterocyclic group unsubstituted or substituted with at least one R$_{10a}$, —Si(Q$_{601}$)(Q$_{602}$)(Q$_{603}$), —C(=O)(Q$_{601}$), —S(=O)$_2$(Q$_{601}$), or —P(=O)(Q$_{601}$)(Q$_{602}$), Q$_{601}$ to Q$_{603}$ may each independently be the same as described in connection with Q$_1$, xe21 may be 1, 2, 3, 4, or 5, and at least one of Ar$_{601}$, L$_{601}$, and R$_{601}$ may each independently be a π electron-deficient nitrogen-containing $C_1$-$C_{60}$ cyclic group unsubstituted or substituted with at least one R$_{10a}$.

In an embodiment, when xe11 in Formula 601 is 2 or more, two or more of Ar$_{601}$(s) may be linked to each other via a single bond.

In embodiments, Ar$_{601}$ in Formula 601 may be a substituted or unsubstituted anthracene group.

In embodiments, the electron transport region may include a compound represented by Formula 601-1:

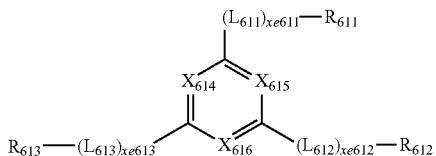

[Formula 601-1]

In Formula 601-1,

X$_{614}$ may be N or C(R$_{614}$), X$_{615}$ may be N or C(R$_{615}$), X$_{616}$ may be N or C(R$_{616}$), and at least one of X$_{614}$ to X$_{616}$ may be N, L$_{611}$ to L$_{613}$ may each independently be the same as described in connection with L$_{601}$, xe611 to xe613 may each independently be the same as described in connection with xe1, R$_{11}$ to R$_{613}$ may each independently be the same as described in connection with R$_{601}$, and R$_{614}$ to R$_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one R$_{10a}$, or a $C_1$-$C_{60}$ heterocyclic group unsubstituted or substituted with at least one R$_{10a}$.

In an embodiment, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq$_3$, BAlq, TAZ, NTAZ, or any combination thereof.

ET1

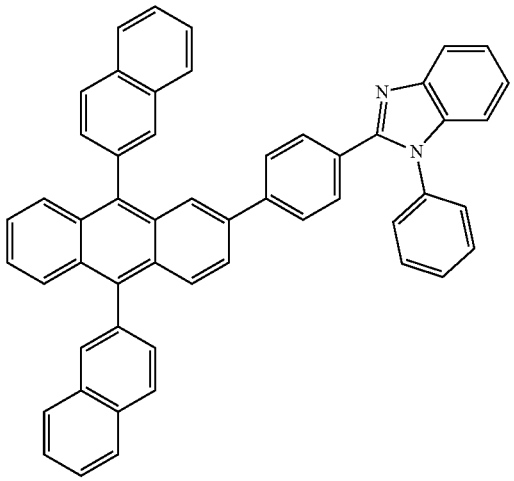

ET2

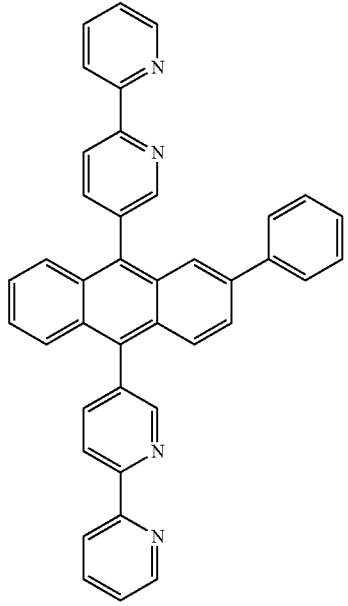

ET3
ET4
ET5
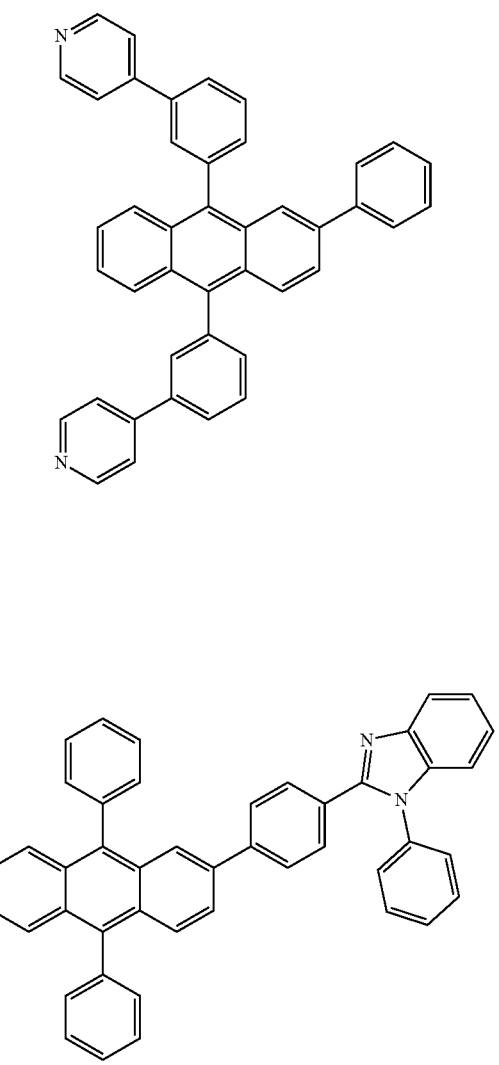
ET6
ET7
ET8
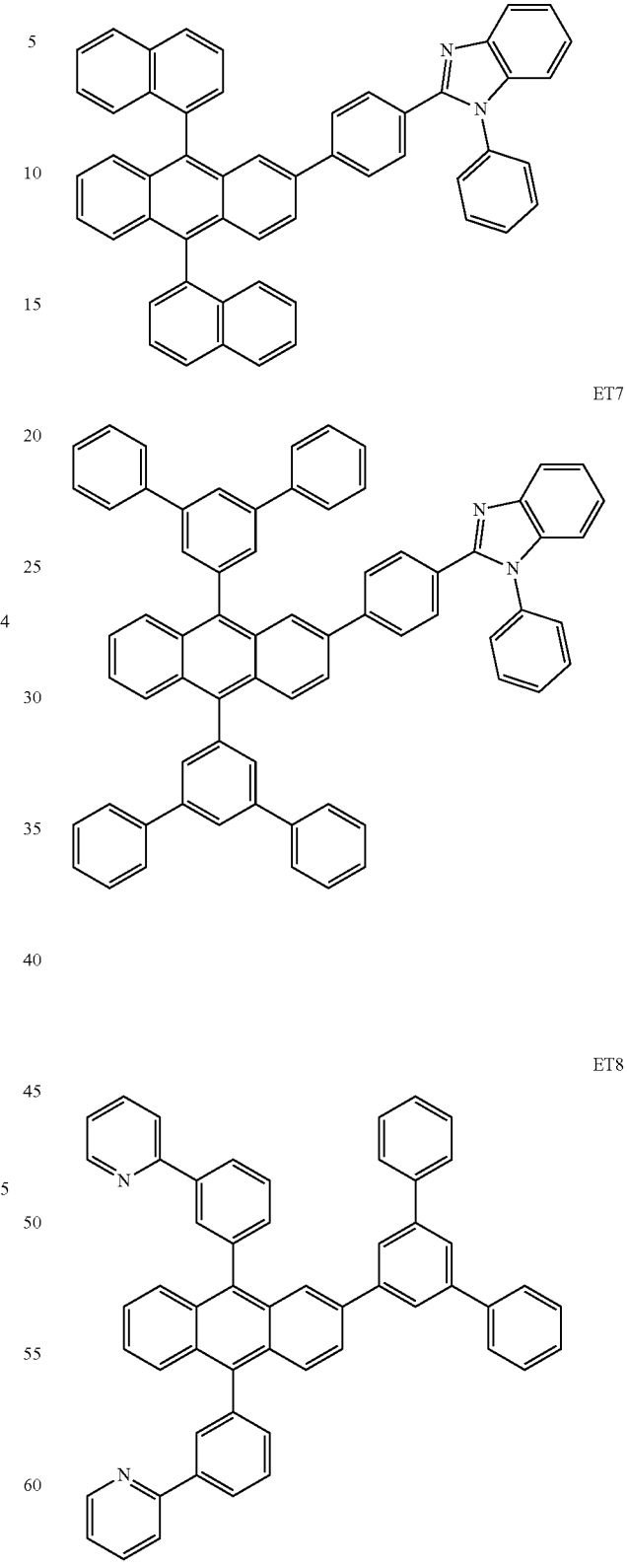

ET9
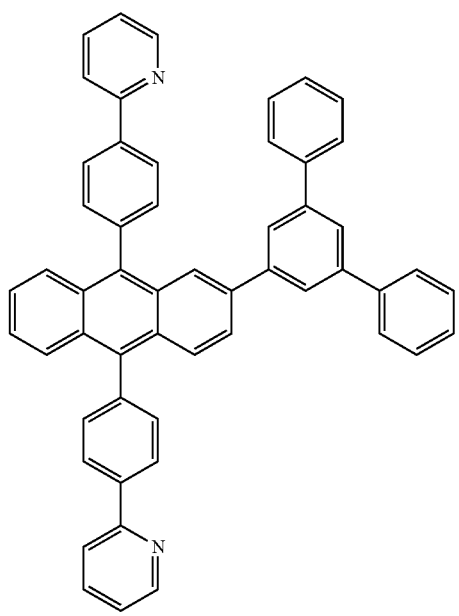
ET11
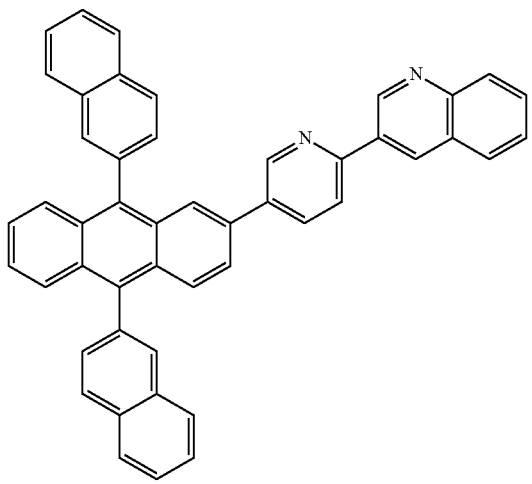
ET12
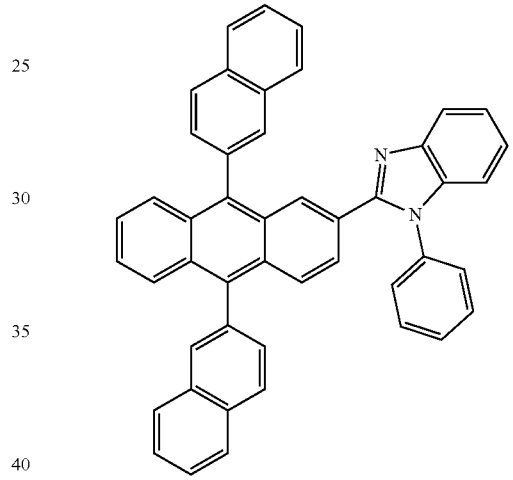
ET10
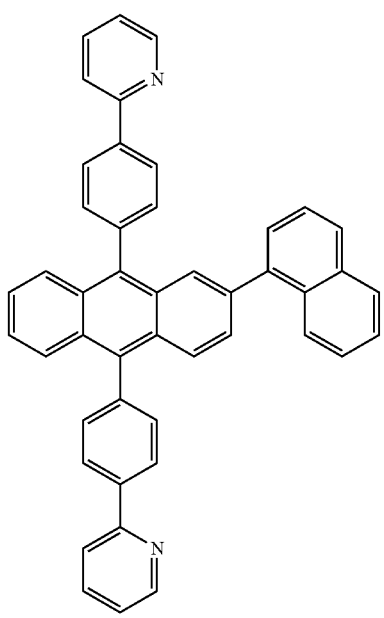
ET13
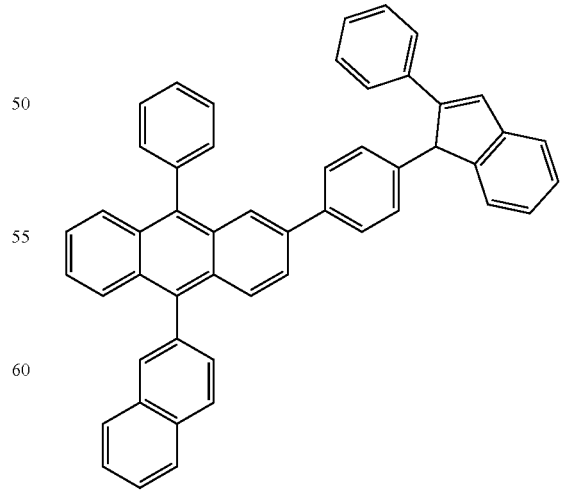

ET14
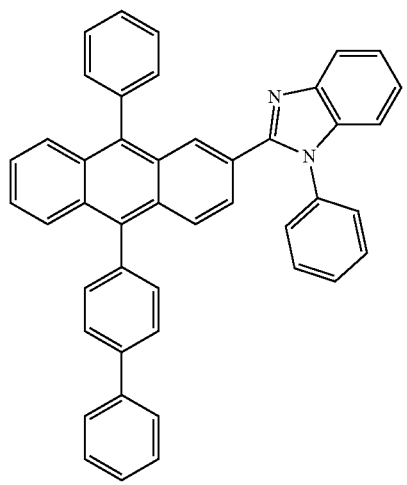
ET15
ET17
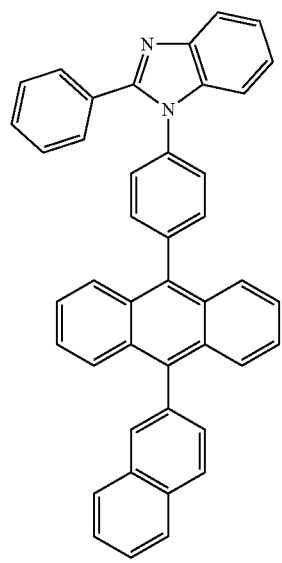
ET18
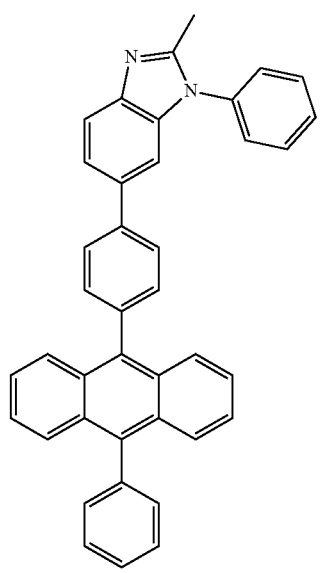
ET16
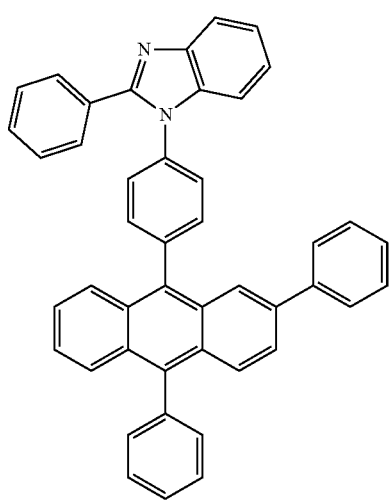
ET19

ET20
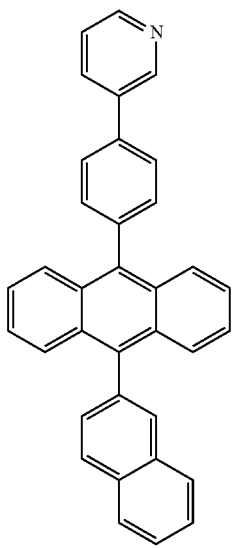
ET21
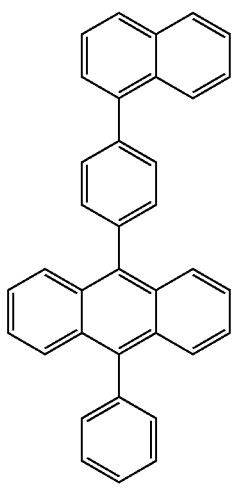
ET22
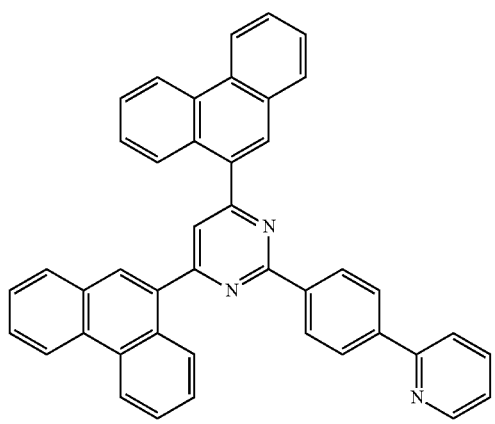
ET23
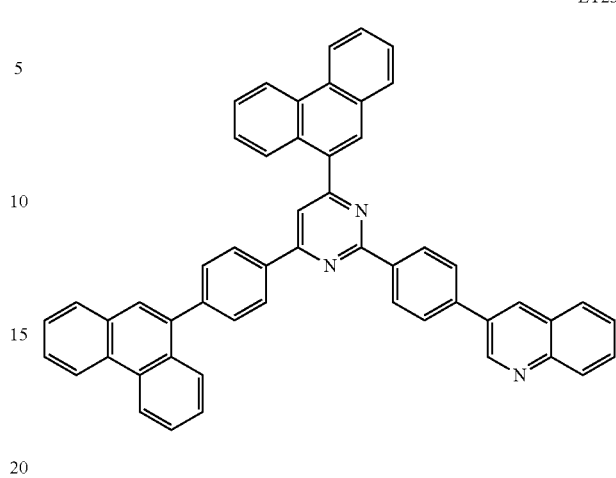
ET24
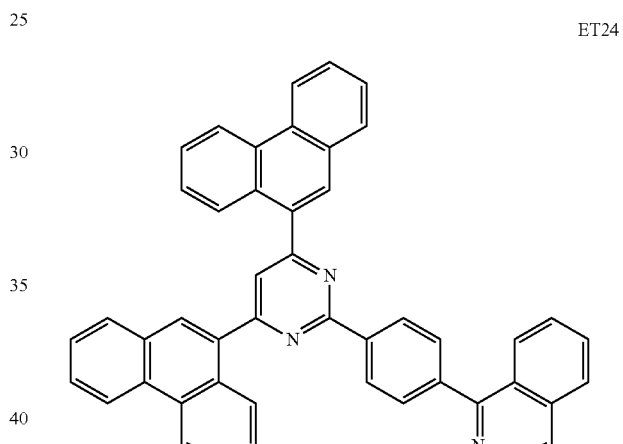
ET25
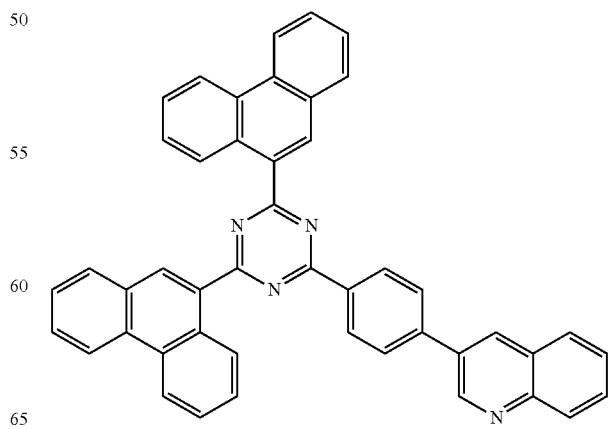

ET26
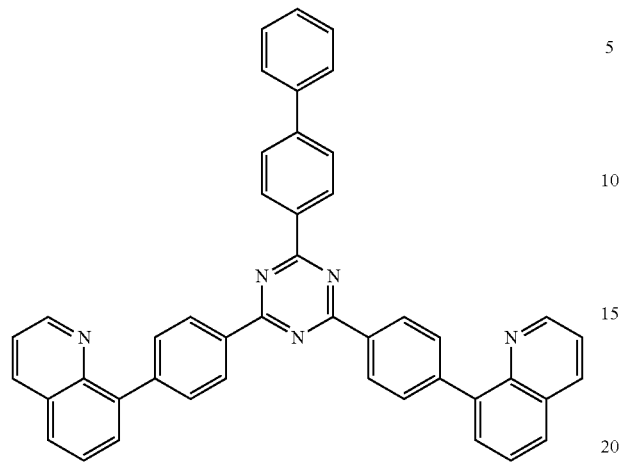
ET27
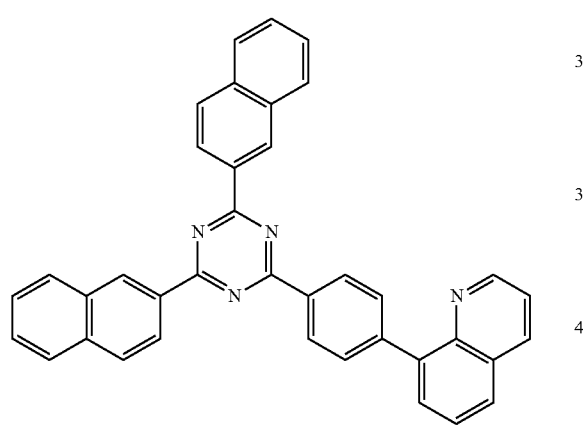
ET28
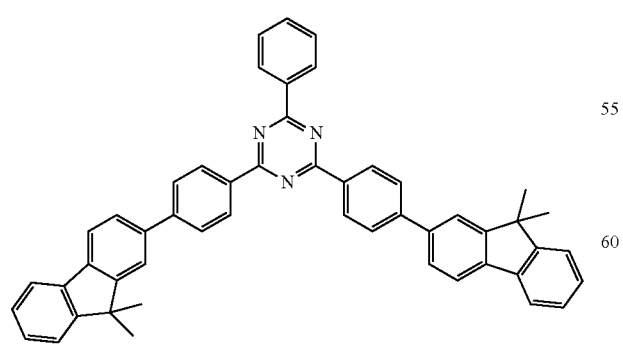
ET29
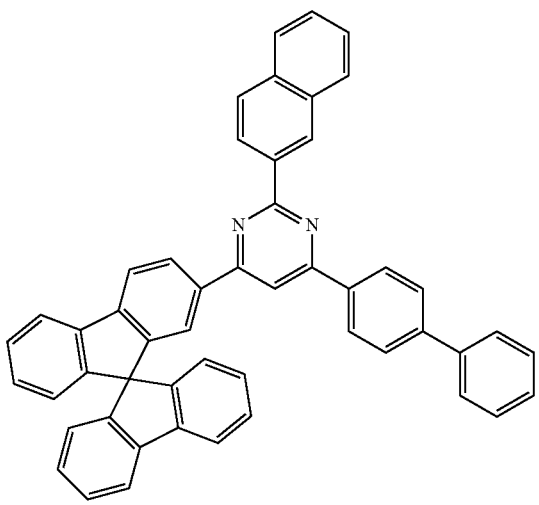
ET30
ET31
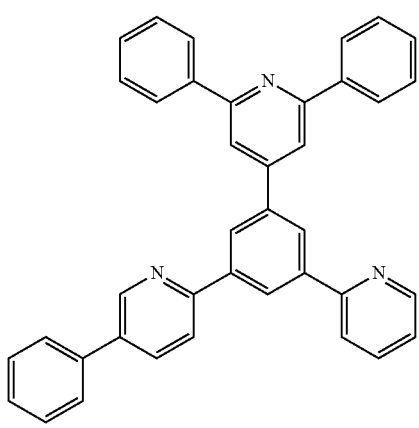

ET32
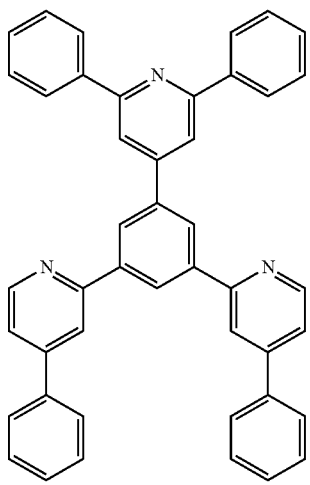
ET35
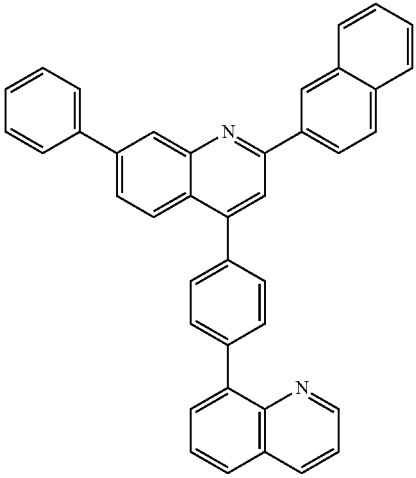
ET33
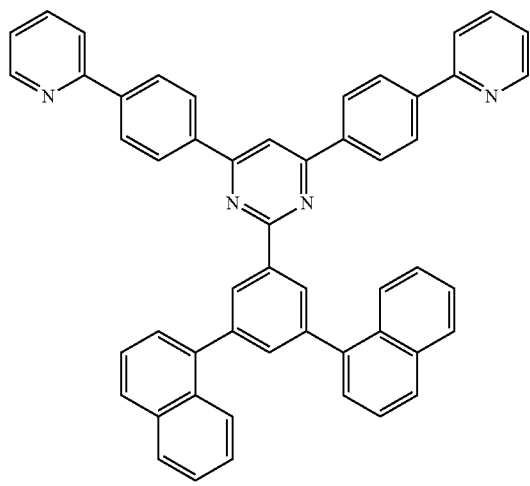
ET36
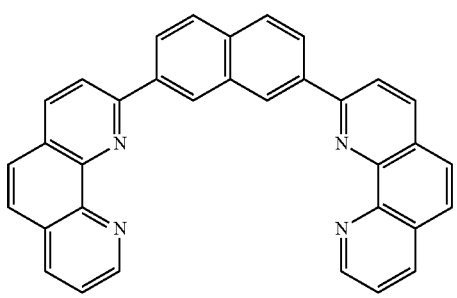
ET37
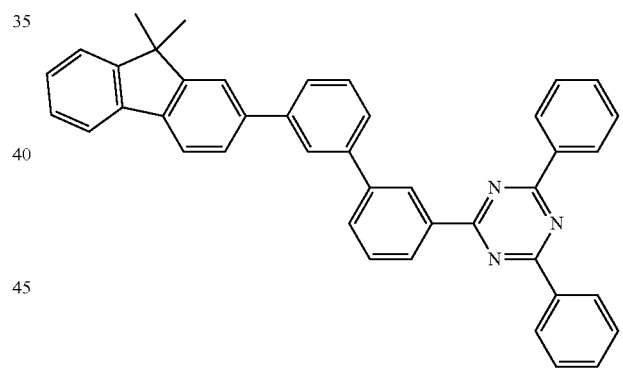
ET34
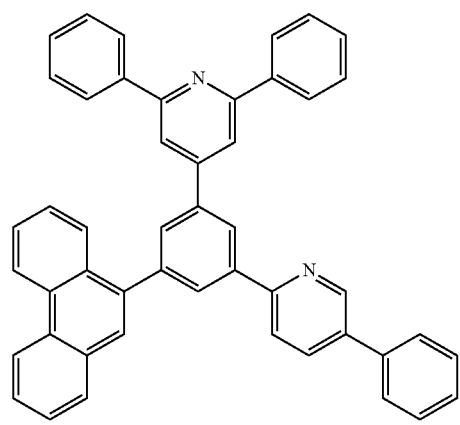
ET38
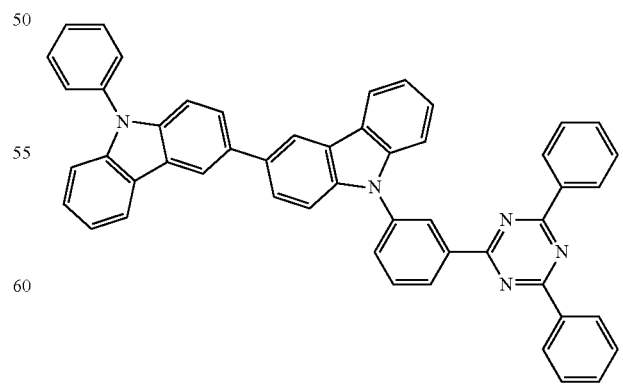

ET39
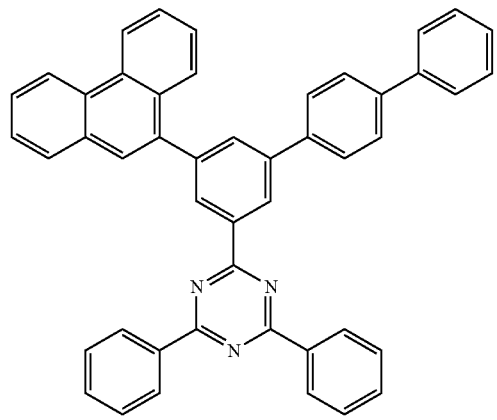
ET40
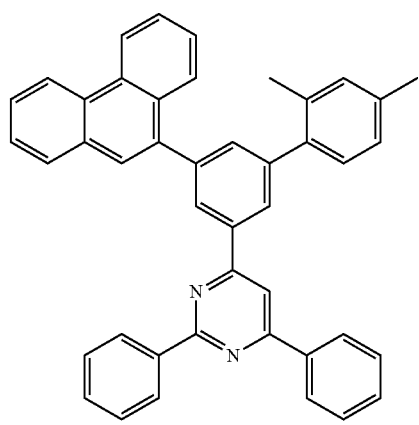
ET41
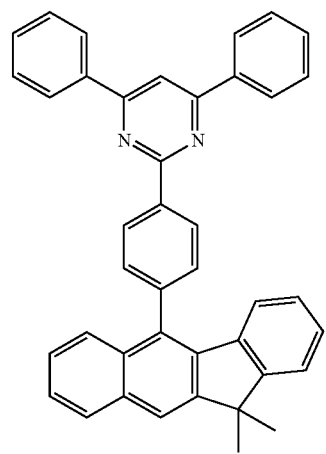
ET42
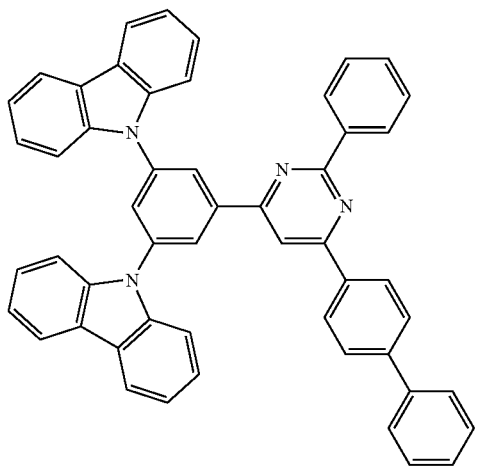
ET43
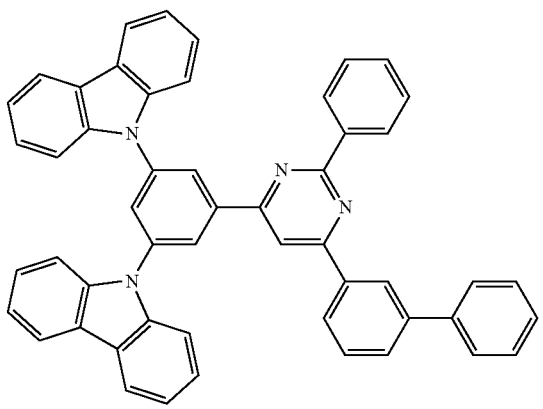
ET44
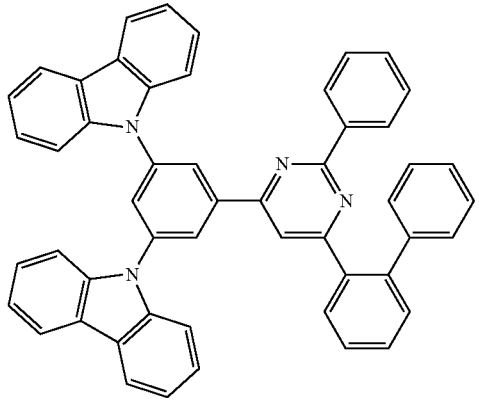
ET45
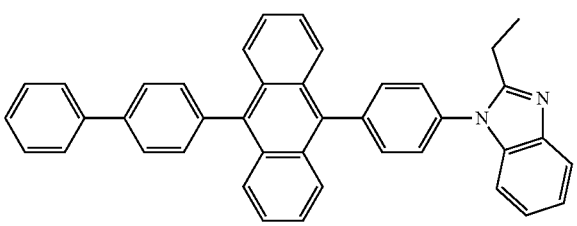

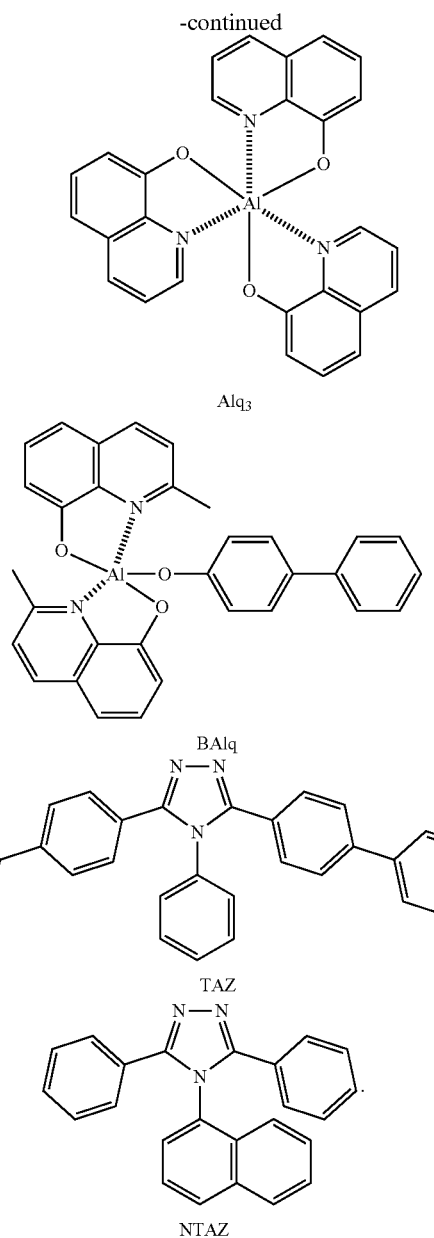

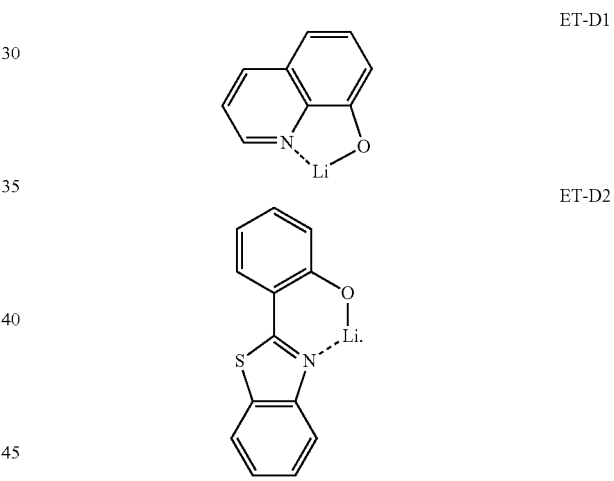

electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or Compound ET-D2:

A thickness of the electron transport region may be in a range of about 100 Å to about 5,000 Å. For example, the thickness of the electron transport region may be in a range of about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, and a thickness of the electron transport layer may be in a range of about 100 Å to about 1,000 Å. For example, the thickness of the buffer layer, the hole blocking layer, or the electron control layer may each independently be in a range of about 30 Å to about 300 Å. For example, the thickness of the electron transport layer may be in a range of about 150 Å to about 500 Å. When the thicknesses of the buffer layer, the hole blocking layer, the electron control layer, and/or the electron transport layer are within these ranges, satisfactory The electron transport region may include an electron injection layer that facilitates the injection of electrons from the second electrode 150. The electron injection layer may directly contact the second electrode 150.

The electron injection layer may have a structure consisting of a layer consisting of a single material, a structure consisting of a layer consisting of different materials, or a multi-layered structure including layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of 0<x<1), $BaxCa_{1-x}O$ (x is a real number satisfying the condition of 0<x<1), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include one of ions of the alkali metal, ions of the alkaline earth metal, and ions of the rare earth metal, and a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (for example, a compound represented by Formula 601).

In an embodiment, the electron injection layer may consist of an alkali metal-containing compound (for example, an alkali metal halide); or an alkali metal-containing compound (for example, an alkali metal halide), and an alkali metal, an alkaline earth metal, a rare earth metal, or any combination thereof. In an embodiment, the electron injection layer may be a KI:Yb co-deposited layer, an RbI:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within this range, satisfactory electron injection characteristics may be obtained without a substantial increase in driving voltage.

[Second Electrode 150]

The second electrode 150 may be on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

[Capping Layer]

A first capping layer may be located outside the first electrode 110, and/or a second capping layer may be located outside the second electrode 150. The light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in an emission layer of the interlayer 130 of the light-emitting device 10 may be extracted toward the outside through the first electrode 110 (which may be a semi-transmissive electrode or a transmissive electrode) and through the first capping layer, and/or light generated in an emission layer of the interlayer 130 of the light-emitting device 10 may be extracted toward the outside through the second electrode 150 (which may be a semi-transmissive electrode or a transmissive electrode) and through the second capping layer.

The first capping layer and the second capping layer may each increase external luminescence efficiency according to the principle of constructive interference. Accordingly, the light extraction efficiency of the light-emitting device 10 may be increased, so that the luminescence efficiency of the light-emitting device 10 may be improved.

Each of the first capping layer and the second capping layer may include a material having a refractive index (at a wavelength of about 589 nm) equal to or greater than about 1.6.

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may each independently be optionally substituted with a substituent including O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof.

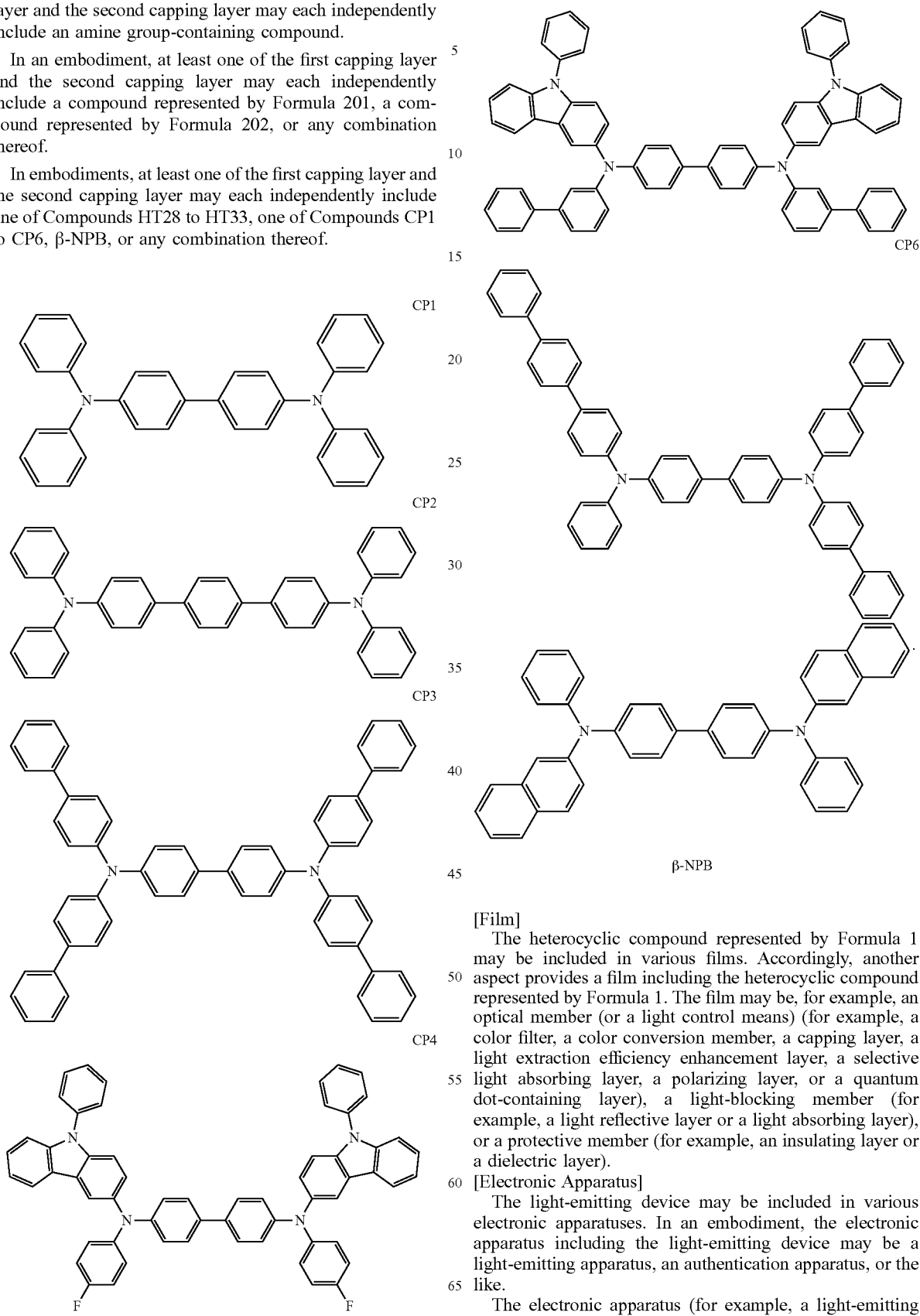

[Film]

The heterocyclic compound represented by Formula 1 may be included in various films. Accordingly, another aspect provides a film including the heterocyclic compound represented by Formula 1. The film may be, for example, an optical member (or a light control means) (for example, a color filter, a color conversion member, a capping layer, a light extraction efficiency enhancement layer, a selective light absorbing layer, a polarizing layer, or a quantum dot-containing layer), a light-blocking member (for example, a light reflective layer or a light absorbing layer), or a protective member (for example, an insulating layer or a dielectric layer).

[Electronic Apparatus]

The light-emitting device may be included in various electronic apparatuses. In an embodiment, the electronic apparatus including the light-emitting device may be a light-emitting apparatus, an authentication apparatus, or the like.

The electronic apparatus (for example, a light-emitting apparatus) may further include, in addition to the light-emitting device, a color filter, a color conversion layer, or a color filter and a color conversion layer. The color filter and/or the color conversion layer may be located in at least one traveling direction of light emitted from the light-emitting device. In an embodiment, the light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be located among the subpixels to define each of the subpixels.

The color filter may further include color filter areas and light-shielding patterns located among the color filter areas, and the color conversion layer may include color conversion areas and light-shielding patterns located among the color conversion areas.

The color filter areas (or the color conversion areas) may include a first area emitting first-color light, a second area emitting second-color light, and/or a third area emitting third-color light, and the first-color light, the second-color light, and/or the third-color light may have different maximum emission wavelengths from one another. In an embodiment, the first-color light may be red light, the second-color light may be green light, and the third-color light may be blue light. In an embodiment, the color filter areas (or the color conversion areas) may include quantum dots. The first area may include a red quantum dot, the second area may include a green quantum dot, and the third area may not include a quantum dot. The quantum dot may be the same as described in the specification. Each of the first area, the second area, and/or the third area may further include a scatterer.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths from one another. The first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulating film, or the like.

The active layer may include crystalline silicon, amorphous silicon, organic semiconductor, oxide semiconductor, or the like.

The electronic apparatus may further include a sealing portion for sealing the light-emitting device. The sealing portion and/or the color conversion layer may be located between the color filter and the light-emitting device. The sealing portion may light from the light-emitting device to be extracted to the outside, and may simultaneously prevent ambient air and/or moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be on the sealing portion, in addition to the color filter and/or the color conversion layer, according to the use of the electronic apparatus. The functional layers may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device, a biometric information collector.

The electronic apparatus may be applied to various displays, such as light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
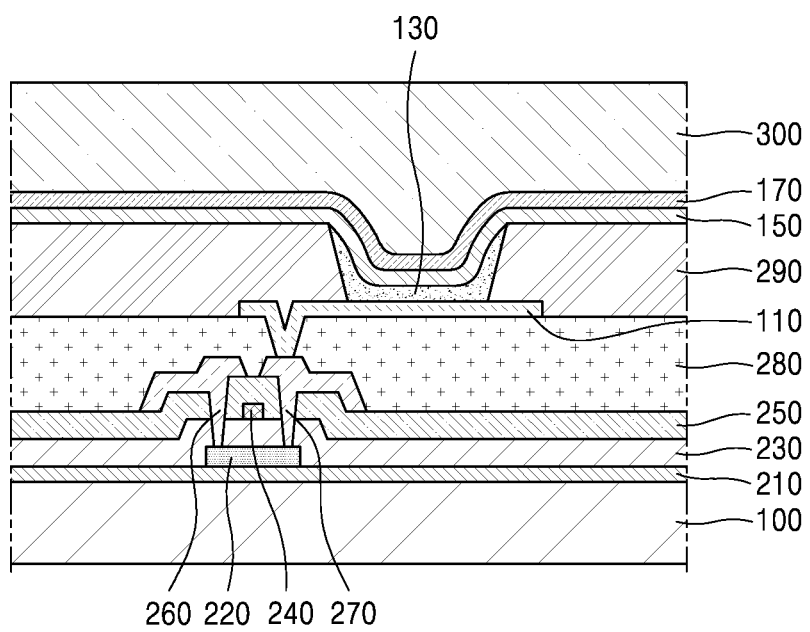
FIG. 2 is a schematic cross-sectional view of an electronic apparatus according to an embodiment.
Figure 3:
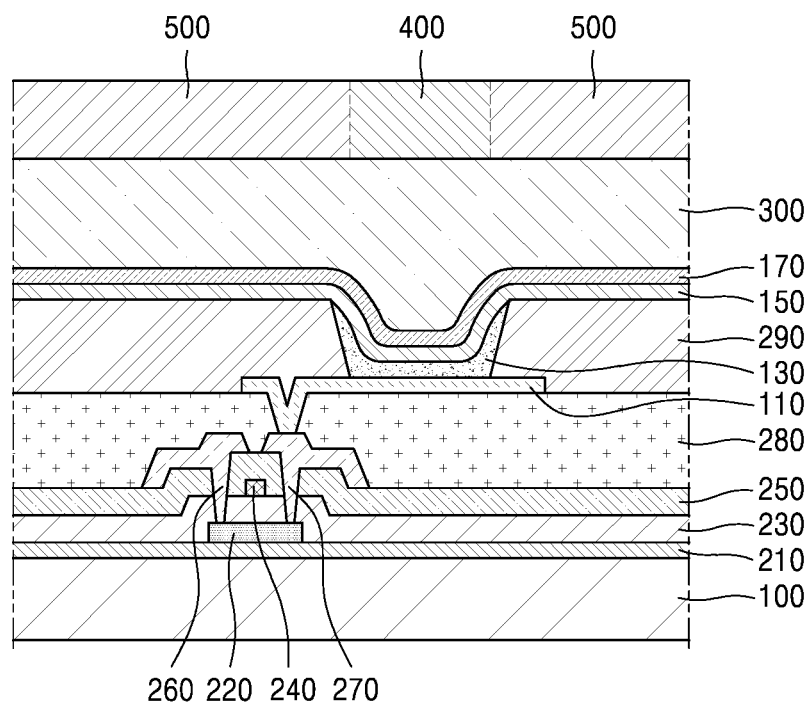
FIG. 3 is a schematic cross-sectional view of an electronic apparatus according to another embodiment.

[Description of FIGS. 2 and 3]

FIG. 2 is a schematic cross-sectional view of an electronic apparatus according to an embodiment.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 may be located on the gate electrode 240. The interlayer insulating film 250 may be located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may be in contact with the exposed portions of the source region and the drain region of the active layer 220.

The TFT is electrically connected to a light-emitting device to drive the light-emitting device, and is covered by a passivation layer 280. The passivation layer 280 may include an inorganic insulating film, an organic insulating film, or any combination thereof. A light-emitting device is provided on the passivation layer 280. The light-emitting device may include a first electrode 110, an interlayer 130, and a second electrode 150.

The first electrode 110 may be on the passivation layer 280. The passivation layer 280 may not completely cover the drain electrode 270 and may expose a portion of the drain electrode 270, and the first electrode 110 may be connected to the exposed portion of the drain electrode 270.

A pixel defining layer 290 including an insulating material may be on the first electrode 110. The pixel defining layer 290 may expose a region of the first electrode 110, and an interlayer 130 may be formed in the exposed region of the first electrode 110. The pixel defining layer 290 may be a polyimide or polyacrylic organic film. Although not shown in FIG. 2, at least some layers of the interlayer 130 may extend beyond the upper portion of the pixel defining layer 290 to be provided in the form of a common layer.

The second electrode 150 may be on the interlayer 130, and a capping layer 170 may be additionally formed on the second electrode 150. The capping layer 170 may be formed to cover the second electrode 150.

The encapsulation portion 300 may be on the capping layer 170. The encapsulation portion 300 may be on a light-emitting device to protect the light-emitting device from moisture and/or oxygen. The encapsulation portion 300 may include an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or any combination thereof, or any combination of the inorganic film and the organic film.

FIG. 3 is a schematic cross-sectional view of an electronic apparatus according to an embodiment.

The electronic apparatus of FIG. 3 is the same as the electronic apparatus of FIG. 2, except that a light-shielding pattern 500 and a functional region 400 are additionally located on the encapsulation portion 300. The functional region 400 may be a color filter area, a color conversion area, or a combination of the color filter area and the color conversion area. In an embodiment, the light-emitting device included in the electronic apparatus of FIG. 3 may be a tandem light-emitting device.

Figure 4:
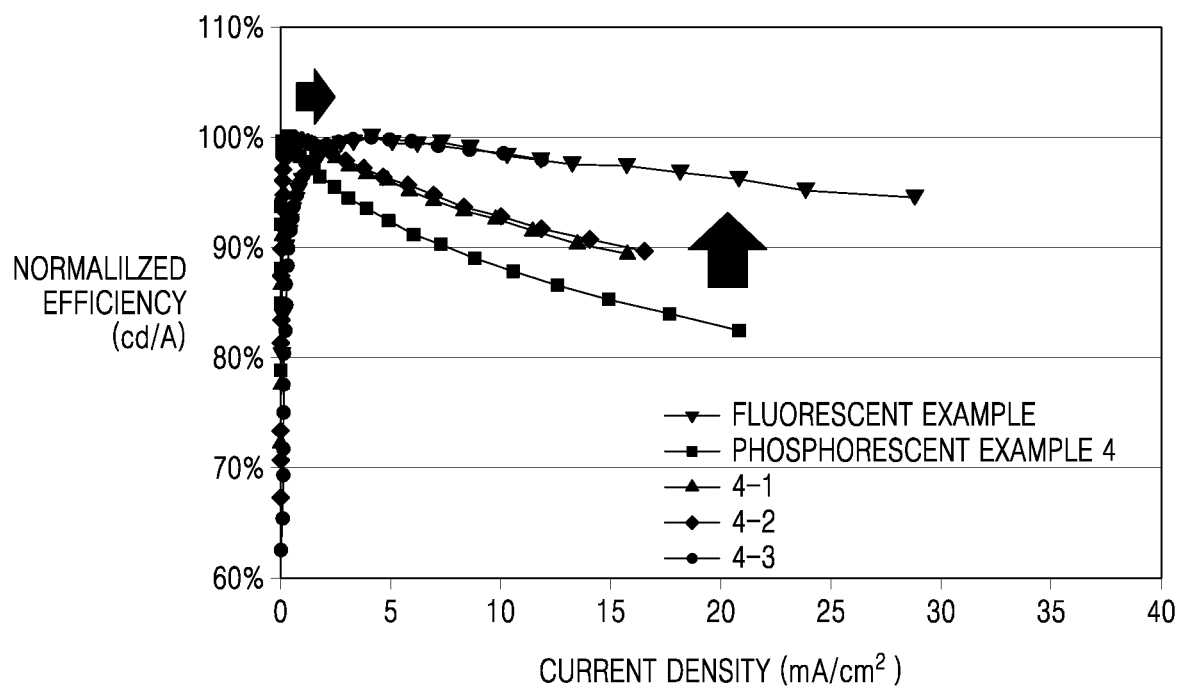
FIGS. 4 and 5 are each a diagram showing normalized luminescence efficiency according to current density of Fluorescent Example, Phosphorescent Example 4, and Examples 4-1 to 4-3.
Figure 5:
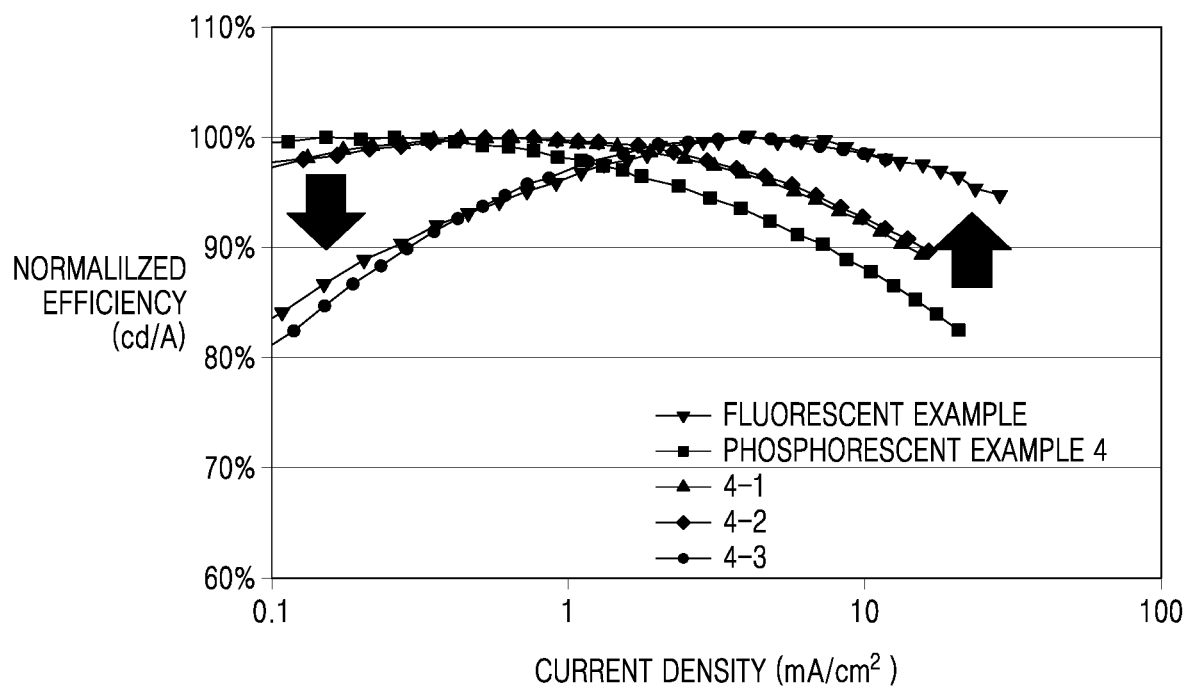

[Description of FIGS. 4 and 5]

FIG. 4 is a diagram showing normalized luminescence efficiency according to current density, with respect to light-emitting devices of Fluorescent Example, Phosphorescent Example 4, and Examples 4-1 to 4-3. FIG. 5 is a diagram showing normalized luminescence efficiency at certain current densities (0.1 mA/cm$^2$, 1 mA/cm$^2$, 10 mA/cm$^2$, and 100 mA/cm$^2$), with respect to the light-emitting devices of Fluorescent Example, Phosphorescent Example 4, and Examples 4-1 to 4-3.

Referring to FIGS. 4 and 5, it can be seen that through Examples 4-1 to 4-3, the luminescence efficiency trend according to the current density of a light-emitting device changes based on the weight ratio of the heterocyclic compound represented by Formula 1. It can be seen that the light-emitting device of Example 4-3 has a luminescence efficiency trend similar to that of the light-emitting device of Fluorescent Example.

[Manufacture Method]

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definitions of Terms

The term "$C_3$-$C_{60}$ carbocyclic group" as used herein may be a cyclic group consisting only of carbon only as ring-forming atoms and having 3 to 60 carbon atoms, and the term "$C_1$-$C_{60}$ heterocyclic group" as used herein may be a cyclic group that has 1 to 60 carbon atoms and further has, in addition to carbon, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, a $C_1$-$C_{60}$ heterocyclic group may have 3 to 61 ring-forming atoms.

The term "cyclic group" as used herein may include the $C_3$-$C_{60}$ carbocyclic group and the $C_1$-$C_{60}$ heterocyclic group.

The term "n electron-rich $C_3$-$C_{60}$ cyclic group" as used herein may be a cyclic group that has 3 to 60 carbon atoms and may not include *—N=*' as a ring-forming moiety, and the term "n electron-deficient nitrogen-containing $C_1$-$C_{60}$ cyclic group" as used herein refers to a heterocyclic group that has 1 to 60 carbon atoms and may include *—N=*' as a ring-forming moiety.

In an embodiment,
 the $C_3$-$C_{60}$ carbocyclic group may be a T1 group or a condensed cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a condensed cyclic group in which two or more T2 groups are condensed with each other, or a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be a T1 group, a condensed cyclic group in which two or more T1 groups are condensed with each other, a T3 group, a condensed cyclic group in which two or more T3 groups are condensed with each other, or a condensed cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be a T4 group, a condensed cyclic group in which two or more T4 groups are condensed with each other, a condensed cyclic group in which at least one T4 group and at least one T1 group are condensed with each other, a condensed cyclic group in which at least one T4 group and at least one T3 group are condensed with each other, or a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group," "$C_3$-$C_{60}$ carbocyclic group," "$C_1$-$C_{60}$ heterocyclic group," "π electron-rich $C_3$-$C_{60}$ cyclic group," or "π electron-deficient nitrogen-containing $C_1$-$C_{60}$ cyclic group" as used herein may be a group condensed to any cyclic group or a polyvalent group (for example, a divalent group, a trivalent group, a tetravalent group, etc.), depending on the structure of a formula in connection with which the terms are used. In an embodiment, "a benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has 1 to 60 carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at the terminus of the $C_2$-$C_{60}$ alkyl group, and examples thereof may include an ethenyl group, a propenyl group, and a butenyl group. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at the terminus of the $C_2$-$C_{60}$ alkyl group, and examples thereof may include an ethynyl group and a propynyl group. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —O($A_{101}$) (wherein $A_{101}$ is a $C_1$-$C_{60}$ alkyl group), and examples thereof may include a methoxy group, an ethoxy group, and an isopropyloxy group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has 3 to 10 carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group that has, in addition to a carbon atom, at least one heteroatom as a ring-forming atom, 1 to 10 carbon atoms, and at least one double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system having 6 to 60 carbon atoms, and the term "$C_6$-$C_{60}$ arylene group" as used herein may be a divalent group having a carbocyclic aromatic system having 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein may be a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein may be a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein may be a divalent group having a same structure as a monovalent non-aromatic condensed polycyclic group.

The term "monovalent non-aromatic condensed heteropolycyclic group" as used herein may be a monovalent group (for example, having 1 to 60 carbon atoms) having two or more rings condensed to each other, at least one heteroatom other than carbon atoms, as a ring-forming atom, and non-aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. The term "divalent non-aromatic heterocondensed polycyclic group" as used herein may be a divalent group having a same structure as a monovalent non-aromatic condensed heteropolycyclic group.

The term "$C_6$-$C_{60}$ aryloxy group" as used herein may be represented by —O($A_{102}$) (wherein $A_{102}$ is a $C_6$-$C_{60}$ aryl group), and the term "$C_6$-$C_{60}$ arylthio group" as used herein may be represented by —S($A_{103}$) (wherein $A_{103}$ is a $C_6$-$C_{60}$ aryl group).

The term "$C_7$-$C_{60}$ aryl alkyl group" as used herein may be represented by -($A_{104}$)($A_{105}$) (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" as used herein may be represented by -($A_{106}$)($A_{107}$) (where $A_{106}$ may be a $C_1$-$C_{59}$ alkylene group, and $A_{107}$ may be a $C_1$-$C_{59}$ heteroaryl group).

The term "$R_{10a}$" as used herein may be:
deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, a $C_7$-$C_{60}$ aryl alkyl group; or a $C_2$-$C_{60}$ heteroaryl alkyl group.

The term "heteroatom" as used herein may be any atom other than a carbon atom or a hydrogen atom. Examples of the heteroatom may include O, S, N, P, Si, B, Ge, Se, or any combination thereof.

The term "third-row transition metal" as used herein may include hafnium (Hf), tantalum (Ta), tungsten (W), rhenium (Re), osmium (Os), iridium (Ir), platinum (Pt), gold (Au), etc.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein may be "a phenyl group substituted with a phenyl group." For example, the "biphenyl group" may be a substituted phenyl group having a $C_6$-$C_{60}$ aryl group as a substituent.

The term "terphenyl group" as used herein may be "a phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

In the specification, * and *' as used herein, unless defined otherwise, each refer to a binding site to a neighboring atom in a corresponding formula or moiety.

Hereinafter, a compound according to embodiments and a light-emitting device according to embodiments will be described in detail with reference to Synthesis Examples and Examples. The wording "B was used instead of A" used in describing Synthesis Examples refers to that an identical molar equivalent of B was used in place of A.

EXAMPLES

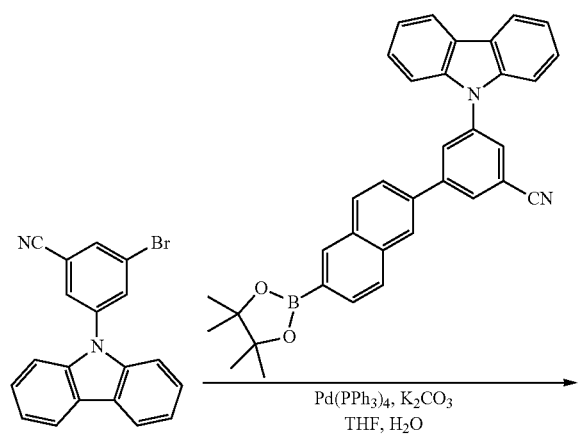

[Synthesis Example 2: Synthesis of Compound 2]

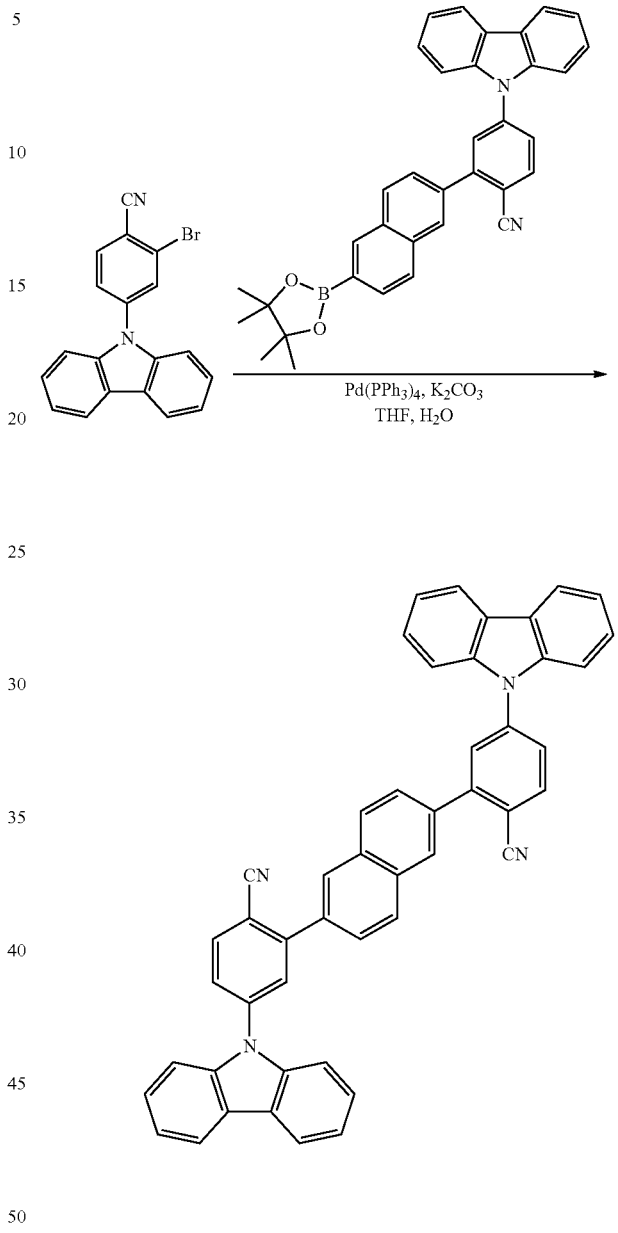

In a nitrogen atmosphere, after 3-bromo-5-(9H-carbazol-9-yl)benzonitrile (5.00 g, 0.0144 mol) and 3-(9H-carbazol-9-yl)-5-(6-(4,4,5,5-tetramethyl-1,3,2-dioxaborolan-2-yl) naphthalen-2-yl)benzonitrile (8.99 g, 0.0173 mol) were completely dissolved in 200 mL of THF in a 500 mL round-bottom flask, a 2M $K_2CO_3$ aqueous solution (100 mL) was added thereto, Pd(PPh$_3$)$_4$ (0.50 g, 3 mol %) was added thereto, and the mixture was refluxed for 8 hours. After the reaction was terminated in $H_2O$, extraction was performed using $CH_2Cl_2$, followed by drying using anhydrous $MgSO_4$, and column chromatography was performed on the resultant using a solvent of $CH_2Cl_2$:n-hexane at a volume ratio of 1:10 to thereby prepare Compound 1 (8.47 g, 89%).

In a nitrogen atmosphere, after 2-bromo-4-(9H-carbazol-9-yl)benzonitrile (5.00 g, 0.0144 mol) and 4-(9H-carbazol-9-yl)-2-(6-(4,4,5,5-tetramethyl-1,3,2-dioxaborolan-2-yl) naphthalen-2-yl)benzonitrile (8.99 g, 0.0173 mol) were completely dissolved in 200 mL of THE in a 500 mL round-bottom flask, a 2M $K_2CO_3$ aqueous solution (100 mL) was added thereto, Pd(PPh$_3$)$_4$ (0.50 g, 3 mol %) was added thereto, and the mixture was refluxed for 8 hours. After the reaction was terminated in $H_2O$, extraction was performed using $CH_2Cl_2$, followed by drying using anhydrous $MgSO_4$, and column chromatography was performed on the resultant using a solvent of $CH_2Cl_2$:n-hexane at a volume ratio of 1:10 to thereby prepare Compound 2 (7.80 g, 82%).

Synthesis Example 3: Synthesis of Compound 3

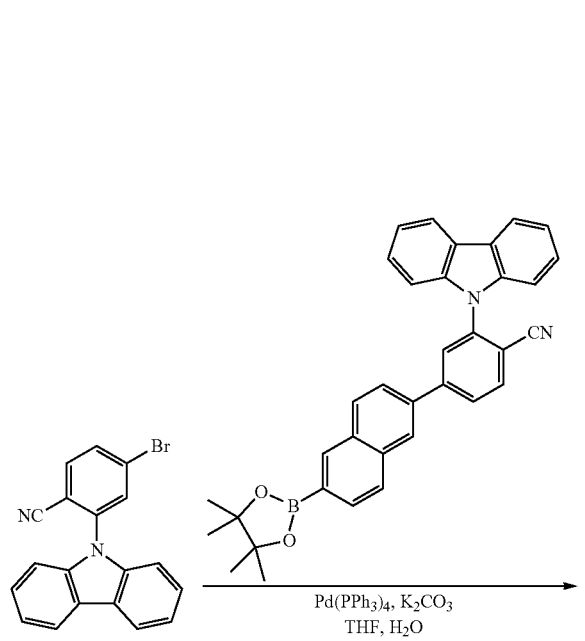

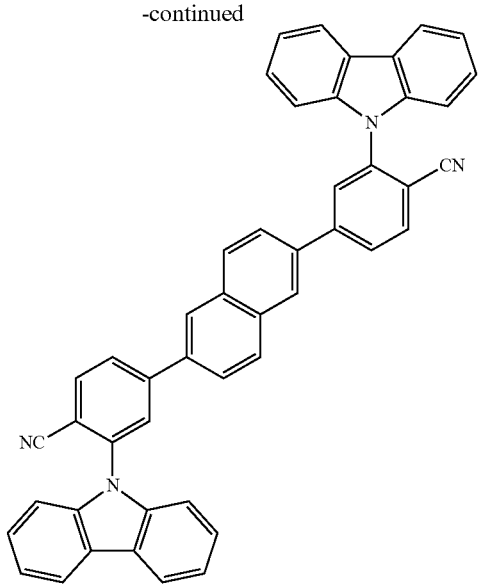

In a nitrogen atmosphere, after 4-bromo-2-(9H-carbazol-9-yl)benzonitrile (5.00 g, 0.0144 mol) and 2-(9H-carbazol-9-yl)-4-(6-(4,4,5,5-tetramethyl-1,3,2-dioxaborolan-2-yl)naphthalen-2-yl)benzonitrile (8.99 g, 0.0173 mol) were completely dissolved in 200 mL of THF in a 500 mL round-bottom flask, a 2M $K_2CO_3$ aqueous solution (100 mL) was added thereto, $Pd(PPh_3)_4$ (0.50 g, 3 mol %) was added thereto, and the mixture was refluxed for 8 hours. After the reaction was terminated in $H_2O$, extraction was performed using $CH_2Cl_2$, followed by drying using anhydrous $MgSO_4$, and column chromatography was performed on the resultant using a solvent of $CH_2Cl_2$:n-hexane at a volume ratio of 1:10 to thereby prepare Compound 3 (8.75 g, 92%).

Synthesis Example 4: Synthesis of Compound 4

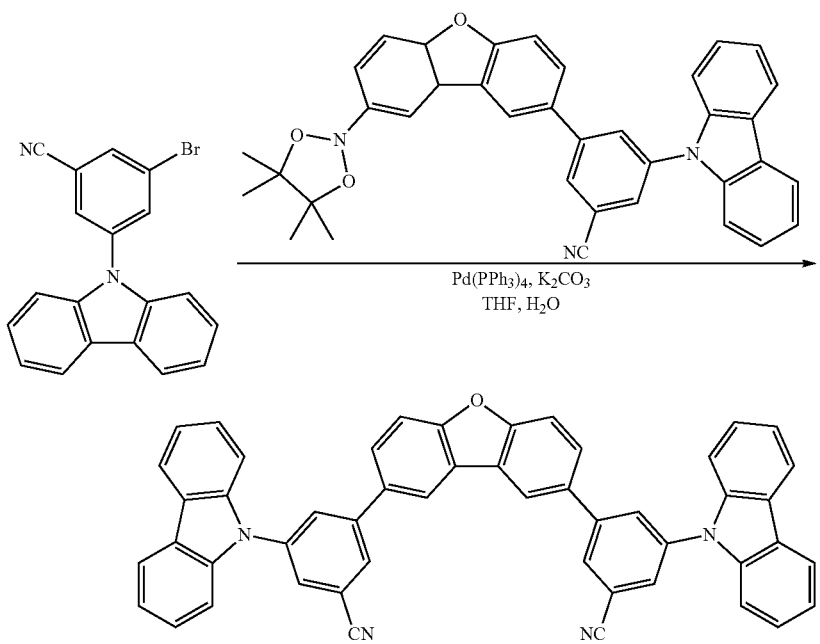

In a nitrogen atmosphere, after 3-bromo-5-(9H-carbazol-9-yl)benzonitrile (5.00 g, 0.0144 mol) and 3-(9H-carbazol-9-yl)-5-(8-(4,4,5,5-tetramethyl-1,3,2-dioxaborolan-2-yl)-5a,9a-dihydrodibenzo[b,d]furan-2-yl)benzonitrile (9.72 g, 0.0173 mol) were completely dissolved in 200 mL of THF in a 500 mL round-bottom flask, a 2M $K_2CO_3$ aqueous solution (100 mL) was added thereto, $Pd(PPh_3)_4$ (0.50 g, 3 mol %) was added thereto, and the mixture was refluxed for 8 hours. After the reaction was terminated in $H_2O$, extraction was performed using $CH_2Cl_2$, followed by drying using anhydrous $MgSO_4$, and column chromatography was performed on the resultant using a solvent of $CH_2Cl_2$:n-hexane at a volume ratio of 1:10 to thereby prepare Compound 4 (8.58 g, 85%).

Synthesis Example 5: Synthesis of Compound 5

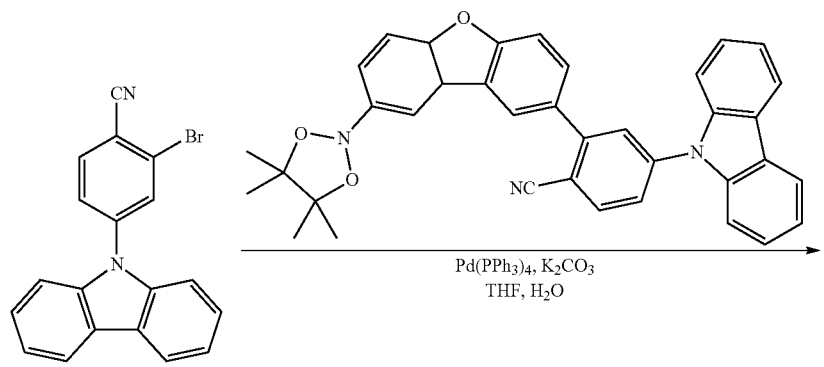

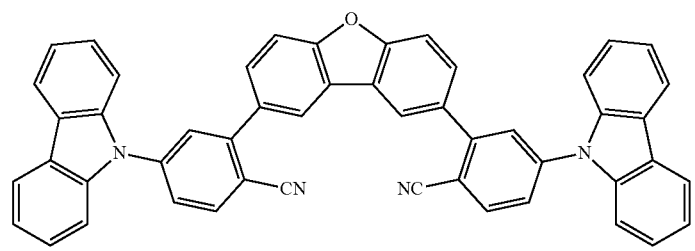

In a nitrogen atmosphere, after 2-bromo-4-(9H-carbazol-9-yl)benzonitrile (5.00 g, 0.0144 mol) and 4-(9H-carbazol-9-yl)-2-(8-(4,4,5,5-tetramethyl-1,3,2-dioxaborolan-2-yl)-5a,9a-dihydrodibenzo[b,d]furan-2-yl)benzonitrile (9.72 g, 0.0173 mol) were completely dissolved in 200 mL of THF in a 500 mL round-bottom flask, a 2M $K_2CO_3$ aqueous solution (100 mL) was added thereto, $Pd(PPh_3)_4$ (0.50 g, 3 mol %) was added thereto, and the mixture was refluxed for 8 hours. After the reaction was terminated in $H_2O$, extraction was performed using $CH_2Cl_2$, followed by drying using anhydrous $MgSO_4$, and column chromatography was performed on the resultant using a solvent of $CH_2Cl_2$:n-hexane at a volume ratio of 1:10 to thereby prepare Compound 5 (7.88 g, 78%).

Synthesis Example 6: Synthesis of Compound 6

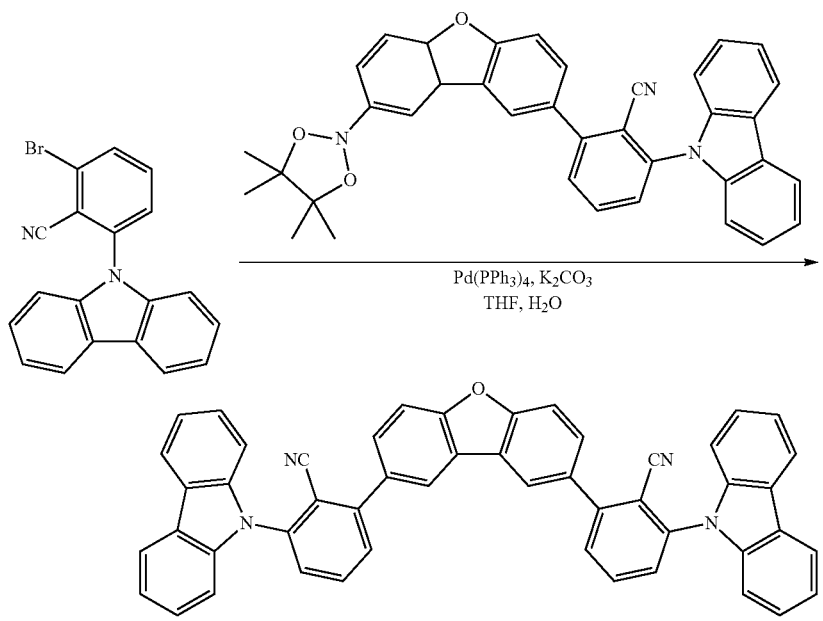

In a nitrogen atmosphere, after 2-bromo-6-(9H-carbazol-9-yl)benzonitrile (5.00 g, 0.0144 mol) and 2-(9H-carbazol-9-yl)-6-(8-(4,4,5,5-tetramethyl-1,3,2-dioxaborolan-2-yl)-5a,9a-dihydrodibenzo[b,d]furan-2-yl)benzonitrile (9.72 g, 0.0173 mol) were completely dissolved in 200 mL of THF in a 500 mL round-bottom flask, a 2M $K_2CO_3$ aqueous solution (100 mL) was added thereto, Pd(PPh$_3$)$_4$ (0.50 g, 3 mol %) was added thereto, and the mixture was refluxed for 8 hours. After the reaction was terminated in $H_2O$, extraction was performed using $CH_2Cl_2$, followed by drying using anhydrous $MgSO_4$, and column chromatography was performed on the resultant using a solvent of $CH_2Cl_2$:n-hexane at a volume ratio of 1:10 to thereby prepare Compound 6 (7.56 g, 75%).

Synthesis Example 7: Synthesis of Compound 7

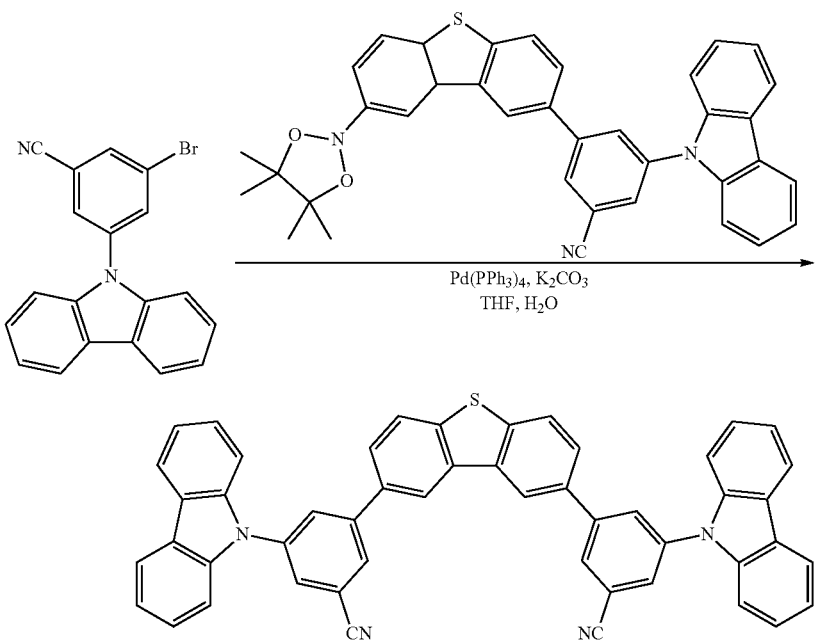

In a nitrogen atmosphere, after 3-bromo-5-(9H-carbazol-9-yl)benzonitrile (5.00 g, 0.0144 mol) and 3-(9H-carbazol-9-yl)-5-(8-(4,4,5,5-tetramethyl-1,3,2-dioxaborolan-2-yl)-5a,9a-dihydrodibenzo[b,d]thiophen-2-yl)benzonitrile (10.0 g, 0.0173 mol) were completely dissolved in 200 mL of THF in a 500 mL round-bottom flask, a 2M K$_2$CO$_3$ aqueous solution (100 mL) was added thereto, Pd(PPh$_3$)$_4$ (0.50 g, 3 mol %) was added thereto, and the mixture was refluxed for 8 hours. After the reaction was terminated in H$_2$O, extraction was performed using CH$_2$Cl$_2$, followed by drying using anhydrous MgSO$_4$, and column chromatography was performed on the resultant using a solvent of CH$_2$Cl$_2$:n-hexane at a volume ratio of 1:10 to thereby prepare Compound 7 (9.30 g, 90%).

Synthesis Example 8: Synthesis of Compound 8

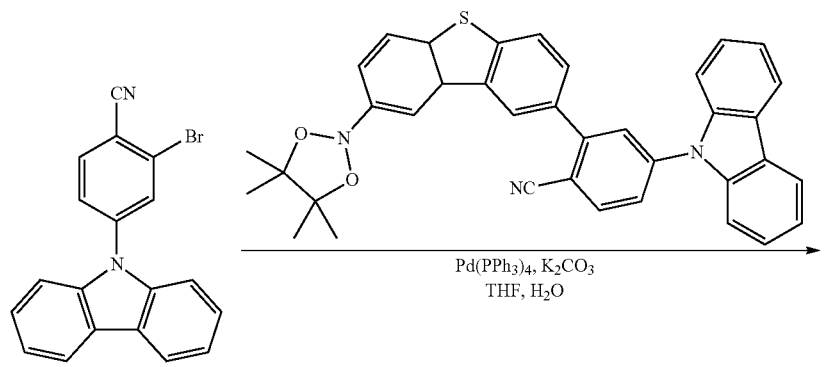

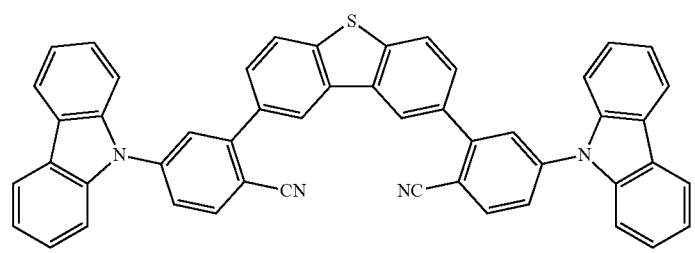

In a nitrogen atmosphere, after 2-bromo-4-(9H-carbazol-9-yl)benzonitrile (5.00 g, 0.0144 mol) and 4-(9H-carbazol-9-yl)-2-(8-(4,4,5,5-tetramethyl-1,3,2-dioxaborolan-2-yl)-5a,9a-dihydrodibenzo[b,d]thiophen-2-yl)benzonitrile (10.0 g, 0.0173 mol) were completely dissolved in 200 mL of THF in a 500 mL round-bottom flask, a 2M K$_2$CO$_3$ aqueous solution (100 mL) was added thereto, Pd(PPh$_3$)$_4$ (0.50 g, 3 mol %) was added thereto, and the mixture was refluxed for 8 hours. After the reaction was terminated in H$_2$O, extraction was performed using CH$_2$Cl$_2$, followed by drying using anhydrous MgSO$_4$, and column chromatography was performed on the resultant using a solvent of CH$_2$Cl$_2$:n-hexane at a volume ratio of 1:10 to thereby prepare Compound 8 (8.88 g, 86%).

Synthesis Example 9: Synthesis of Compound 9

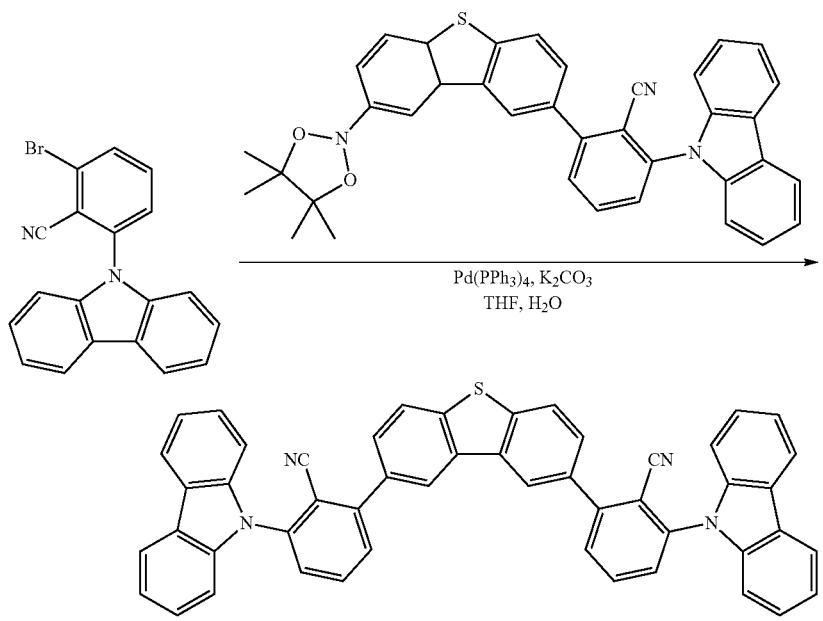

In a nitrogen atmosphere, after 2-bromo-6-(9H-carbazol-9-yl)benzonitrile (5.00 g, 0.0144 mol) and 2-(9H-carbazol-9-yl)-6-(8-(4,4,5,5-tetramethyl-1,3,2-dioxaborolan-2-yl)-5a,9a-dihydrodibenzo[b,d]thiophen-2-yl)benzonitrile (10.0 g, 0.0173 mol) were completely dissolved in 200 mL of THF in a 500 mL round-bottom flask, a 2M $K_2CO_3$ aqueous solution (100 mL) was added thereto, $Pd(PPh_3)_4$ (0.50 g, 3 mol %) was added thereto, and the mixture was refluxed for 8 hours. After the reaction was terminated in $H_2O$, extraction was performed using $CH_2Cl_2$, followed by drying using anhydrous $MgSO_4$, and column chromatography was performed on the resultant using a solvent of $CH_2Cl_2$:n-hexane at a volume ratio of 1:10 to thereby prepare Compound 9 (7.95 g, 77). $^1H$ NMR and MS/FAB of the compounds synthesized according to Synthesis Examples 1 to 9 are shown in Table 2. Synthesis methods for other compounds than the compounds shown in Table 2 may be easily recognized by those skilled in the technical field by referring to the synthesis paths and source material materials described above.

TABLE 2

| Compound | $^1H$ NMR (δ) | MS/FAB Calc. | MS/FAB Found |
|---|---|---|---|
| 1 | 8.55-8.49(4H, m), 8.19(2H, d), 7.97-7.94(4H, m), 7.81-7.73(4H, m), 7.61-7.32(10H, m), 7.20-7.16(4H, m) | 660 | 660.2314 |
| 2 | 8.55(2H, d), 8.39(2H, s), 8.19(2H, d), 8.01-7.93(8H, m), 7.61-7.50(6H, m), 7.40-7.35(4H, m), 7.20-7.16(4H, m) | 660 | 660.2314 |
| 3 | 8.55(2H, d), 8.39(2H, s), 8.19(2H, d), 7.97-7.93(6H, m), 7.80(2H, d), 7.61-7.50(6H, m), 7.40-7.35(4H, m), 7.20-7.16(4H, m) | 660 | 660.2314 |
| 4 | 8.55-8.49(4H, m), 8.19(2H, d), 7.97-7.73(12H, m), 7.58-7.50(4H, m), 7.35(2H, t), 7.20-7.16(4H, m) | 700 | 700.2263 |
| 5 | 8.55(2H, d), 8.39(2H, s), 8.19(2H, d), 8.01-7.79(12H, m), 7.58-7.50(4H, m), 7.35(2H, t), 7.20-7.16(4H, m) | 700 | 700.2263 |
| 6 | 8.55(2H, d), 8.19(2H, d), 8.01-7.79(14H, m), 7.58-7.50(4H, m), 7.35(2H, t), 7.20-7.16(4H, m) | 700 | 700.2263 |
| 7 | 8.55-8.49(4H, m), 8.19-8.12(6H, m), 7.99-7.94(4H, m), 7.81(2H, s), 7.73(2H, s), 7.58-7.50(4H, m), 7.35(2H, t), 7.20-7.16(4H, m) | 716 | 716.2035 |
| 8 | 8.55(2H, d), 8.39(2H, s), 8.19-8.12(6H, m), 8.01-7.93(8H, m), 7.58-7.50(4H, m), 7.35(2H, t), 7.20-7.16(4H, m) | 716 | 716.2035 |
| 9 | 8.55(2H, d), 8.19-8.12(6H, m), 8.01-7.91(10H, m), 7.58-7.50(4H, m), 7.35(2H, t), 7.20-7.16(4H, m) | 716 | 716.2035 |

Evaluation Example 1

Table 3 below shows the evaluation results of the characteristics of Compounds 1 to 9, Compounds a to d, DPTPCz, and CPCBPTz. In the evaluation results below, the HOMO and LUMO energy levels of a material were measured by DPV, and T1 and SI were measured in a solution state from a PL spectrum by using LS-55 of Perkin Elmer Inc., as described above.

TABLE 3

| Host type | HOMO (eV) | LUMO (eV) | S1 (eV) | T1 (eV) |
|---|---|---|---|---|
| DPTPCz | −5.5 | −1.9 | 3.1 | 2.9 |
| CPCBPTz | −5.5 | −2.7 | 3.0 | 2.7 |
| Compound 1 | −5.6 | −2.4 | 3.0 | 2.5 |
| Compound 2 | −5.6 | −2.5 | 3.1 | 2.5 |
| Compound 3 | −5.6 | −2.4 | 3.0 | 2.5 |
| Compound 4 | −5.7 | −2.5 | 3.1 | 2.9 |
| Compound 5 | −5.7 | −2.4 | 3.0 | 2.8 |
| Compound 6 | −5.7 | −2.5 | 3.1 | 2.9 |
| Compound 7 | −5.8 | −2.4 | 3.0 | 2.8 |
| Compound 8 | −5.8 | −2.5 | 3.1 | 2.9 |
| Compound 9 | −5.8 | −2.4 | 3.0 | 2.8 |
| Compound a | −5.7 | −2.4 | 3.2 | 3.1 |
| Compound b | −5.9 | −2.1 | 3.1 | 2.8 |
| Compound c | −6.0 | −2.2 | 3.1 | 2.8 |
| Compound d | −5.5 | −1.9 | 3.0 | 2.4 |

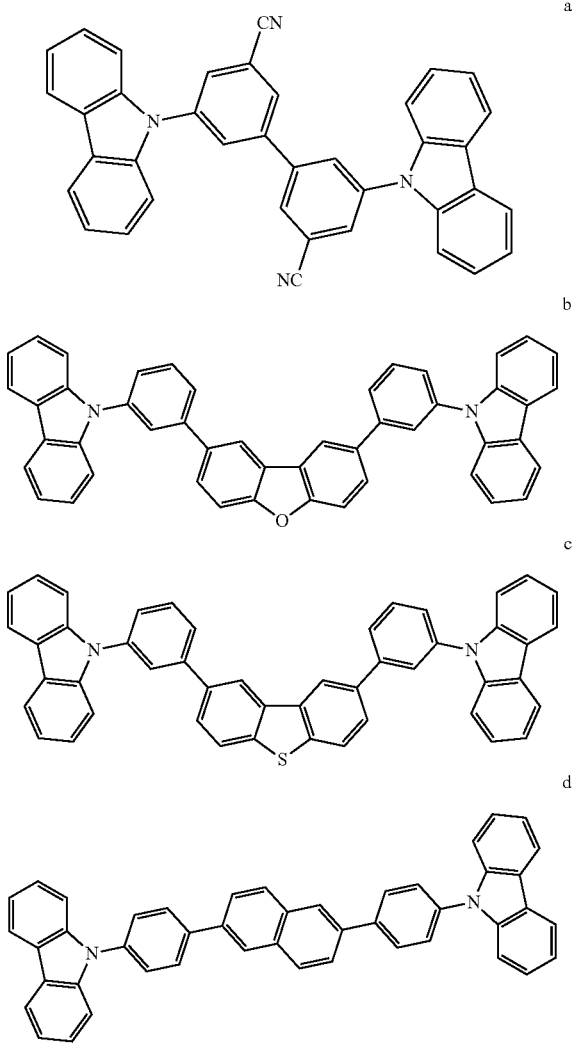

a b c d

Examples 1 to 4: Single Device Examples

Fluorescent Example

As an anode, a Corning 15 Ω/cm² (1,200 Å) ITO glass substrate was cut to a size of 50 mm×50 mm×0.7 mm, sonicated with isopropyl alcohol and pure water each for 5 minutes, and cleaned by exposure to ultraviolet rays and ozone for 30 minutes. The ITO glass substrate was provided to a vacuum deposition apparatus.

HATCN was vacuum-deposited on the anode formed on the ITO glass substrate to form a hole injection layer having a thickness of 100 Å, and NPB was vacuum-deposited on the hole injection layer to form a hole transport layer having a thickness of 1,200 Å. mCBP was vacuum-deposited on the hole transport layer to form an electron blocking layer having a thickness of 50 Å.

Compound FBH as a host and Compound FBD as a dopant were co-deposited at a weight ratio of 99:1 on the electron blocking layer to form an emission layer having a thickness of 200 Å.

Subsequently, T2T was deposited on the emission layer to form a hole blocking layer having a thickness of 50 Å, TPM-TAZ and Liq were deposited at a weight ratio of 5:5 on the hole blocking layer to form an electron transport layer having a thickness of 300 Å, Yb was deposited on the electron transport layer to form an electron injection layer having a thickness of 10 Å, Ag—Mg (weight ratio of 90:10) was vacuum-deposited to form an electrode having a thickness of 100 Å, and Compound CPL was vacuum-deposited on the electrode to form a capping layer having a thickness of 700 Å, thereby completing the manufacture of a light-emitting device.

Phosphorescent Example 1

A light-emitting device was manufactured in the same manner as in Fluorescent Example, except that, in forming an emission layer, for use as a host, DPTPCz as Host A and CPCBPTz as Host B were used at a weight ratio of 7:3 instead of FBH, Ir(ppy)₃ was used as a dopant instead of FBD, and the host and the dopant were used at a weight ratio of 90:10 to form an emission layer having a thickness of 300 Å.

Examples 1-1 to 1-9 and Comparative Examples 1-1 to 1-4

Light-emitting devices were manufactured in the same manner as in Phosphorescent Example 1, except that, in forming an emission layer, corresponding compounds in Table 4 were used as Host B instead of CPCBPTz.

Phosphorescent Example 2

A light-emitting device was manufactured in the same manner as in Phosphorescent Example 1, except that, in forming an emission layer, for use as a host, DPTPCz as Host A and CPCBPTz as Host B were used at a weight ratio of 5:5.

Examples 2-1 to 2-9 and Comparative Examples 2-1 to 2-4

Light-emitting devices were manufactured in the same manner as in Phosphorescent Example 2, except that, in forming an emission layer, corresponding compounds in Table 5 were used as Host B instead of CPCBPTz.

Phosphorescent Example 3

A light-emitting device was manufactured in the same manner as in Phosphorescent Example 1, except that, in forming an emission layer, for use as a host, DPTPCz as Host A and CPCBPTz as Host B were used at a weight ratio of 3:7.

Examples 3-1 to 3-9 and Comparative Examples 3-1 to 3-4

Light-emitting devices were manufactured in the same manner as in Phosphorescent Example 3, except that, in forming an emission layer, corresponding compounds in Table 6 were used as Host B instead of CPCBPTz.

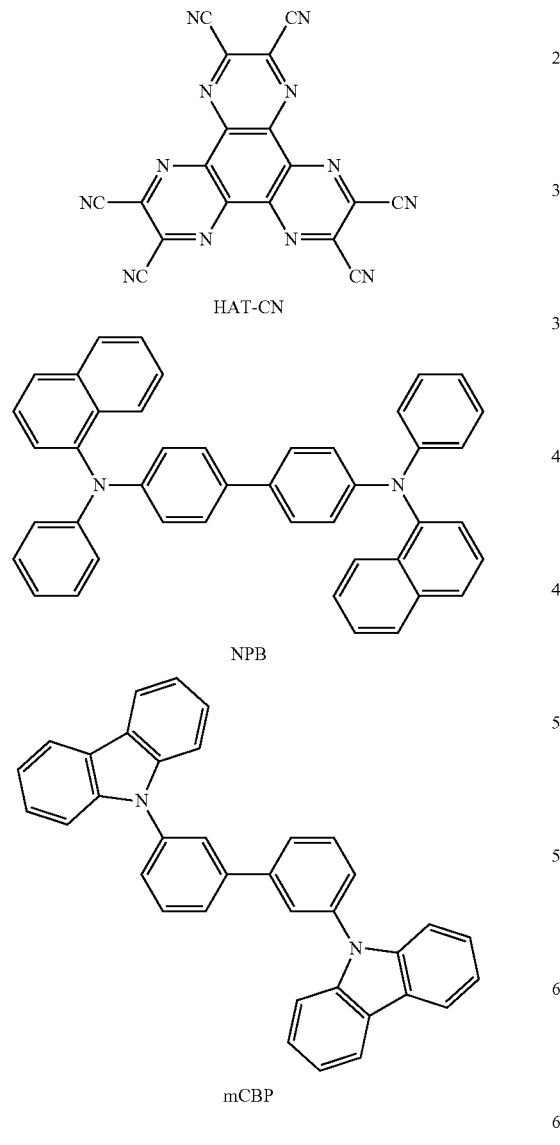

HAT-CN

NPB mCBP

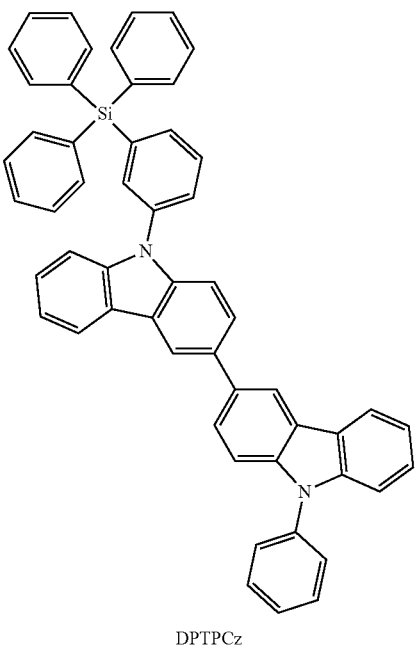

DPTPCz

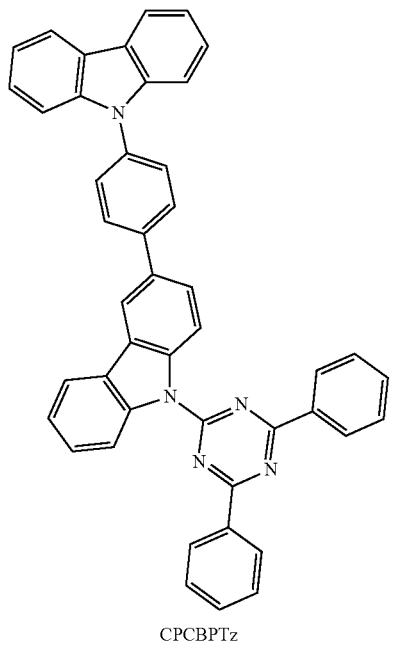

CPCBPTz

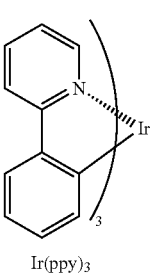

Ir(ppy)₃

-continued

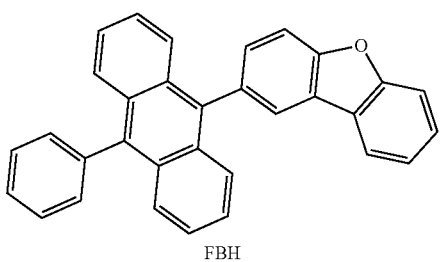
FBH

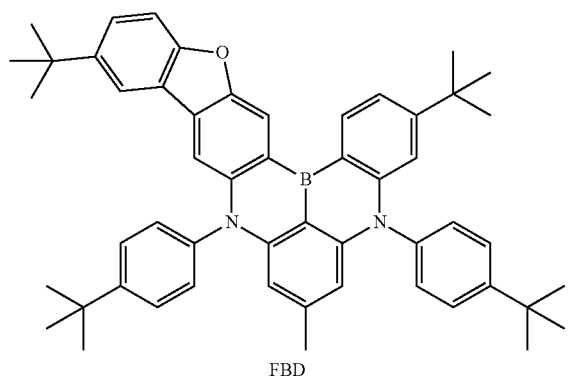
FBD

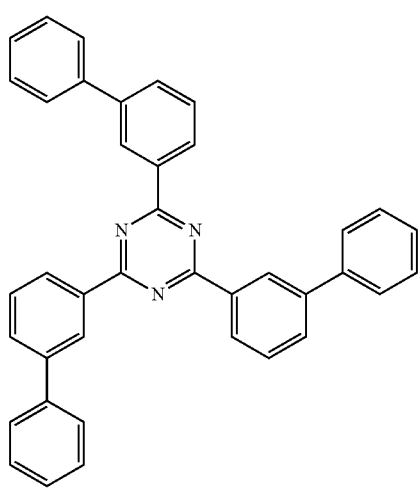
T2T

-continued

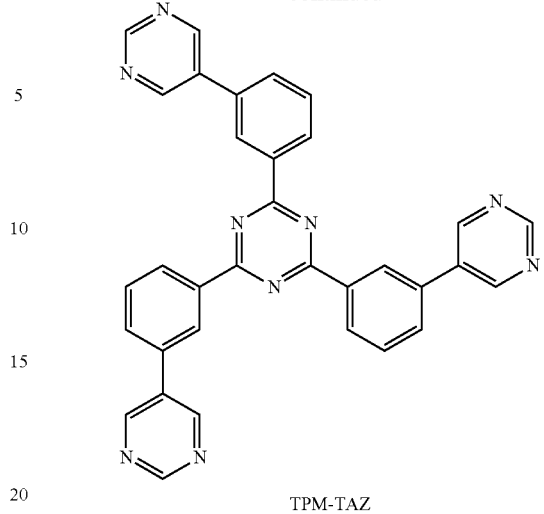
TPM-TAZ

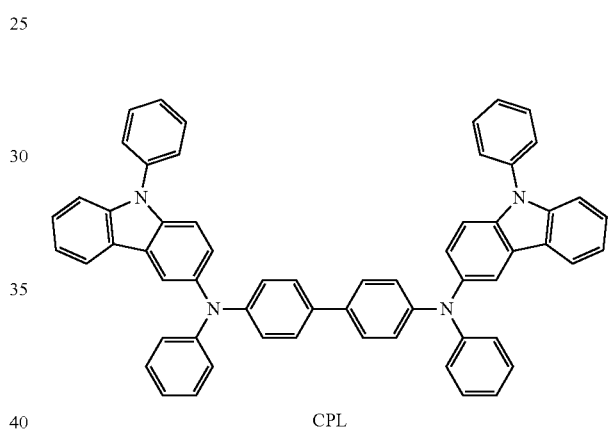
CPL

Evaluation Example 2

The characteristics of the light-emitting devices manufactured according to Fluorescent Example, Phosphorescent Examples 1 to 3, Examples 1-1 to 1-9, 2-1 to 2-9, and 3-1 to 3-9 and Comparative Examples 1-1 to 1-4, 2-1 to 2-4, and 3-1 to 3-4 were evaluated by measuring the driving voltage and lifespan at the current density of 10 mA/cm$^2$. The driving voltage of a light-emitting device was measured by using a source meter (Keithley Instrument Inc., 2400 series), and the lifespan was measured as the time taken when luminance reaches 97% of the initial luminance at the current density of 10 mA/cm$^2$. The luminescence efficiency was measured at the current densities of 0.1 mA/cm$^2$ and 10 mA/cm$^2$ by using the luminescence efficiency measurement device C9920-2-12 of Hamamatsu Photonics Inc. In evaluating the luminescence efficiency, the current density was measured by using a luminance meter that was calibrated for wavelength sensitivity, and relative values (%) of the maximum efficiency at the current densities of 0.1 mA/cm$^2$ and 10 mA/cm$^2$ of an Example are shown together. Tables 4 to 6 below show the evaluation results of the characteristics of the light-emitting devices.

TABLE 4

| | Host A | Host B | Driving voltage (V) | Efficiency @ 0.1 mA/cm² (Cd/A)/(%) | | Efficiency @ 10 mA/cm² (Cd/A)/(%) | | Lifespan ($T_{97}$ @ 10 mA/cm²) |
|---|---|---|---|---|---|---|---|---|
| Fluorescent Example | FBH | — | 3.8 | 8.3 | 83% | 9.8 | 98% | 180 |
| Phosphorescent Example 1 | DPTPCz | CPCBPTz | 3.7 | 20 | 100% | 17.6 | 88% | 650 |
| Example 1-1 | DPTPCz | Compound 1 | 3.9 | 18.4 | 83% | 21.1 | 95% | 645 |
| Example 1-2 | DPTPCz | Compound 2 | 4 | 17 | 82% | 20.3 | 98% | 640 |
| Example 1-3 | DPTPCz | Compound 3 | 3.9 | 16.2 | 83% | 19.1 | 98% | 645 |
| Example 1-4 | DPTPCz | Compound 4 | 4.1 | 15.7 | 84% | 18.5 | 99% | 640 |
| Example 1-5 | DPTPCz | Compound 5 | 4 | 16.1 | 80% | 20.1 | 100% | 660 |
| Example 1-6 | DPTPCz | Compound 6 | 3.9 | 19.2 | 80% | 23.3 | 97% | 650 |
| Example 1-7 | DPTPCz | Compound 7 | 4 | 16.5 | 83% | 19.5 | 98% | 640 |
| Example 1-8 | DPTPCz | Compound 8 | 3.9 | 17.7 | 84% | 20.6 | 98% | 656 |
| Example 1-9 | DPTPCz | Compound 9 | 4.1 | 17.9 | 80% | 22.2 | 99% | 630 |
| Comparative Example 1-1 | DPTPCz | Compound a | 4.2 | 17.5 | 80% | 19.2 | 94% | 480 |
| Comparative Example 1-2 | DPTPCz | Compound b | 5.8 | 15.3 | 95% | 12.0 | 78% | 10 |
| Comparative Example 1-3 | DPTPCz | Compound c | 5.9 | 16.2 | 98% | 12.5 | 77% | 10 |
| Comparative Example 1-4 | DPTPCz | Compound d | 6.1 | 12.1 | 98% | 8.8 | 72% | 5 |

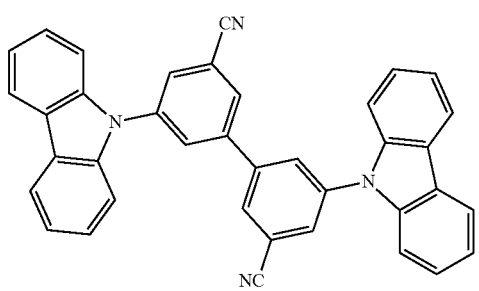

a

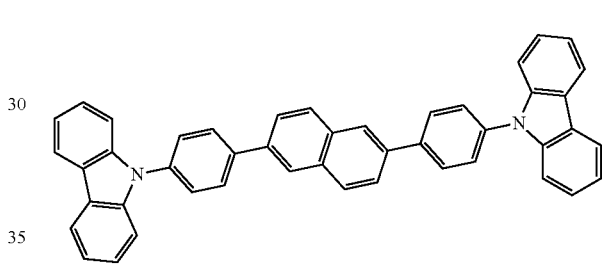

-continued d

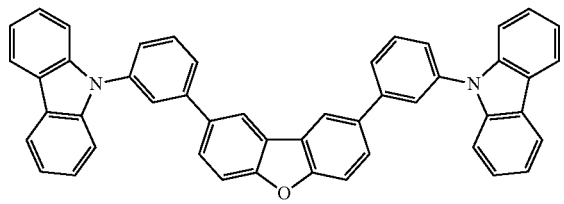

b

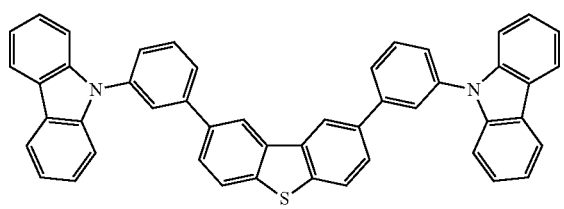

c

Referring to Table 4, it is confirmed that the light-emitting devices of Examples 1-1 to 1-9 have a driving voltage and lifespan similar to those of the light-emitting device of Phosphorescent Example 1, while showing a luminescence efficiency trend similar to that of the light-emitting device of Fluorescent Example. It is confirmed that the light-emitting devices of Examples 1-1 to 1-9 have a low driving voltage, high luminescence efficiency, and a long lifespan compared to the light-emitting devices of Comparative Examples 1-1 to 1-4, and have efficiency characteristics with respect to each current density similar to those of the light-emitting device of Fluorescent Example.

TABLE 5

| | Host A | Host B | Driving voltage (V) | Efficiency @ 0.1 mA/cm² (Cd/A)/(%) | | Efficiency @ 10 mA/cm² (Cd/A)/(%) | | Lifespan ($T_{97}$ @ 10 mA/cm²) |
|---|---|---|---|---|---|---|---|---|
| Fluorescent Example | FBH | — | 3.8 | 8.3 | 83% | 9.8 | 98% | 180 |
| Phosphorescent Example 2 | DPTPCz | CPCBPTz | 3.6 | 19.8 | 100% | 16.6 | 84% | 650 |

TABLE 5-continued

|  | Host A | Host B | Driving voltage (V) | Efficiency @ 0.1 mA/cm² (Cd/A)/(%) | Efficiency @ 10 mA/cm² (Cd/A)/(%) | Lifespan (T₉₇ @ 10 mA/cm²) |
|---|---|---|---|---|---|---|
| Example 2-1 | DPTPCz | Compound 1 | 3.6 | 20.6  88% | 21.1  90% | 630 |
| Example 2-2 | DPTPCz | Compound 2 | 3.8 | 19.6  89% | 20.3  92% | 620 |
| Example 2-3 | DPTPCz | Compound 3 | 3.7 | 18.5  90% | 19.1  93% | 625 |
| Example 2-4 | DPTPCz | Compound 4 | 4.0 | 17.7  89% | 18.5  93% | 600 |
| Example 2-5 | DPTPCz | Compound 5 | 3.9 | 19.5  90% | 20.1  93% | 595 |
| Example 2-6 | DPTPCz | Compound 6 | 3.8 | 23.0  91% | 23.3  92% | 600 |
| Example 2-7 | DPTPCz | Compound 7 | 3.9 | 18.5  89% | 19.5  94% | 590 |
| Example 2-8 | DPTPCz | Compound 8 | 3.8 | 19.9  90% | 20.6  93% | 595 |
| Example 2-9 | DPTPCz | Compound 9 | 4.0 | 22.2  92% | 22.2  92% | 600 |
| Comparative Example 2-1 | DPTPCz | Compound a | 4.1 | 19.8  95% | 19.8  95% | 380 |
| Comparative Example 2-2 | DPTPCz | Compound b | 6.1 | 13.5  98% | 11.2  81% | 10 |
| Comparative Example 2-3 | DPTPCz | Compound c | 6.2 | 13.2  98% | 11.5  81% | 10 |
| Comparative Example 2-4 | DPTPCz | Compound d | 6.2 | 11.5  98% | 9.8  83% | 5 |

Referring to Table 5, it is confirmed that the light-emitting devices of Examples 2-1 to 2-9 have a driving voltage and lifespan similar to those of the light-emitting device of Phosphorescent Example 2, while showing a luminescence efficiency trend similar to that of the light-emitting device of Fluorescent Example. It is confirmed that the light-emitting devices of Examples 2-1 to 2-9 have a low driving voltage, high luminescence efficiency, and a long lifespan compared to the light-emitting devices of Comparative Examples 2-1 to 2-4, and have efficiency characteristics with respect to each current density similar to those of the light-emitting device of Fluorescent Example.

Phosphorescent Example 4 and Examples 4-1 to 4-3

Light-emitting devices were manufactured in the same manner as in Fluorescent Example, except that, in forming an emission layer, corresponding hosts and dopants shown in Table 7 were used at a weight ratio of 90:10 to corresponding thicknesses shown in Table 7.

TABLE 6

|  | Host A | Host B | Driving voltage (V) | Efficiency @ 0.1 mA/cm² (Cd/A)/(%) | Efficiency @ 10 mA/cm² (Cd/A)/(%) | Lifespan (T₉₇ @ 10 mA/cm²) |
|---|---|---|---|---|---|---|
| Fluorescent Example | FBH | — | 3.8 | 8.3  83% | 9.8  98% | 180 |
| Phosphorescent Example 3 | DPTPCz | CPCBPTz | 3.5 | 19.0  100% | 16.2  85% | 650 |
| Example 3-1 | DPTPCz | Compound 1 | 3.5 | 21.3  93% | 21.1  92% | 590 |
| Example 3-2 | DPTPCz | Compound 2 | 3.7 | 20.1  92% | 20.3  93% | 580 |
| Example 3-3 | DPTPCz | Compound 3 | 3.6 | 19.3  93% | 19.1  92% | 588 |
| Example 3-4 | DPTPCz | Compound 4 | 3.9 | 18.5  90% | 18.5  90% | 560 |
| Example 3-5 | DPTPCz | Compound 5 | 3.8 | 19.9  92% | 20.1  93% | 580 |
| Example 3-6 | DPTPCz | Compound 6 | 3.7 | 23.1  93% | 23.3  94% | 570 |
| Example 3-7 | DPTPCz | Compound 7 | 3.8 | 19.3  92% | 19.5  93% | 585 |
| Example 3-8 | DPTPCz | Compound 8 | 3.7 | 19.7  90% | 20.6  94% | 600 |
| Example 3-9 | DPTPCz | Compound 9 | 3.9 | 21.7  93% | 22.2  95% | 595 |
| Comparative Example 3-1 | DPTPCz | Compound a | 4.0 | 18.8  95% | 17.6  88% | 320 |
| Comparative Example 3-2 | DPTPCz | Compound b | 6.2 | 11.5  100% | 8.8  77% | 10 |
| Comparative Example 3-3 | DPTPCz | Compound c | 6.2 | 11.8  100% | 8.6  73% | 10 |
| Comparative Example 3-4 | DPTPCz | Compound d | 6.3 | 8.8  100% | 6.9  78% | 4 |

Referring to Table 6, it is confirmed that the light-emitting devices of Examples 3-1 to 3-9 have a driving voltage and lifespan similar to those of the light-emitting device of Phosphorescent Example 3, while showing a luminescence efficiency trend similar to that of the light-emitting device of Fluorescent Example. It is confirmed that the light-emitting devices of Examples 3-1 to 3-9 have a low driving voltage, high luminescence efficiency, and a long lifespan compared to the light-emitting devices of Comparative Examples 3-1

TABLE 7

|  | Host | | | Dopant | Emission layer thickness (Å) |
|---|---|---|---|---|---|
|  | Host A | Host B | Host weight ratio (A:B) | | |
| Fluorescent Example | FBH | — | 1 | FBD | 200 |

TABLE 7-continued

| | Host | | | Dopant | Emission layer thickness (Å) |
|---|---|---|---|---|---|
| | Host A | Host B | Host weight ratio (A:B) | | |
| Phosphorescent Example 4 | DPTPCz | CPCBPTz | 7:3 | Irppy$_3$ | 300 |
| Example 4-1 | DPTPCz | Compound 2 | 5:5 | Irppy$_3$ | 300 |
| Example 4-2 | DPTPCz | Compound 2 | 6:4 | Irppy$_3$ | 300 |
| Example 4-3 | DPTPCz | Compound 2 | 7:3 | Irppy$_3$ | 300 |

Evaluation Example 3

(Evaluation Method)

The characteristics of the light-emitting devices manufactured according to Fluorescent Example, Phosphorescent Example 4, and Examples 4-1 to 4-3 were evaluated by measuring the normalized luminescence efficiency according to a current density change using the luminescence efficiency measurement device C9920-2-12 of Hamamatsu Photonics Inc. In evaluating the luminescence efficiency, the current density was measured by using a luminance meter that was calibrated for wavelength sensitivity, and the evaluation results of the characteristics of the light-emitting devices are shown in FIGS. 4 and 5.

(Evaluation Results)

FIG. 4 is a diagram showing normalized luminescence efficiency according to current density, with respect to light-emitting devices of Fluorescent Example, Phosphorescent Example 4, and Examples 4-1 to 4-3. FIG. 5 is a diagram showing normalized luminescence efficiency at certain current densities (0.1 mA/cm$^2$, 1 mA/cm$^2$, 10 mA/cm$^2$, and 100 mA/cm$^2$), with respect to the light-emitting devices of Fluorescent Example, Phosphorescent Example 4, and Examples 4-1 to 4-3.

Referring to FIGS. 4 and 5, it can be seen that through Examples 4-1 to 4-3, the luminescence efficiency trend according to the current density of a light-emitting device changes based on the weight ratio of the heterocyclic compound represented by Formula 1. It can be seen that the light-emitting device of Example 4-3 has a luminescence efficiency trend similar to that of the light-emitting device of Fluorescent Example.

Examples 5 and 6: Tandem Device Examples

Fluorescent Example 2 (BBB Structure)

[Formation of First Electrode]

As a substrate and an anode, a 15 Ω/cm$^2$ (120 nm) ITO glass substrate from Corning Inc, was cut to a size of 50 mm×50 mm×0.5 mm, sonicated with acetone, isopropyl alcohol, and pure water each for 15 minutes, and cleaned by exposure to ultraviolet rays and ozone for 30 minutes. The ITO glass substrate was provided to a vacuum deposition apparatus to form a first electrode.

[Formation of First Light-Emitting Unit]

HATCN was deposited on the first electrode to form a hole injection layer having a thickness of 100 Å, NPB was deposited on the hole injection layer to form a hole transport layer having a thickness of 200 Å, and TCTA was deposited on the hole transport layer to form an electron blocking layer having a thickness of 50 Å.

Compound FBH as a host and Compound FBD as a dopant were co-deposited at a weight ratio of 99:1 on the electron blocking layer to form an emission layer having a thickness of 200 Å.

T2T was deposited on the emission layer to form a hole blocking layer having a thickness of 50 Å, and TPM-TAZ and Liq were deposited at a weight ratio of 5:5 on the hole blocking layer to form an electron transport layer having a thickness of 250 Å, thereby forming a first light-emitting unit.

[Formation of First Charge Generation Layer]

nCGL and Li (1.5 wt %) were co-deposited on the first light-emitting unit to form a first charge generation layer having a thickness of 50 Å.

[Formation of Second Light-Emitting Unit]

HATCN was deposited on the first charge generation layer to form a hole injection layer having a thickness of 100 Å, NPB was deposited on the hole injection layer to form a hole transport layer having a thickness of 200 Å, and TCTA was deposited on the hole transport layer to form an electron blocking layer having a thickness of 50 Å.

Compound FBH as a host and Compound FBD as a dopant were co-deposited at a weight ratio of 99:1 on the electron blocking layer to form an emission layer having a thickness of 200 Å.

T2T was deposited on the emission layer to form a hole blocking layer having a thickness of 50 Å, and TPM-TAZ and Liq were deposited at a weight ratio of 5:5 on the hole blocking layer to form an electron transport layer having a thickness of 250 Å, thereby forming a second light-emitting unit.

[Formation of Second Charge Generation Layer]

nCGL and Li (1.5 wt %) were co-deposited on the second light-emitting unit to form a second charge generation layer having a thickness of 50 Å.

[Formation of Third Light-Emitting Unit]

HATCN was deposited on the second charge generation layer to form a hole injection layer having a thickness of 100 Å, NPB was deposited on the hole injection layer to form a hole transport layer having a thickness of 200 Å, and TCTA was deposited on the hole transport layer to form an electron blocking layer having a thickness of 50 Å.

Compound FBH as a host and Compound FBD as a dopant were co-deposited at a weight ratio of 99:1 on the electron blocking layer to form an emission layer having a thickness of 200 Å.

T2T was deposited on the emission layer to form a hole blocking layer having a thickness of 50 Å, and TPM-TAZ and Liq were deposited at a weight ratio of 5:5 on the hole blocking layer to form an electron transport layer having a thickness of 250 Å, thereby forming a third light-emitting unit.

[Formation of Second Electrode and Capping Layer]

Yb was deposited on the third light-emitting unit to form an electron injection layer having a thickness of 10 Å, Ag and Mg (10 wt %) were co-deposited on the electron injection layer to form a second electrode having a thickness of 120 Å, and Compound CPL was deposited on the second electrode to form a capping layer having a thickness of 500 Å, thereby completing the manufacture of a light-emitting device.

Phosphorescent Example 5-1 (BGB Structure)

A light-emitting device was manufactured in the same manner as in Fluorescent Example 2, except that, in forming an emission layer of a second light-emitting unit, for use as a host, DPTPCz as Host A and CPCBPTz as Host B were used at a weight ratio of 7:3 instead of FBH, Ir(ppy)$_3$ was used as a dopant instead of FBD, and the host and the dopant were used at a weight ratio of 90:10 to form an emission layer having a thickness of 300 Å.

Example 5-1-1 (BGB Structure)

A light-emitting device was manufactured in the same manner as in Phosphorescent Example 5-1, except that, in forming an emission layer of a second light-emitting unit, Compound 1 was used as Host B instead of CPCBPTz.

Example 5-1-2 (BGB Structure)

A light-emitting device was manufactured in the same manner as in Phosphorescent Example 5-1, except that, in forming an emission layer of a second light-emitting unit, Compound 9 was used as Host B instead of CPCBPTz.

Phosphorescent Example 5-2 (BBG Structure)

A light-emitting device was manufactured in the same manner as in Phosphorescent Example 5-1, except that, in forming an emission layer of a third light-emitting unit, for use as a host, DPTPCz as Host A and CPCBPTz as Host B were used at a weight ratio of 7:3 instead of FBH, Ir(ppy)$_3$ was used as a dopant instead of FBD, and the host and the dopant were used at a weight ratio of 90:10 to form an emission layer having a thickness of 300 Å.

Example 5-2-1 (BBG Structure)

A light-emitting device was manufactured in the same manner as in Phosphorescent Example 5-2, except that, in forming an emission layer of a third light-emitting unit, Compound 1 was used as Host B instead of CPCBPTz.

Example 5-1-2 (BBG Structure)

A light-emitting device was manufactured in the same manner as in Phosphorescent Example 5-2, except that, in forming an emission layer of a third light-emitting unit, Compound 9 was used as Host B instead of CPCBPTz.

Fluorescent Example 3 (BBBB Structure)

[Formation of First Electrode]

As a substrate and an anode, a 15 Ω/cm$^2$(120 nm) ITO glass substrate from Corning Inc, was cut to a size of 50 mm×50 mm×0.5 mm, sonicated with acetone, isopropyl alcohol, and pure water each for 15 minutes, and cleaned by exposure to ultraviolet rays and ozone for 30 minutes. The ITO glass substrate was provided to a vacuum deposition apparatus to form a first electrode.

[Formation of First Light-Emitting Unit]

HATCN was deposited on the first electrode to form a hole injection layer having a thickness of 100 Å, NPB was deposited on the hole injection layer to form a hole transport layer having a thickness of 200 Å, and TCTA was deposited on the hole transport layer to form an electron blocking layer having a thickness of 50 Å.

Compound FBH as a host and Compound FBD as a dopant were co-deposited at a weight ratio of 99:1 on the electron blocking layer to form an emission layer having a thickness of 200 Å.

T2T was deposited on the emission layer to form a hole blocking layer having a thickness of 50 Å, and TPM-TAZ and Liq were deposited at a weight ratio of 5:5 on the hole blocking layer to form an electron transport layer having a thickness of 250 Å, thereby forming a first light-emitting unit.

[Formation of First Charge Generation Layer]

nCGL and Li (1.5 wt %) were co-deposited on the first light-emitting unit to form a first charge generation layer having a thickness of 50 Å.

[Formation of Second Light-Emitting Unit]

HATCN was deposited on the first charge generation layer to form a hole injection layer having a thickness of 100 Å, NPB was deposited on the hole injection layer to form a hole transport layer having a thickness of 200 Å, and TCTA was deposited on the hole transport layer to form an electron blocking layer having a thickness of 50 Å.

Compound FBH as a host and Compound FBD as a dopant were co-deposited at a weight ratio of 99:1 on the electron blocking layer to form an emission layer having a thickness of 200 Å.

T2T was deposited on the emission layer to form a hole blocking layer having a thickness of 50 Å, and TPM-TAZ and Liq were deposited at a weight ratio of 5:5 on the hole blocking layer to form an electron transport layer having a thickness of 250 Å, thereby forming a second light-emitting unit.

[Formation of Second Charge Generation Layer]

nCGL and Li (1.5 wt %) were co-deposited on the second light-emitting unit to form a second charge generation layer having a thickness of 50 Å.

[Formation of Third Light-Emitting Unit]

HATCN was deposited on the second charge generation layer to form a hole injection layer having a thickness of 100 Å, NPB was deposited on the hole injection layer to form a hole transport layer having a thickness of 200 Å, and TCTA was deposited on the hole transport layer to form an electron blocking layer having a thickness of 50 Å.

Compound FBH as a host and Compound FBD as a dopant were co-deposited at a weight ratio of 99:1 on the electron blocking layer to form an emission layer having a thickness of 200 Å.

T2T was deposited on the emission layer to form a hole blocking layer having a thickness of 50 Å, and TPM-TAZ and Liq were deposited at a weight ratio of 5:5 on the hole blocking layer to form an electron transport layer having a thickness of 250 Å, thereby forming a third light-emitting unit.

[Formation of Third Charge Generation Layer]

nCGL and Li (1.5 wt %) were co-deposited on the third light-emitting unit to form a third charge generation layer having a thickness of 50 Å.

[Formation of Fourth Light-Emitting Unit]

HATCN was deposited on the third charge generation layer to form a hole injection layer having a thickness of 100 Å, NPB was deposited on the hole injection layer to form a hole transport layer having a thickness of 200 Å, and TCTA was deposited on the hole transport layer to form an electron blocking layer having a thickness of 50 Å.

Compound FBH as a host and Compound FBD as a dopant were co-deposited at a weight ratio of 99:1 on the electron blocking layer to form an emission layer having a thickness of 200 Å.

T2T was deposited on the emission layer to form a hole blocking layer having a thickness of 50 Å, and TPM-TAZ and Liq were deposited at a weight ratio of 5:5 on the hole blocking layer to form an electron transport layer having a thickness of 250 Å, thereby forming a fourth light-emitting unit.

[Formation of Second Electrode and Capping Layer]

Yb was deposited on the fourth light-emitting unit to form an electron injection layer having a thickness of 10 Å, Ag and Mg (10 wt %) were co-deposited on the electron injection layer to form a second electrode having a thickness of 120 Å, and Compound CPL was deposited on the second electrode to form a capping layer having a thickness of 500 Å, thereby completing the manufacture of a light-emitting device.

Phosphorescent Example 6-1 (BBGB Structure)

A light-emitting device was manufactured in the same manner as in Fluorescent Example 3, except that, in forming an emission layer of a third light-emitting unit, for use as a host, DPTPCz as Host A and CPCBPTz as Host B were used at a weight ratio of 7:3 instead of FBH, Ir(ppy)$_3$ was used as a dopant instead of FBD, and the host and the dopant were used at a weight ratio of 90:10 to form an emission layer having a thickness of 300 Å.

Example 6-1-1 (BBGB Structure)

A light-emitting device was manufactured in the same manner as in Phosphorescent Example 6-1, except that, in forming an emission layer of a third light-emitting unit, Compound 1 was used as Host B instead of CPCBPTz.

Example 6-1-2 (BBGB Structure)

A light-emitting device was manufactured in the same manner as in Phosphorescent Example 6-1, except that, in forming an emission layer of a third light-emitting unit, Compound 9 was used as Host B instead of CPCBPTz.

Phosphorescent Example 6-2 (BBBG Structure)

A light-emitting device was manufactured in the same manner as in Fluorescent Example 3, except that, in forming an emission layer of a fourth light-emitting unit, for use as a host, DPTPCz as Host A and CPCBPTz as Host B were used at a weight ratio of 7:3 instead of FBH, Ir(ppy)$_3$ was used as a dopant instead of FBD, and the host and the dopant were used at a weight ratio of 90:10 to form an emission layer having a thickness of 300 Å.

Example 6-2-1 (BBBG Structure)

A light-emitting device was manufactured in the same manner as in Phosphorescent Example 6-2, except that, in forming an emission layer of a fourth light-emitting unit, Compound 1 was used as Host B instead of CPCBPTz.

Example 6-2-2 (BBBG Structure)

A light-emitting device was manufactured in the same manner as in Phosphorescent Example 6-2, except that, in forming an emission layer of a fourth light-emitting unit, Compound 9 was used as Host B instead of CPCBPTz.

Evaluation Example 4

The characteristics of the light-emitting devices manufactured according to Fluorescent Example 2, Phosphorescent Examples 5-1 and 5-2, Examples 5-1-1, 5-1-2, 5-2-1, and 5-2-2, Fluorescent Example 3, Phosphorescent Examples 6-1 and 6-2, and Examples 6-1-1, 6-1-2, 6-2-1, and 6-2-2 were evaluated by measuring the driving voltage and lifespan at the current density of 10 mA/cm$^2$. The driving voltage of a light-emitting device was measured by using a source meter (Keithley Instrument Inc., 2400 series), and the lifespan was measured as the time taken when luminance reaches 97% of the initial luminance at the current density of 10 mA/cm$^2$. The luminescence efficiency was measured at the current densities of 0.1 mA/cm$^2$ and 10 mA/cm$^2$ by using the luminescence efficiency measurement device C9920-2-12 of Hamamatsu Photonics Inc. In evaluating the luminescence efficiency, the current density was measured by using a luminance meter that was calibrated for wavelength sensitivity, and relative values (%) of the maximum efficiency at the current densities of 0.1 mA/cm$^2$ and 10 mA/cm$^2$ of an Example are shown together. Table 8 below shows the evaluation results of the characteristics of the light-emitting devices.

TABLE 8

| | Host A | Host B | Driving voltage (V) | Efficiency @ 0.1 mA/cm$^2$ (Cd/A)/(%) | | Efficiency @ 10 mA/cm$^2$ (Cd/A)/(%) | | Lifespan (T$_{97}$ @ 10 mA/cm$^2$) | |
|---|---|---|---|---|---|---|---|---|---|
| Fluorescent Example 2 | FBH | — | 9.9 | 17.4 | 83% | 20.5 | 98% | 15% | 350 |
| Phosphorescent Example 5-1 | DPTPCz | CPCBPTz | 9.8 | 31.3 | 100% | 27.5 | 88% | −12% | 420 |
| Example 5-1-1 | DPTPCz | Compound 1 | 9.9 | 22.9 | 80% | 28.3 | 99% | 19% | 400 |
| Example 5-1-2 | DPTPCz | Compound 9 | 10.0 | 23.8 | 82% | 28.5 | 98% | 16% | 415 |
| Phosphorescent Example 5-2 | DPTPCz | CPCBPTz | 9.9 | 34.7 | 100% | 30.5 | 88% | −12% | 430 |
| Example 5-2-1 | DPTPCz | Compound 1 | 10.0 | 26.0 | 80% | 32.2 | 99% | 19% | 430 |
| Example 5-2-2 | DPTPCz | Compound 9 | 10.2 | 26.1 | 83% | 31.1 | 99% | 16% | 450 |
| Fluorescent Example 3 | FBH | — | 12.8 | 25.6 | 83% | 30.2 | 98% | 15% | 400 |
| Phosphorescent Example 6-1 | DPTPCz | CPCBPTz | 12.4 | 46.0 | 100% | 40.5 | 88% | −12% | 450 |
| Example 6-1-1 | DPTPCz | Compound 1 | 12.6 | 34.3 | 80% | 42.5 | 99% | 19% | 460 |
| Example 6-1-2 | DPTPCz | Compound 9 | 12.8 | 36.4 | 82% | 43.5 | 98% | 16% | 430 |
| Phosphorescent Example 6-2 | DPTPCz | CPCBPTz | 12.6 | 59.4 | 100% | 52.3 | 88% | −12% | 460 |

TABLE 8-continued

| | Host A | Host B | Driving voltage (V) | Efficiency @ 0.1 mA/cm² (Cd/A)/(%) | | Efficiency @ 10 mA/cm² (Cd/A)/(%) | | Lifespan (T₉₇ @ 10 mA/cm²) | |
|---|---|---|---|---|---|---|---|---|---|
| Example 6-2-1 | DPTPCz | Compound 1 | 12.8 | 43.1 | 80% | 53.3 | 99% | 19% | 430 |
| Example 6-2-2 | DPTPCz | Compound 9 | 13.0 | 44.8 | 82% | 53.5 | 98% | 16% | 440 |

Referring to Table 8, it is confirmed that the light-emitting devices of Examples 5-1-1 and 5-1-2 have a driving voltage and lifespan similar to those of the light-emitting device of Phosphorescent Example 5-1, while showing a luminescence efficiency trend similar to that of the light-emitting device of Fluorescent Example 2. It is confirmed that the light-emitting devices of Examples 5-2-1 and 5-2-2 have a driving voltage and lifespan similar to those of the light-emitting device of Phosphorescent Example 5-2, while showing a luminescence efficiency trend similar to that of the light-emitting device of Fluorescent Example 2.

It is confirmed that the light-emitting devices of Examples 6-1-1 and 6-1-2 have a driving voltage and lifespan similar to those of the light-emitting device of Phosphorescent Example 6-1, while showing a luminescence efficiency trend similar to that of the light-emitting device of Fluorescent Example 3. It is confirmed that the light-emitting devices of Examples 6-2-1 and 6-2-2 have a driving voltage and lifespan similar to those of the light-emitting device of Phosphorescent Example 6-2, while showing a luminescence efficiency trend similar to that of the light-emitting device of Fluorescent Example 3.

Although the disclosure has been described with reference to the Synthesis Examples and Examples, these examples are provided for illustrative purpose only, and one of ordinary skill in the art may understand that these examples may have various modifications and other examples equivalent thereto. Accordingly, the scope of the disclosure should be determined by the technical concept of the claims.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting device comprising:
   a first electrode;
   a second electrode facing the first electrode;
   an interlayer between the first electrode and the second electrode and comprising an emission layer; and
   at least one heterocyclic compound represented by Formula 1:

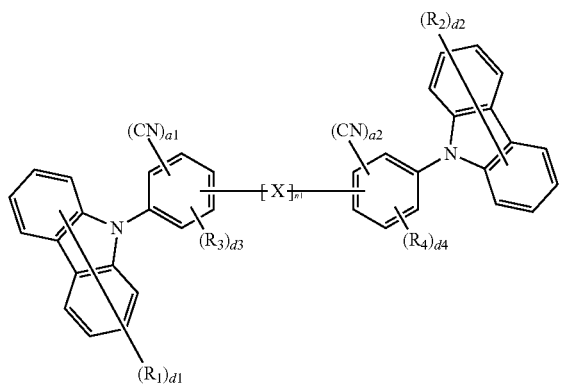

[Formula 1]

wherein in Formula 1,
n1 is an integer from 1 to 3,
a1 and a2 are each independently an integer from 0 to 4,
the sum of a1 and a2 is 1 or more,
$R_1$ to $R_4$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O) ($Q_1$), —S(=O)$_2$($Q_1$), or —P(=O) ($Q_1$)($Q_2$),
d1 and d2 are each independently an integer from 1 to 8,
d3 and d4 are each independently an integer from 1 to 4, and
$R_{10a}$ is:
deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O) ($Q_{11}$), —S(=O)$_2$($Q_{11}$), —P(=O) ($Q_{11}$)($Q_{12}$), or a combination thereof;
a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O) ($Q_{21}$), —S(=O)$_2$($Q_{21}$), —P(=O) ($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O) ($Q_{31}$), —S(=O)$_2$($Q_{31}$), or —P(=O) ($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof; a $C_7$-$C_{60}$ aryl alkyl group; or a $C_2$-$C_{60}$ heteroaryl alkyl group, and wherein *—X—*' in Formula 1 is a group represented by one of Formulae 3-1 to 3-26:

3-1
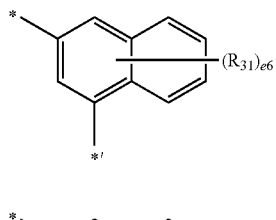

3-2
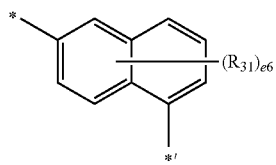

3-3
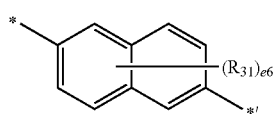

3-4
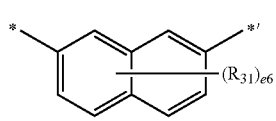

3-5
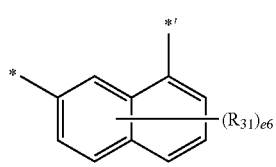

3-6
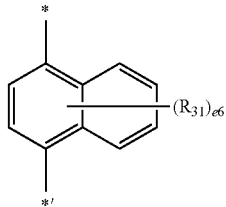

3-7
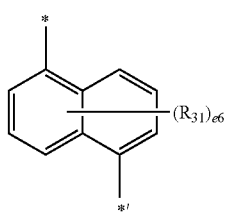

3-8
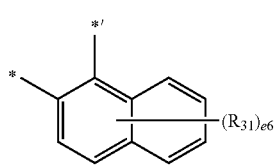

3-9
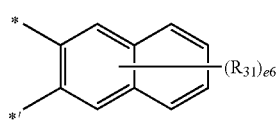

3-10
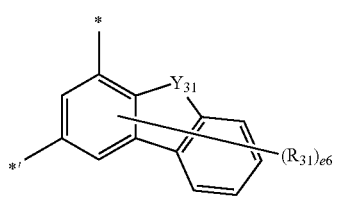

3-11
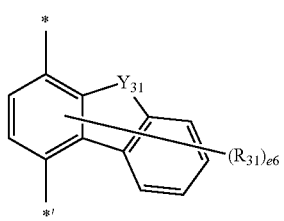

3-12
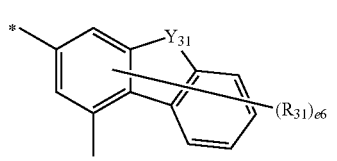

3-13
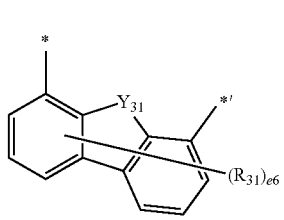

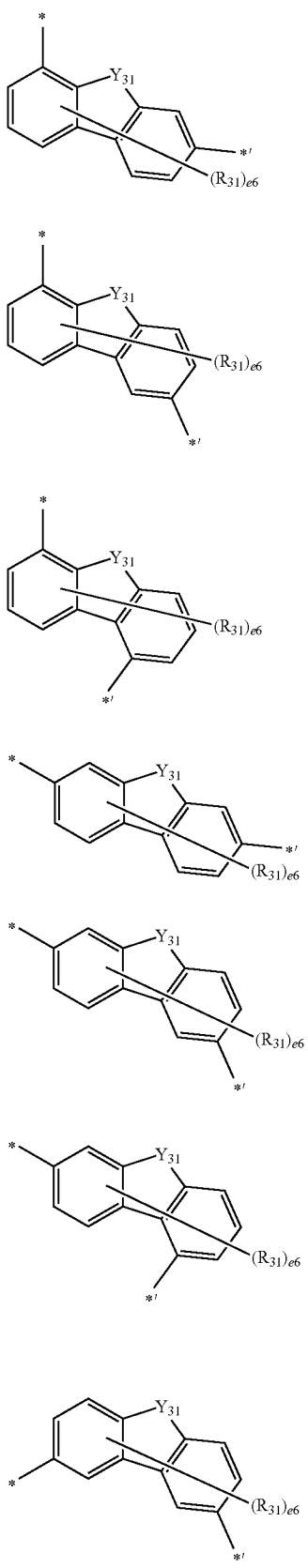
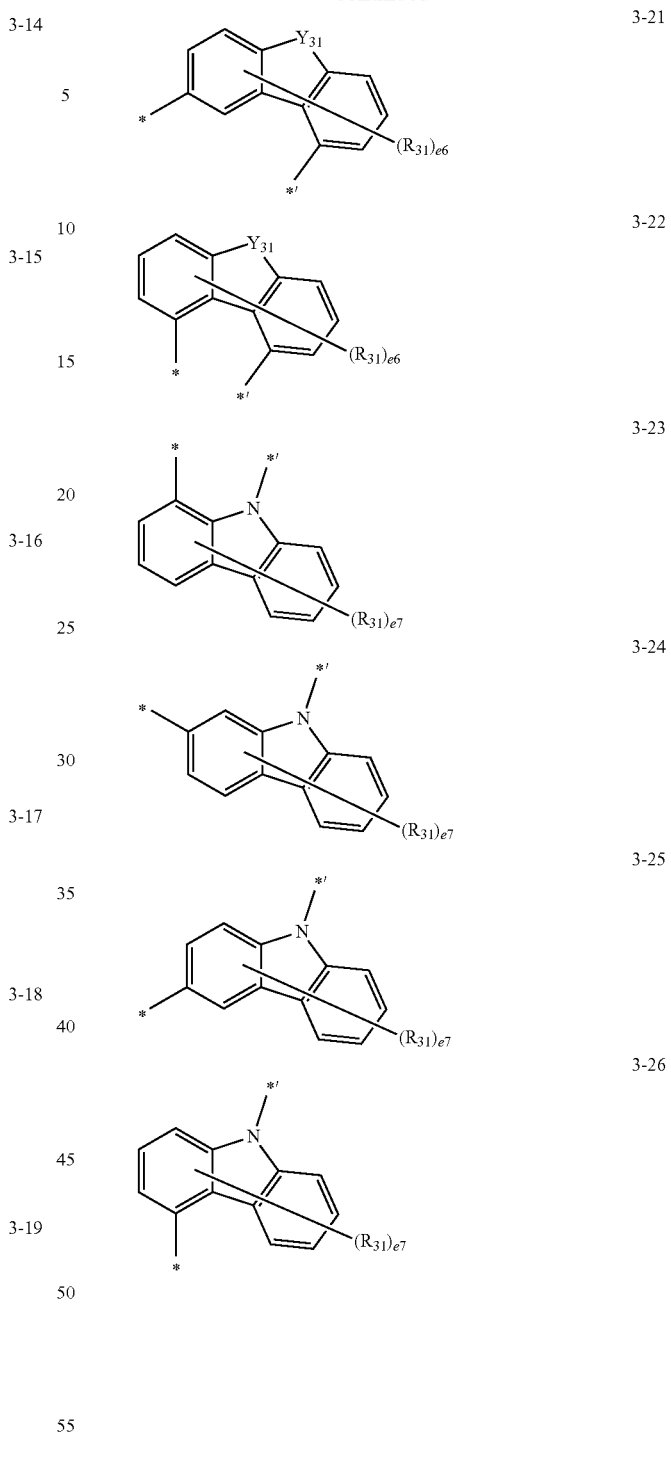
wherein in Formulae 3-1 to 3-26,
$Y_{31}$ is O, S, $N(R_{32})$, or $C(R_{32})(R_{33})$,
$R_{31}$ to $R_{33}$ are each the same as described in connection with $R_1$ in Formula 1,
e6 is an integer from 1 to 6,
e7 is an integer from 1 to 7, and
\* and \*' each indicate a binding site to a neighboring atom.

2. The light-emitting device of claim 1, wherein
the first electrode is an anode,
the second electrode is a cathode,
the interlayer further comprises:
a hole transport region between the emission layer and the first electrode; and
an electron transport region between the emission layer and the second electrode,
the hole transport region comprises a hole injection layer, a hole transport layer, an emission auxiliary layer, an electron blocking layer, or a combination thereof, and
the electron transport region comprises a buffer layer, a hole blocking layer, an electron control layer, an electron transport layer, an electron injection layer, or a combination thereof.

3. The light-emitting device of claim 1, wherein the emission layer comprises the at least one heterocyclic compound.

4. The light-emitting device of claim 3, wherein the emission layer further comprises a hole-transporting compound.

5. The light-emitting device of claim 4, wherein an amount of the heterocyclic compound is in a range of about 10 parts by weight to about 90 parts by weight based on 100 parts by weight of a total of the heterocyclic compound and the hole-transporting compound.

6. The light-emitting device of claim 4, wherein the emission layer further comprises a phosphorescent compound.

7. The light-emitting device of claim 1, wherein the heterocyclic compound satisfies Condition 1:

$$E_{LUMO}(C1) \geq -2.5 \text{ eV} \quad \text{[Condition 1]}$$

wherein in Condition 1,
$E_{LUMO}(C1)$ indicates a lowest unoccupied molecular orbital (LUMO) energy level (eV) of the heterocyclic compound.

8. An electronic apparatus comprising the light-emitting device of claim 1.

9. The electronic apparatus of claim 8, further comprising a thin-film transistor, wherein
the thin-film transistor comprises a source electrode and a drain electrode, and
the first electrode of the light-emitting device is electrically connected to the source electrode or the drain electrode.

10. The electronic apparatus of claim 8, further comprising a color filter, a color conversion layer, a touch screen layer, a polarizing layer, or a combination thereof.

11. A light-emitting device comprising:
a first electrode;
a second electrode facing the first electrode;
m light-emitting units between the first electrode and the second electrode and comprising at least one emission layer; and
m−1 charge generation layers between two neighboring light-emitting units from among the m light-emitting units,
wherein m is an integer of 2 or more, and
at least one of the m light-emitting units comprises a heterocyclic compound represented by Formula 1:

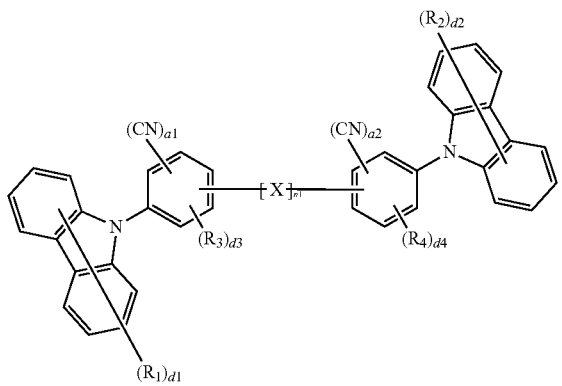

[Formula 1]

wherein in Formula 1,
n1 is an integer from 1 to 3,
a1 and a2 are each independently an integer from 0 to 4,
the sum of a1 and a2 is 1 or more,
$R_1$ to $R_4$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si$(Q_1)(Q_2)(Q_3)$, —N$(Q_1)(Q_2)$, —B$(Q_1)(Q_2)$, —C(=O) $(Q_1)$, —S(=O)$_2(Q_1)$, or —P(=O) $(Q_1)(Q_2)$,
d1 and d2 are each independently an integer from 1 to 8,
d3 and d4 are each independently an integer from 1 to 4, and
$R_{10a}$ is:
deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-Coo arylthio group, a $C_7$-$C_{60}$ aryl alkyl group, a $C_2$-$C_{60}$ heteroaryl alkyl group, —Si$(Q_{11})(Q_{12})(Q_{13})$, —N$(Q_{11})(Q_{12})$, —B$(Q_{11})(Q_{12})$, —C(=O) $(Q_{11})$, —S(=O)$_2(Q_{11})$, —P(=O) $(Q_{11})(Q_{12})$, or a combination thereof;
a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si$(Q_{21})(Q_{22})(Q_{23})$, —N$(Q_{21})(Q_{22})$, —B(Q₂₁)(Q₂₂), —C(=O) (Q₂₁), —S(=O)₂(Q₂₁), —P(=O) (Q₂₁)(Q₂₂), or a combination thereof; or —Si(Q₃₁)(Q₃₂)(Q₃₃), —N(Q₃₁)(Q₃₂), —B(Q₃₁)(Q₃₂), —C(=O) (Q₃₁), —S(=O)₂(Q₃₁), or —P(=O) (Q₃₁)(Q₃₂), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof; a $C_7$-$C_{60}$ aryl alkyl group; or a $C_2$-$C_{60}$ heteroaryl alkyl group, wherein *—X—*' in Formula 1 is a group represented by one of Formulae 3-1 to 3-26:

3-1
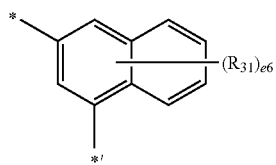

3-2
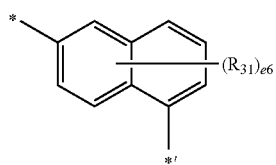

3-3
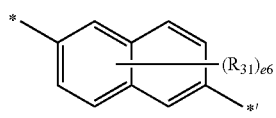

3-4
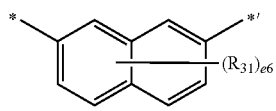

3-5
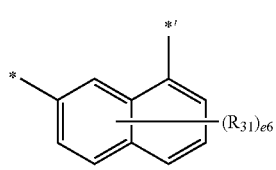

3-6
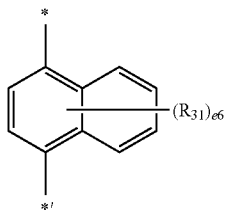

3-7
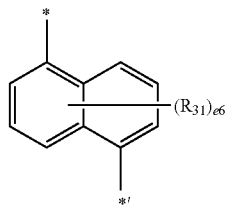

3-8
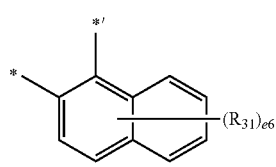

3-9
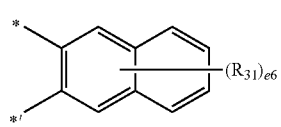

3-10
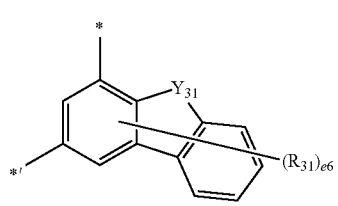

3-11
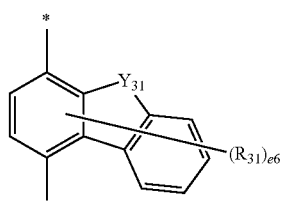

3-12
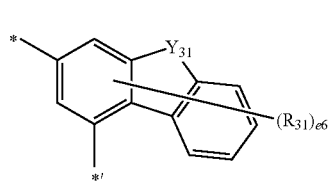

3-13
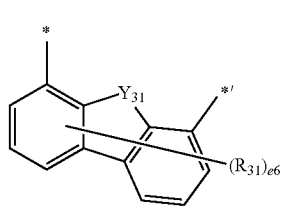

3-14
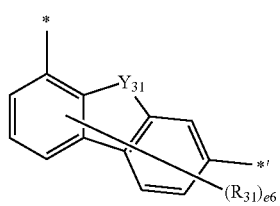

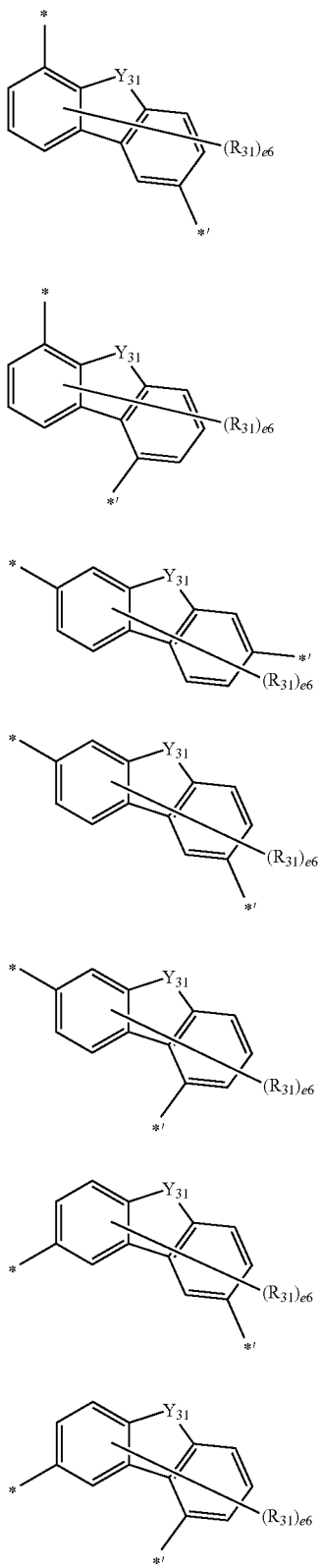
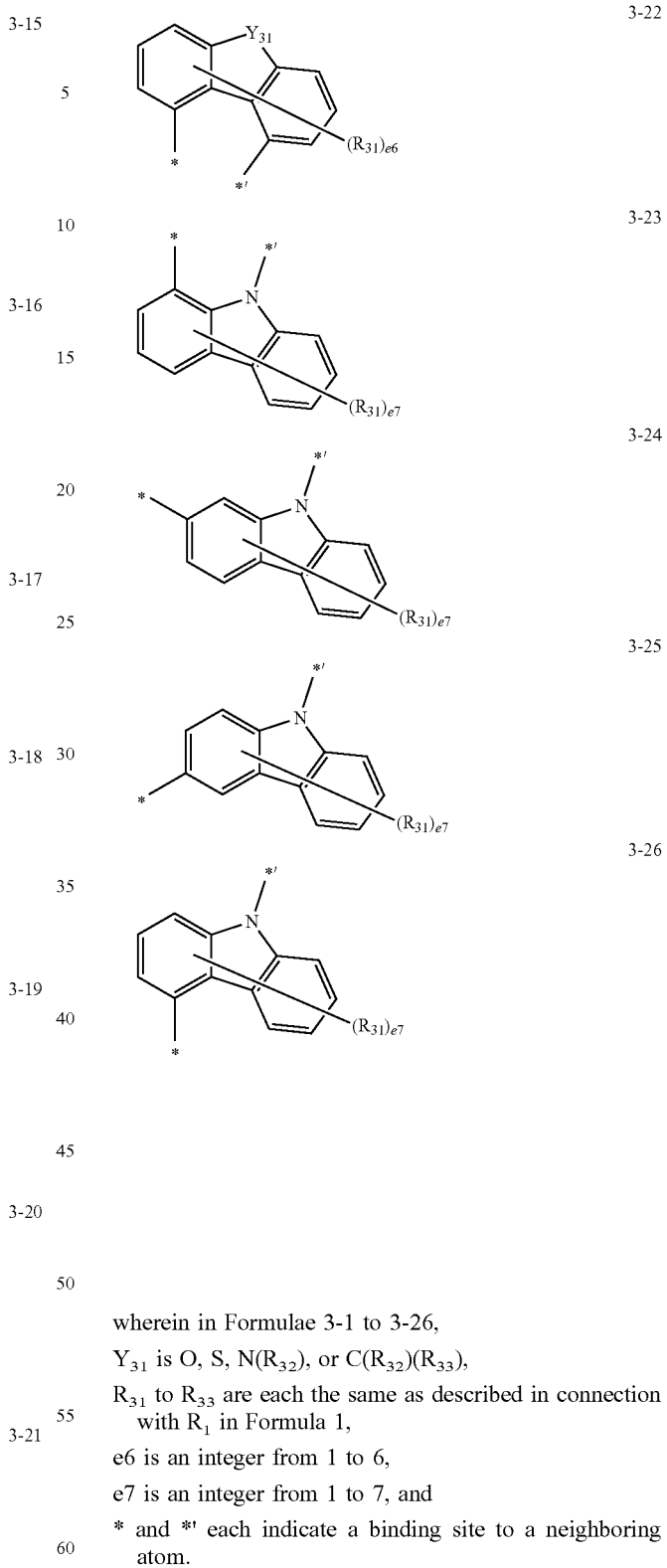

wherein in Formulae 3-1 to 3-26, $Y_{31}$ is O, S, $N(R_{32})$, or $C(R_{32})(R_{33})$, $R_{31}$ to $R_{33}$ are each the same as described in connection with $R_1$ in Formula 1, e6 is an integer from 1 to 6, e7 is an integer from 1 to 7, and

* and *' each indicate a binding site to a neighboring atom.

12. The light-emitting device of claim 11, wherein a maximum emission wavelength of light emitted from at least one light-emitting unit of the m light-emitting units is different from a maximum emission wavelength of light emitted from at least one light-emitting unit of the remaining m−1 light-emitting units.

13. A heterocyclic compound represented by Formula 1:

[Formula 1]

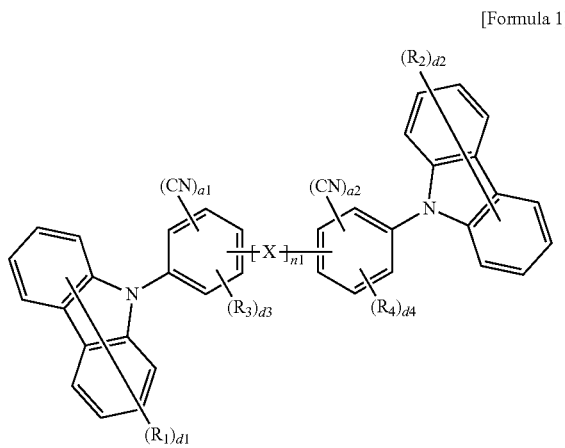

wherein in Formula 1,

X is a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, n1 is an integer from 1 to 3, a1 and a2 are each independently an integer from 0 to 4, the sum of a1 and a2 is 1 or more, $R_1$ to $R_4$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O) ($Q_1$), —S(=O)$_2$($Q_1$), or —P(=O) ($Q_1$)($Q_2$), d1 and d2 are each independently an integer from 1 to 8, d3 and d4 are each independently an integer from 1 to 4, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O) ($Q_{11}$), —S(=O)$_2$($Q_{11}$), —P(=O) ($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O) ($Q_{21}$), —S(=O)$_2$($Q_{21}$), —P(=O) ($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O) ($Q_{31}$), —S(=O)$_2$($Q_{31}$), or —P(=O) ($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof; a $C_7$-$C_{60}$ aryl alkyl group; or a $C_2$-$C_{60}$ heteroaryl alkyl group, wherein *—X—*' in Formula 1 is a group represented by one of Formulae 3-1 to 3-26:

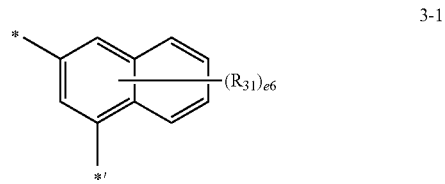

3-1

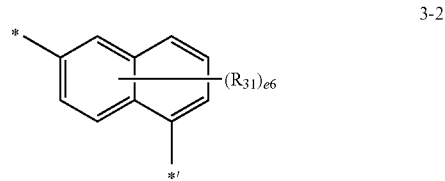

3-2

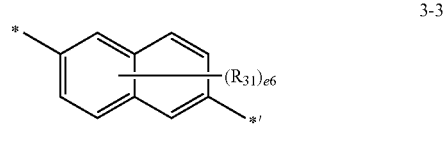

3-3

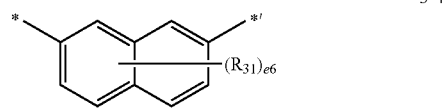

3-4

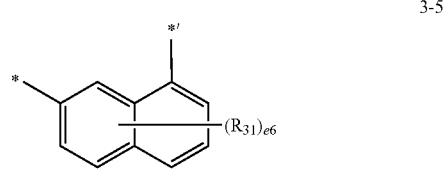

3-5

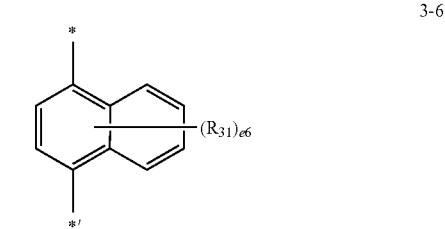

3-6

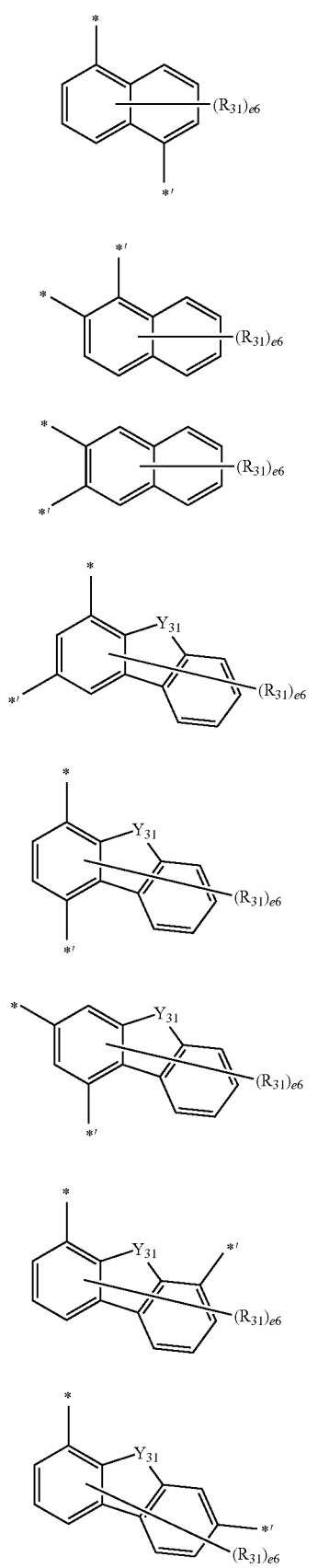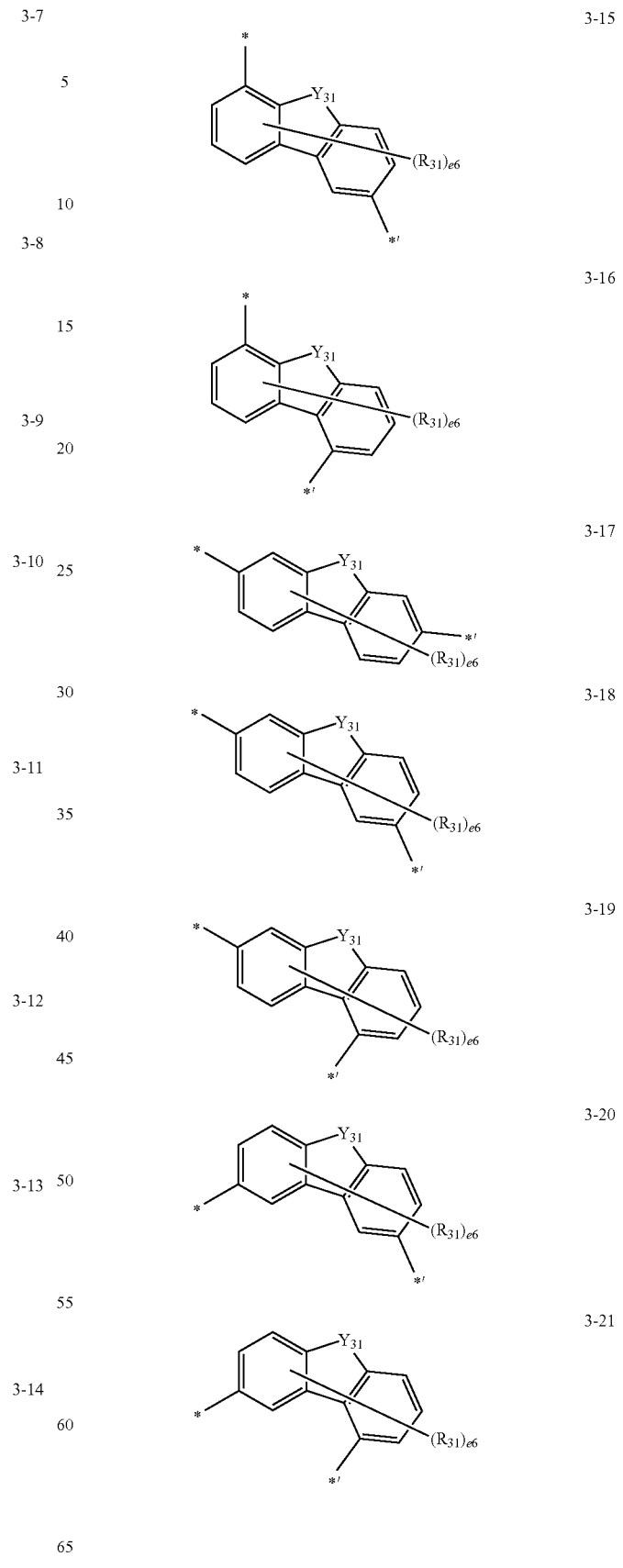

3-22

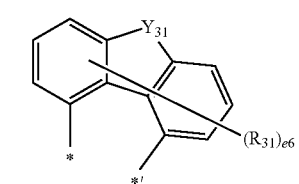

3-23

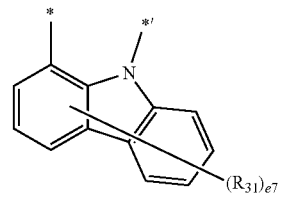

3-24

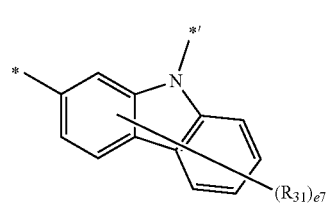

3-25

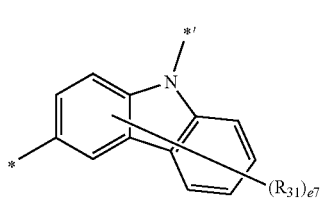

3-26

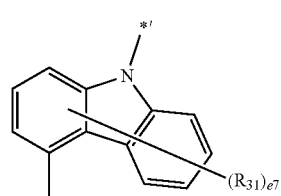

wherein in Formulae 3-1 to 3-26, $Y_{31}$ is O, S, $N(R_{32})$, or $C(R_{32})(R_{33})$, $R_{31}$ to $R_{33}$ are each the same as described in connection with $R_1$ in Formula 1, e6 is an integer from 1 to 6, e7 is an integer from 1 to 7, and \* and \*' each indicate a binding site to a neighboring atom.

14. The heterocyclic compound of claim 13, wherein the heterocyclic compound satisfies Condition 1:

$$E_{LUMO}(C1) \geq -2.5 \text{ eV} \quad \text{[Condition 1]}$$

wherein in Condition 1, $E_{LUMO}$ (C1) indicates a lowest unoccupied molecular orbital (LUMO) energy level (eV) of the heterocyclic compound.

15. The heterocyclic compound of claim 13, wherein n1 is 1.

16. The heterocyclic compound of claim 13, wherein a moiety represented by

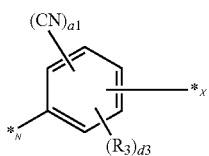

in Formula 1 is a moiety represented by one of Formulae 4-1 to 4-20:

4-1

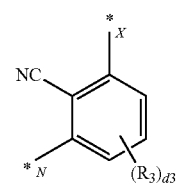

4-2

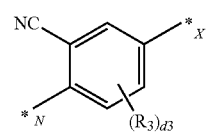

4-3

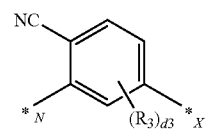

4-4

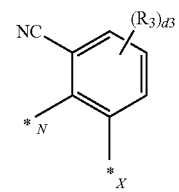

4-5

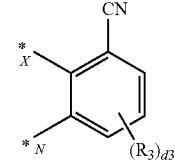

4-6

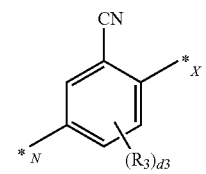

4-7

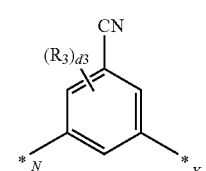

-continued 4-8 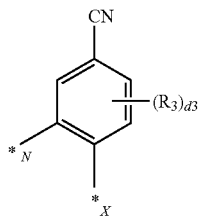

4-9 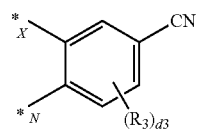

4-10 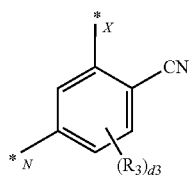

4-11 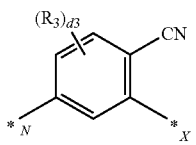

4-12 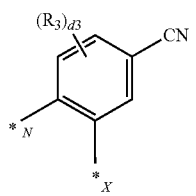

4-13 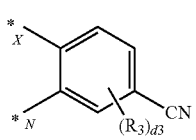

4-14 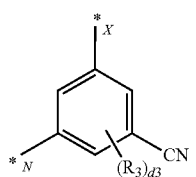

4-15 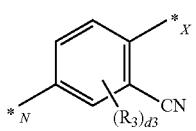

4-16 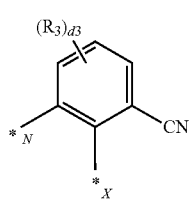

-continued 4-17 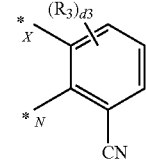

4-18 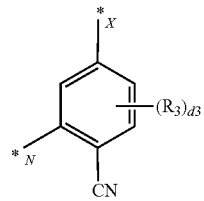

4-19 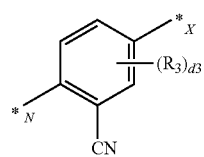

4-20 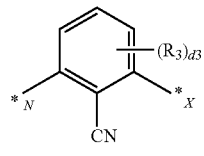

wherein in Formulae 4-1 to 4-20, $R_3$ is the same as described in connection with Formula 1, d3 is an integer from 1 to 3, $*_N$ indicates a binding site to N of a carbazole group in Formula 1, and $*_X$ indicates a binding site to X in Formula 1.

17. The heterocyclic compound of claim 13, wherein the heterocyclic compound represented by Formula 1 is represented by Formula 1-1 or Formula 1-2:

[Formula 1-1]

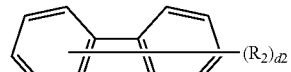
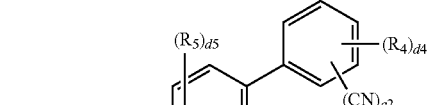
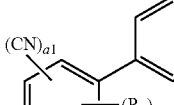
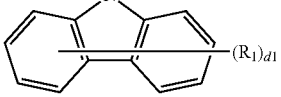

[Formula 1-2]
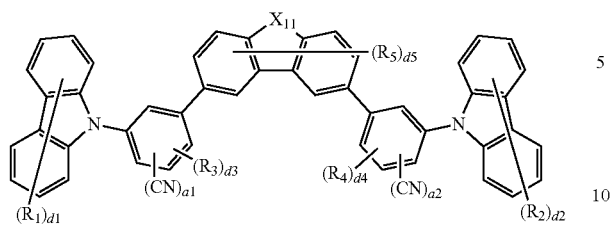
wherein in Formulae 1-1 and 1-2,
$X_{11}$ is O, S, $N(R_{11})$, or $C(R_{11})(R_{12})$,
$R_5$, $R_{11}$, and $R_{12}$ are each independently the same as described in connection with $R_1$ in Formula 1,
d5 is an integer from 1 to 6, and
$R_1$ to $R_4$, d1 to d4, a1, and a2 are each the same as described in connection with Formula 1.
18. The heterocyclic compound of claim 13, wherein the heterocyclic compound is one selected from Compounds 1 to 9:
1
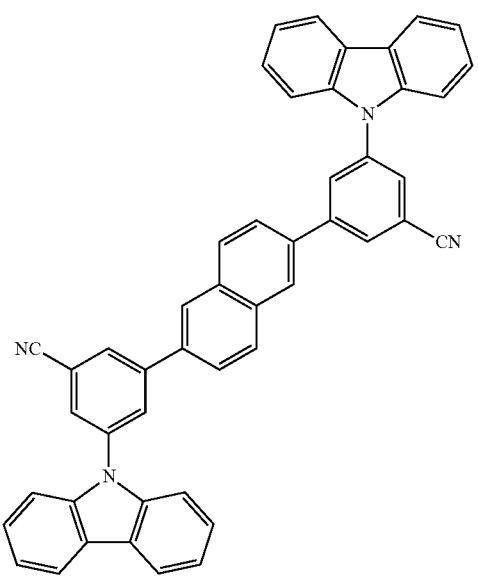
2
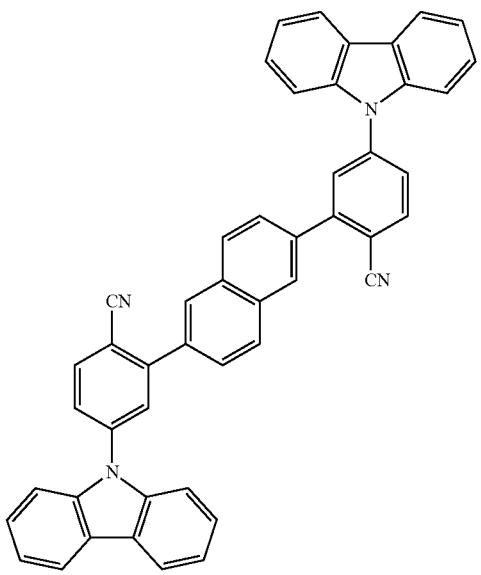
3
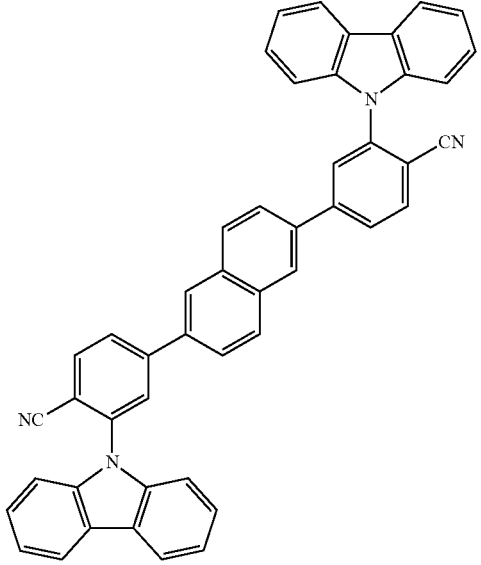
4
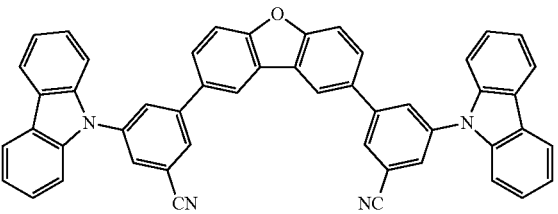
5
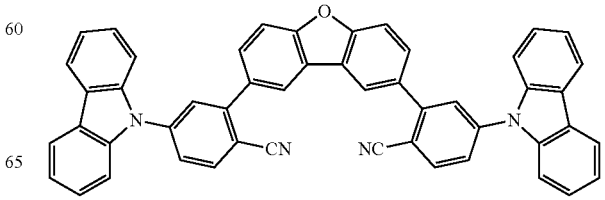

189
-continued
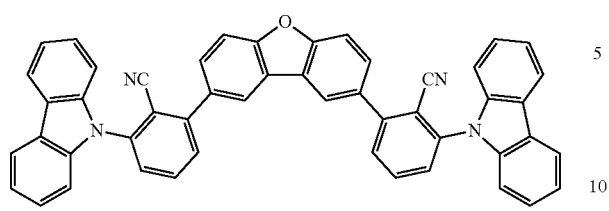
6
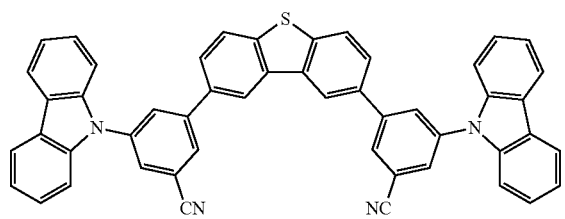
7
190
-continued
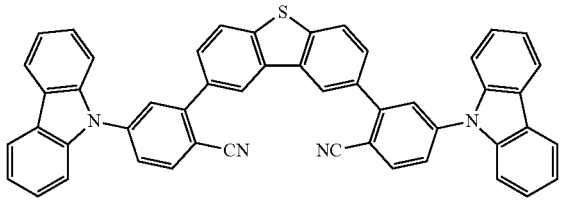
8
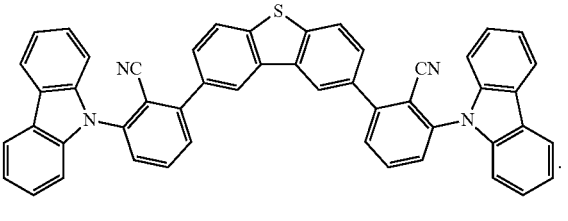
9
* * * * *